United States Patent
Oda et al.

(10) Patent No.: US 11,444,039 B2
(45) Date of Patent: Sep. 13, 2022

(54) SEMICONDUCTOR DIE INCLUDING DIFFUSION BARRIER LAYERS EMBEDDING BONDING PADS AND METHODS OF FORMING THE SAME

(71) Applicant: SANDISK TECHNOLOGIES LLC, Addison, TX (US)

(72) Inventors: Noriaki Oda, Yokkaichi (JP); Teruo Okina, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 29 days.

(21) Appl. No.: 16/888,055

(22) Filed: May 29, 2020

(65) Prior Publication Data

US 2021/0375790 A1  Dec. 2, 2021

(51) Int. Cl.
*H01L 23/48*  (2006.01)
*H01L 23/00*  (2006.01)
(Continued)

(52) U.S. Cl.
CPC ............ *H01L 23/564* (2013.01); *H01L 24/03* (2013.01); *H01L 24/05* (2013.01); *H01L 24/08* (2013.01); *H01L 24/80* (2013.01); *H01L 25/0657* (2013.01); *H01L 25/18* (2013.01); *H01L 25/50* (2013.01); *H01L 2224/0345* (2013.01); *H01L 2224/03462* (2013.01); *H01L 2224/03614* (2013.01); *H01L 2224/05082* (2013.01);
(Continued)

(58) Field of Classification Search
None
See application file for complete search history.

(56) References Cited

U.S. PATENT DOCUMENTS 5,821,168 A * 10/1998 Jain .................. H01L 21/76807
438/692
6,953,984 B2 * 10/2005 Grill ................. H01L 21/76832
257/642

(Continued)

OTHER PUBLICATIONS

Oda, N. et al., "Semiconductor Die Including Diffusion Barrier Layers Embedding Bonding Pads and Methods of Forming the Same," U.S. Appl. No. 16/886,188, filed May 29, 2020.
(Continued)

*Primary Examiner* — Hung K Vu
(74) *Attorney, Agent, or Firm* — The Marbury Law Group PLLC

(57) ABSTRACT

Semiconductor devices can be formed over a semiconductor substrate, and interconnect-level dielectric material layers embedding metal interconnect structures can be formed thereupon. In one embodiment, a pad-connection-via-level dielectric material layer, a proximal dielectric diffusion barrier layer, and a pad-level dielectric material layer can be formed. Bonding pads surrounded by dielectric diffusion barrier portions can be formed in the pad-level dielectric material layer. In another embodiment, a layer stack of a proximal dielectric diffusion barrier layer and a pad-and-via-level dielectric material layer can be formed. Integrated pad and via cavities can be formed through the pad-and-via-level dielectric material layer, and can be filled with bonding pads containing dielectric diffusion barrier portions and integrated pad and via structures.

7 Claims, 52 Drawing Sheets

(51) Int. Cl.
*H01L 25/065* (2006.01)
*H01L 25/18* (2006.01)
*H01L 25/00* (2006.01)

(52) U.S. Cl.
CPC .............. *H01L 2224/05147* (2013.01); *H01L 2224/05166* (2013.01); *H01L 2224/05181* (2013.01); *H01L 2224/05184* (2013.01); *H01L 2224/08145* (2013.01); *H01L 2224/80895* (2013.01); *H01L 2224/80896* (2013.01); *H01L 2225/06524* (2013.01); *H01L 2924/1431* (2013.01); *H01L 2924/14511* (2013.01)

(56) References Cited

U.S. PATENT DOCUMENTS

| | | |
|---|---|---|
| 10,115,681 B1 | 10/2018 | Ariyoshi |
| 10,283,493 B1 | 5/2019 | Nishida |
| 10,354,980 B1 | 7/2019 | Mushiga et al. |
| 10,354,987 B1 | 7/2019 | Mushiga et al. |
| 10,381,322 B1 | 8/2019 | Azuma et al. |
| 10,381,362 B1 | 8/2019 | Cui et al. |
| 10,510,738 B2 | 12/2019 | Kim et al. |
| 10,629,616 B1 | 4/2020 | Kai et al. |
| 10,651,157 B1 | 5/2020 | Su |
| 10,665,580 B1 | 5/2020 | Hosoda et al. |
| 10,665,581 B1 | 5/2020 | Zhou et al. |
| 2007/0181981 A1 | 8/2007 | Hollenbeck et al. |
| 2011/0266679 A1 | 11/2011 | Hotta et al. |
| 2014/0117546 A1 | 5/2014 | Liu et al. |
| 2017/0025381 A1* | 1/2017 | Tsai .................. H01L 21/76877 |
| 2018/0218937 A1 | 8/2018 | Van Der Wiel et al. |
| 2019/0221557 A1 | 7/2019 | Kim et al. |
| 2019/0252361 A1 | 8/2019 | Nishida |
| 2019/0304939 A1 | 10/2019 | Bih et al. |
| 2020/0066745 A1 | 2/2020 | Yu et al. |
| 2020/0144242 A1* | 5/2020 | Park .................. H01L 27/11548 |

OTHER PUBLICATIONS

Notification of Transmittal of the International Search Report and the Written Opinion of the International Searching Authority for International Patent Application No. PCT/US2020/067354, dated May 11, 2021, 13 pages.
U.S. Appl. No. 16/231,752, filed Dec. 24, 2018, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/269,301, filed Feb. 6, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/288,656, filed Feb. 19, 2019, SanDisk Technologies LLC.
U.S. Appl. No. 16/291,220, filed Mar. 4, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2020, SanDisk Technologies LLC.
U.S. Appl. No. 16/671,025, filed Oct. 31, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
U.S. Appl. No. 16/774,372, filed Jan. 28, 2020, SanDisk Technologies LLC.
U.S. Appl. No. 16/774,446, filed Jan. 28, 2020, SanDisk Technologies LLC.
U.S. Appl. No. 16/794,536, filed Feb. 19, 2020, SanDisk Technologies LLC.
U.S. Appl. No. 16/794,563, filed Feb. 19, 2020, SanDisk Technologies LLC.
U.S. Appl. No. 16/806,087, filed Mar. 2, 2020, SanDisk Technologies LLC.

* cited by examiner

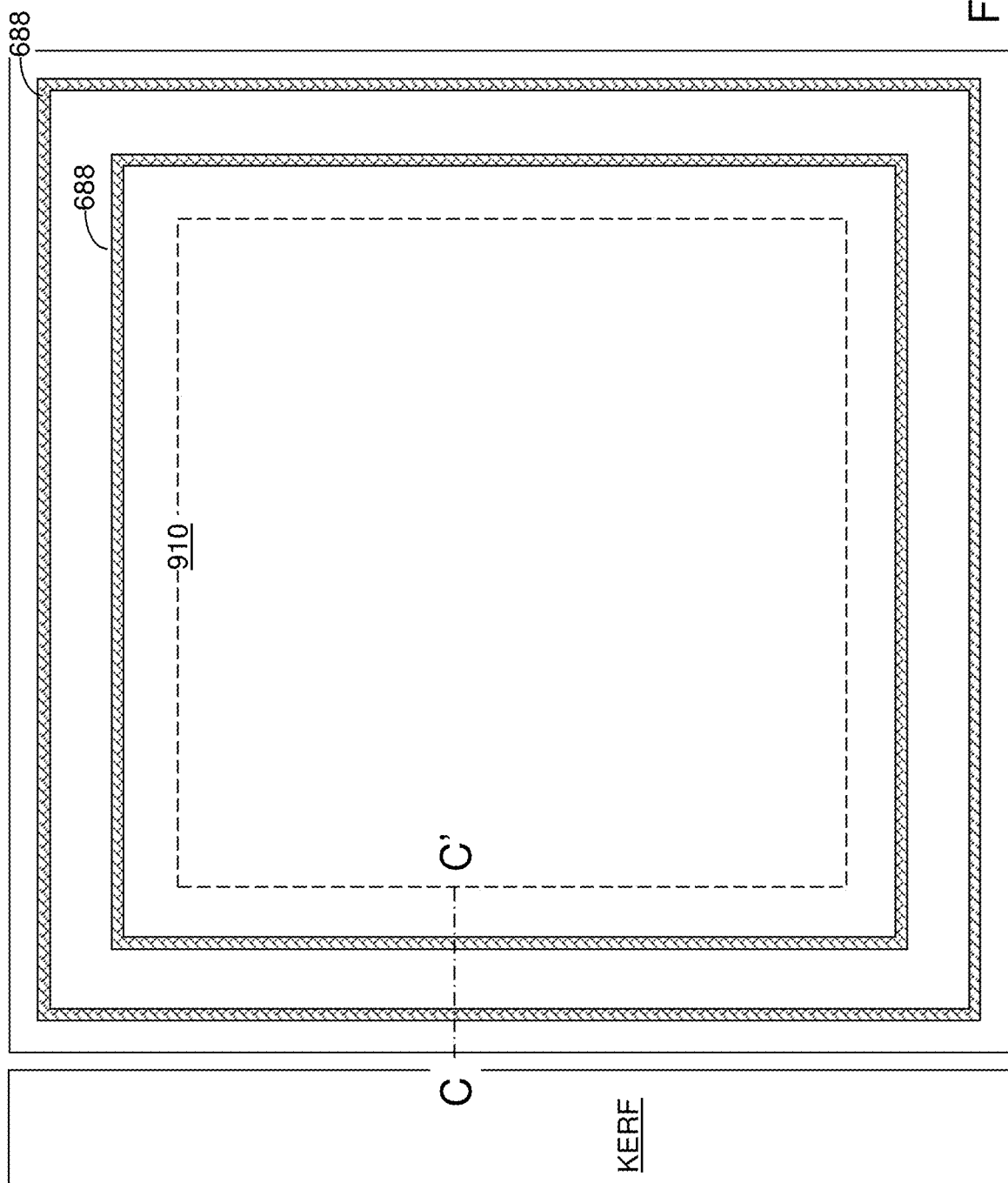

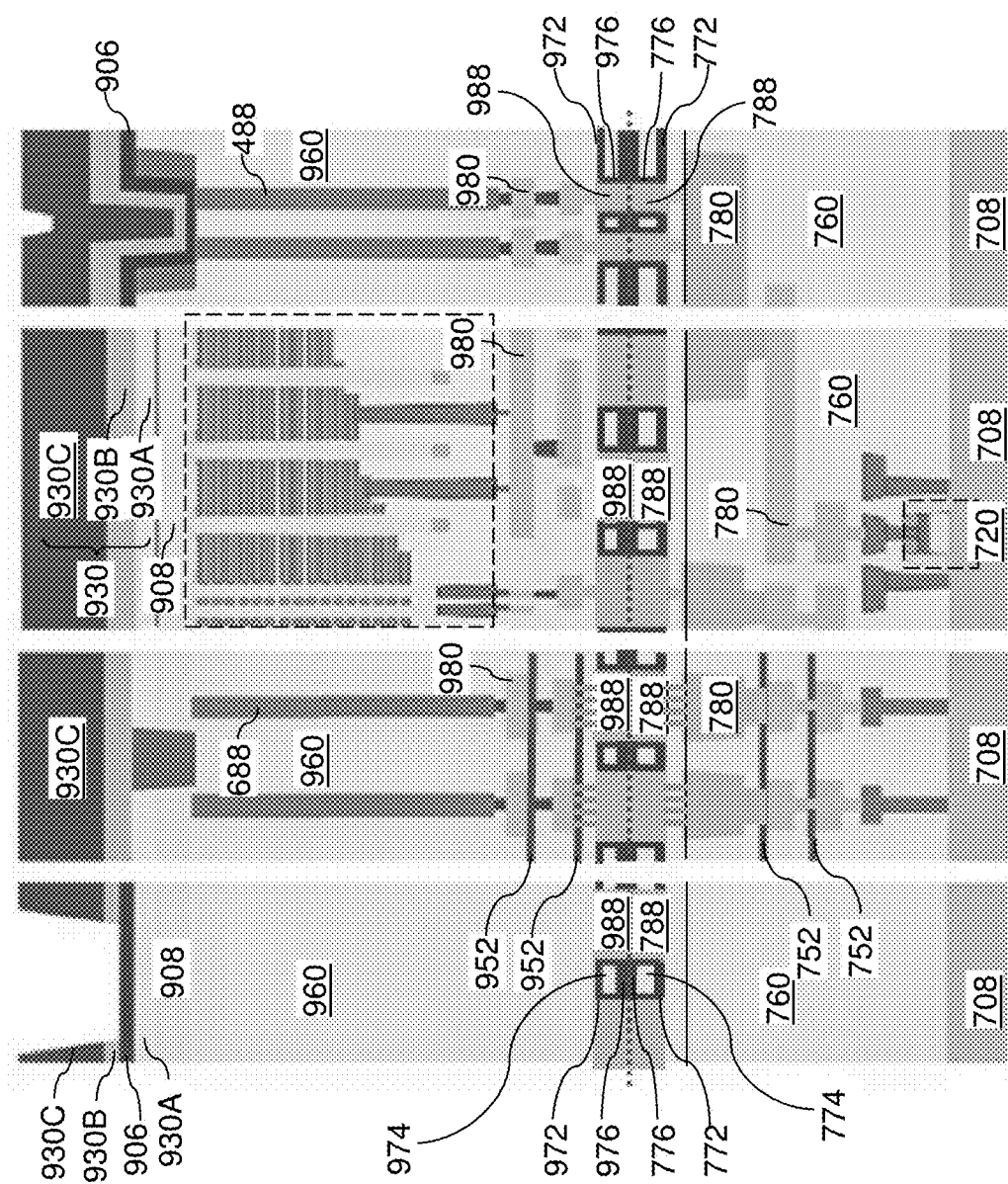

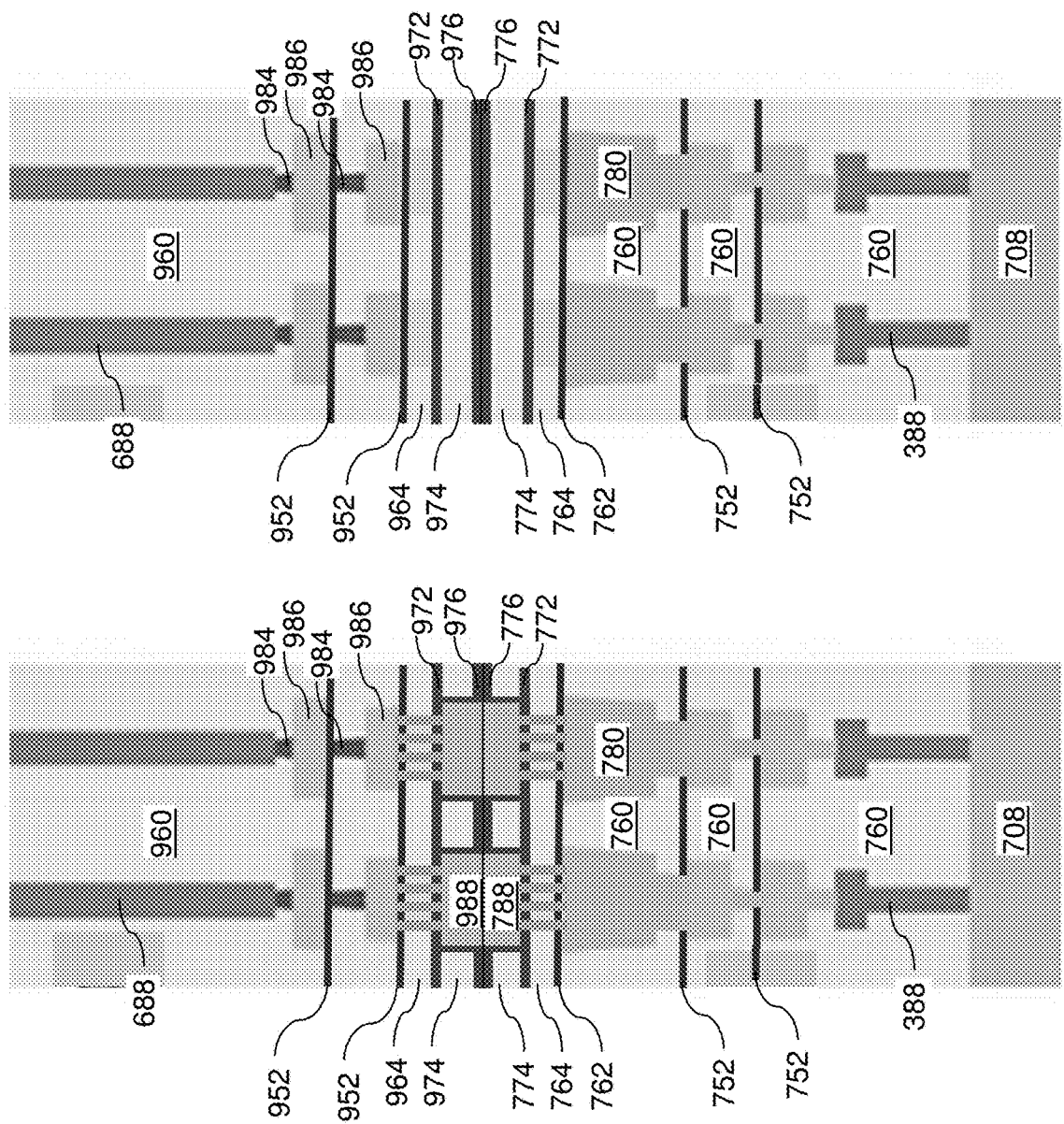

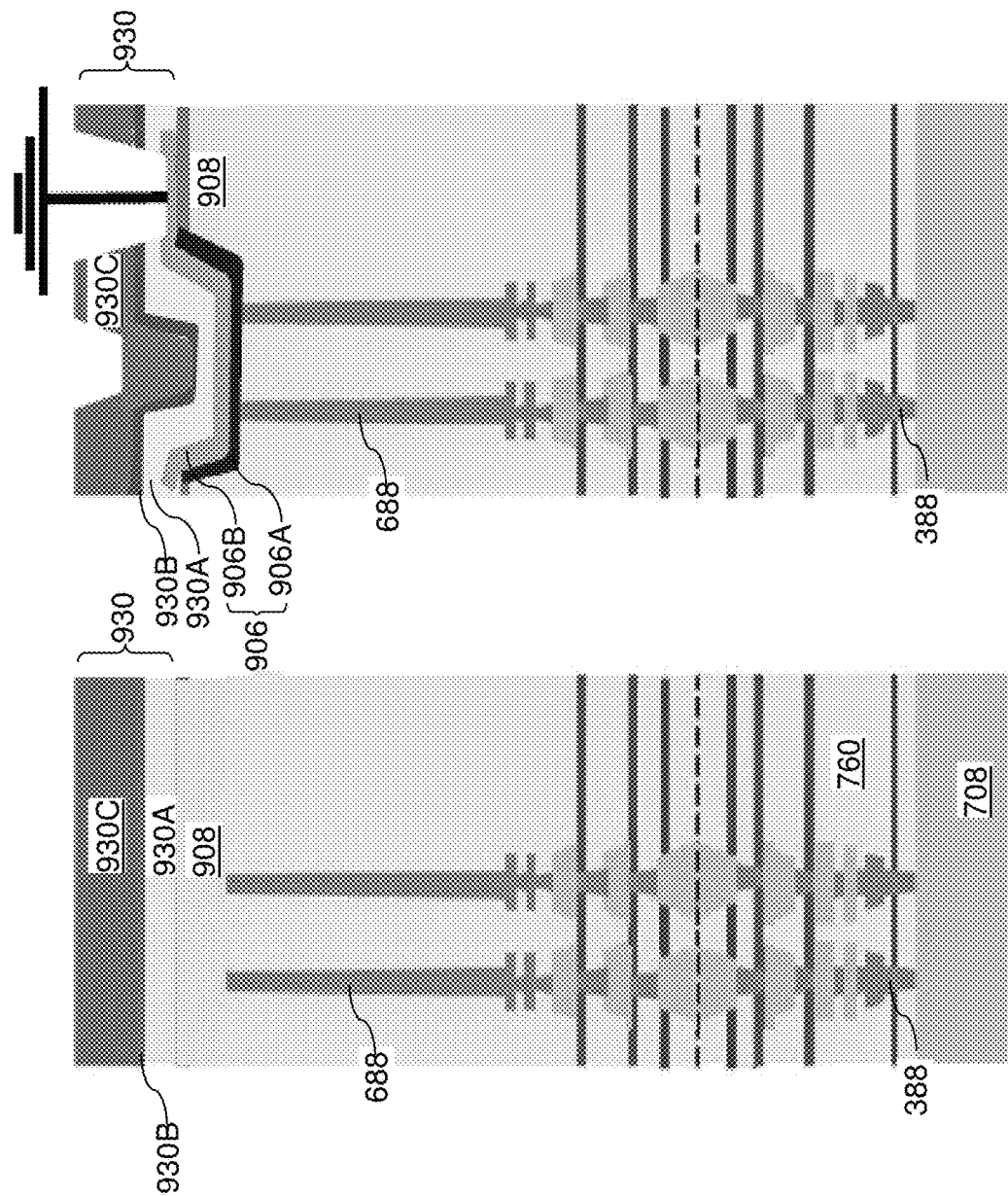

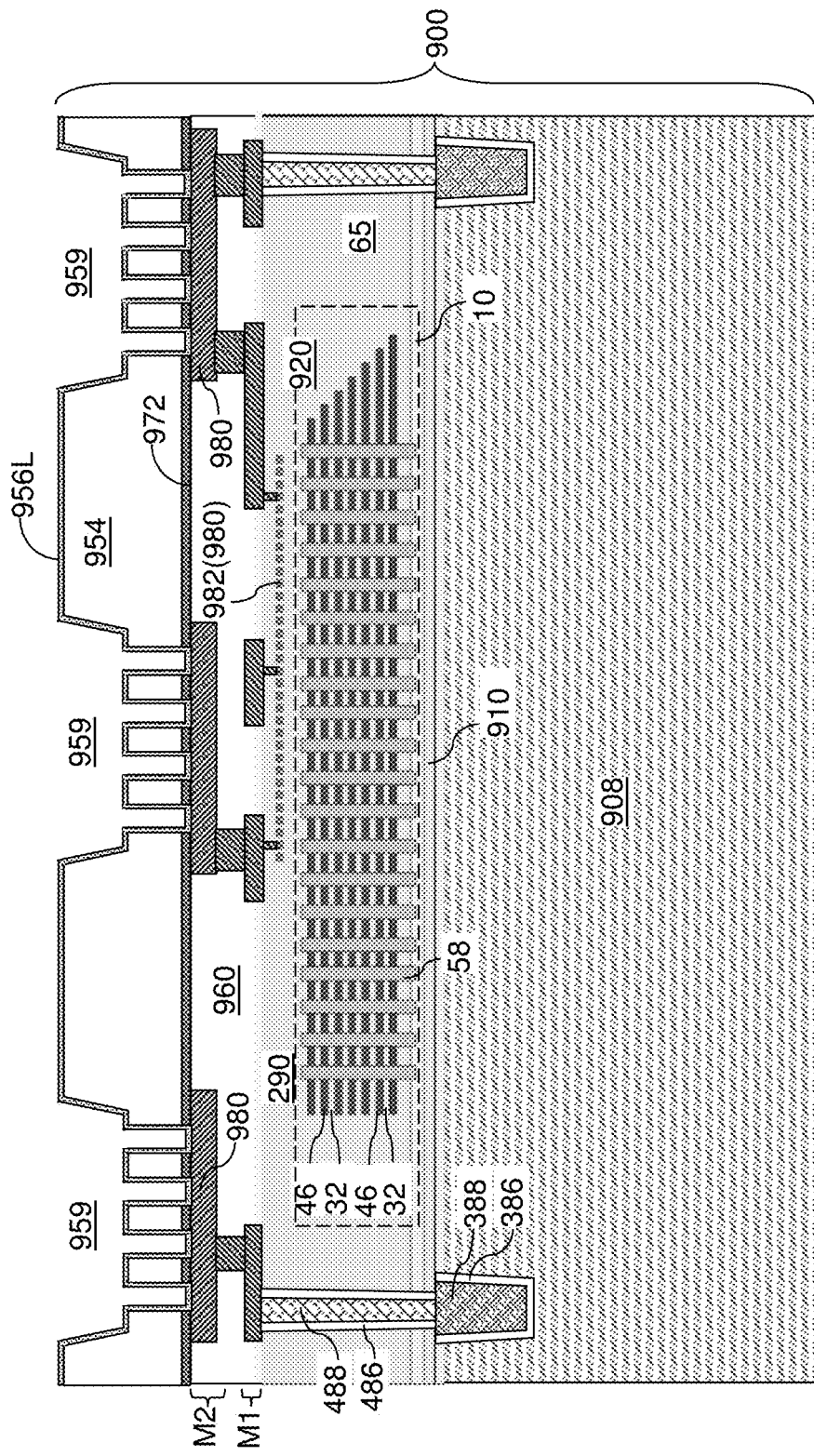

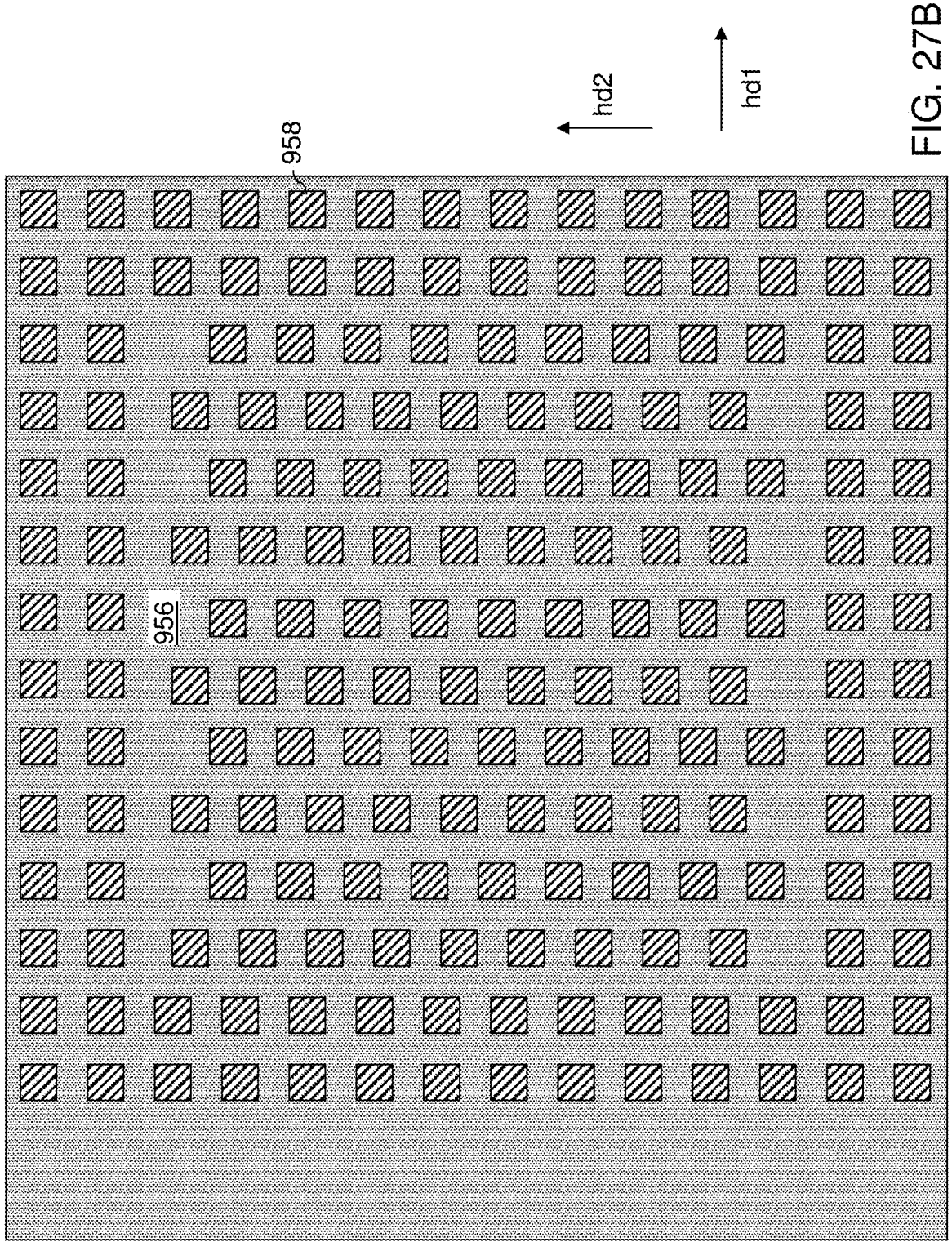

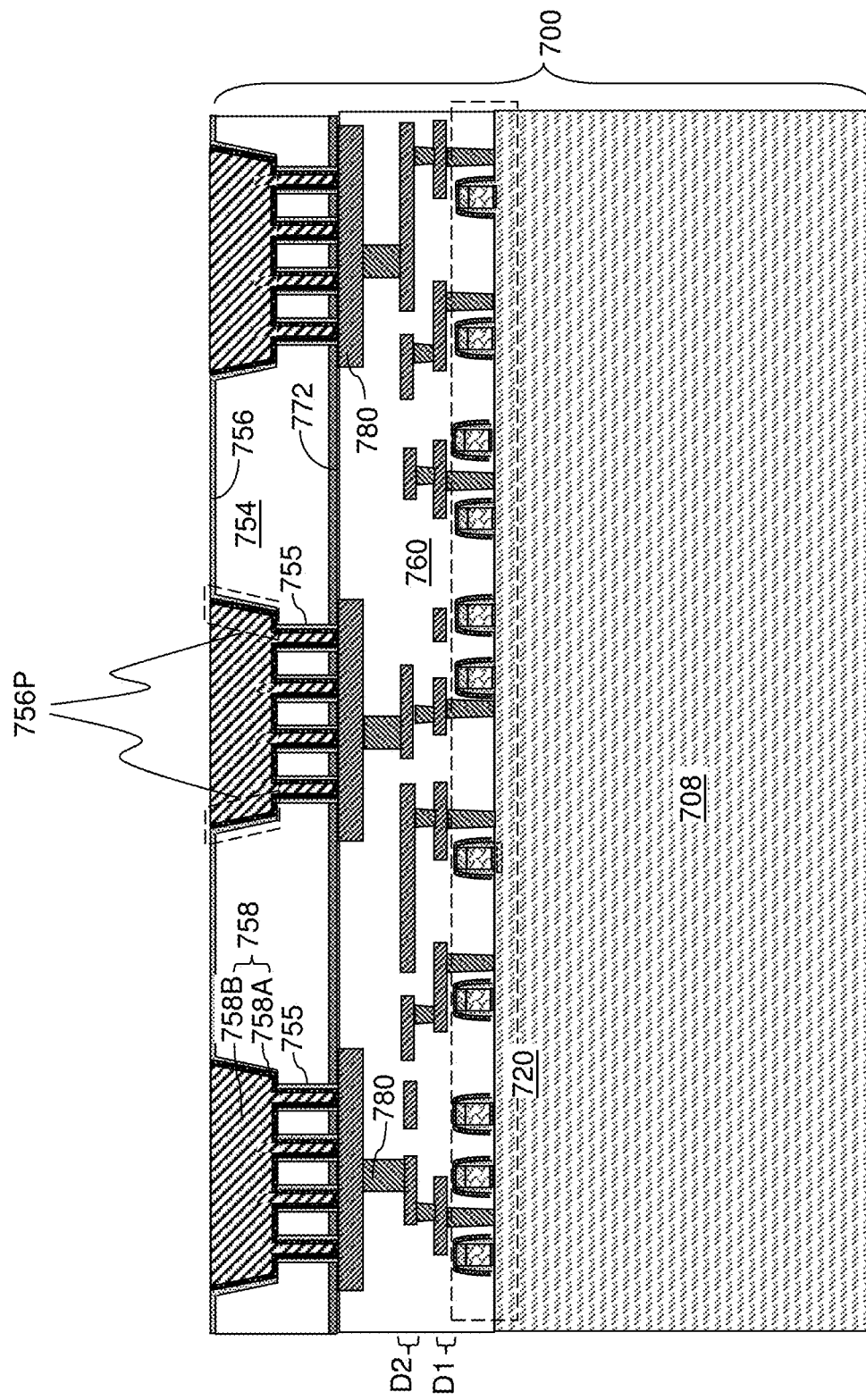

SEMICONDUCTOR DIE INCLUDING DIFFUSION BARRIER LAYERS EMBEDDING BONDING PADS AND METHODS OF FORMING THE SAME

FIELD

The present disclosure relates generally to the field of semiconductor devices, and particularly to a semiconductor die including bonding pads embedded in diffusion barrier layers and methods for manufacturing the same.

BACKGROUND

A semiconductor memory device may include a memory array and driver circuit located on the same substrate. However, the driver circuit takes up valuable space on the substrate, thus reducing the space available for the memory array.

SUMMARY

According to an aspect of the present disclosure, a structure comprising a first semiconductor die is provided. The first semiconductor die comprises: first semiconductor devices located over a first substrate; first interconnect-level dielectric material layers embedding first metal interconnect structures that are electrically connected to the first semiconductor devices and overlie the first semiconductor devices; a layer stack of a first pad-connection-via-level dielectric material layer and a first proximal dielectric diffusion barrier layer overlying the first interconnect-level dielectric material layers and embedding first pad-connection via structures; and a first pad-level dielectric material layer including first pad cavities that are filled with a respective combination of a first bonding pad and a respective first dielectric diffusion barrier portion, wherein each of the first bonding pads contacts a respective subset of the first pad-connection via structures.

According to another aspect of the present disclosure, a method of forming a semiconductor structure is provided. The method comprises forming a first semiconductor die by forming first semiconductor devices over a first substrate; forming a layer stack of a first pad-connection-via-level dielectric material layer and a first proximal dielectric diffusion barrier layer embedding first metal interconnect structures over the first semiconductor devices; forming first pad-connection via structures through the layer stack on a subset of the first metal interconnect structures; forming a first pad-level dielectric material layer over the layer stack; forming first pad cavities through the first pad-level dielectric material layer; forming a first distal dielectric diffusion barrier layer in the first pad cavities and over the first pad-level dielectric material layer; forming openings through the first distal dielectric diffusion barrier layer at bottom portions of the first pad cavities, wherein top surfaces of the first pad-connection via structures are physically exposed; and forming first bonding pads in remaining volumes of the first pad cavities directly on the top surfaces of the first pad-connection via structures.

According to an aspect of the present disclosure, a structure comprising a first semiconductor die is provided. The first semiconductor die comprises: first semiconductor devices located over a first substrate; first interconnect-level dielectric material layers embedding first metal interconnect structures that are electrically connected to the first semiconductor devices and overlie the first semiconductor devices; a layer stack of a first proximal dielectric diffusion barrier layer and a first pad-and-via-level dielectric material layer overlying the first interconnect-level dielectric material layers and embedding first integrated pad and via structures; and first dielectric diffusion barrier portions embedded in the first pad-and-via-level dielectric material layer, wherein each of the first dielectric diffusion barrier portions contacts, and laterally surrounds, a pad portion of a respective one of the first integrated pad and via structures.

According to another aspect of the present disclosure, a method of forming a semiconductor structure is provided. The method comprises forming a first semiconductor die by forming first semiconductor devices over a first substrate; forming first interconnect-level dielectric layers embedding first metal interconnect structures over the first semiconductor devices; forming a first proximal dielectric diffusion barrier layer and a first pad-and-via-level dielectric material layer over the first semiconductor devices; forming first integrated pad and via cavities through the first pad-and-via-level dielectric material layer; forming a first distal dielectric diffusion barrier layer in the first integrated pad and via cavities and over the first pad-and-via-level dielectric material layer; removing horizontal portions of the first distal dielectric diffusion barrier layer within areas of the first integrated pad and via cavities, wherein top surfaces of a subset of the first metal interconnect structures are physically exposed; and forming first integrated pad and via structures in remaining volumes of the first pad and via cavities.

BRIEF DESCRIPTION OF THE DRAWINGS

FIG. 1E is a schematic horizontal cross-sectional view of the first configuration of the first semiconductor die along the horizontal plane E-E' of FIG. 1C. The vertical plane C-C' is the plane of the vertical cross-sectional view of FIG. 1C.

FIG. 20A is vertical cross-sectional view of a second alternative embodiment of the first exemplary bonded assembly along the vertical plane A-A' of FIG. 20E according to the first embodiment of the present disclosure.

FIG. 20B is vertical cross-sectional view of the first exemplary bonded assembly along the vertical plane B-B' of FIG. 20E.

FIG. 20C is vertical cross-sectional view of a memory array region the first exemplary bonded assembly along the vertical plane C-C' of FIG. 20E.

FIG. 20D is vertical cross-sectional view of a peripheral region of the first exemplary bonded assembly along the vertical plane D-D' of FIG. 20E.

FIG. 20F is vertical cross-sectional view of the first exemplary bonded assembly along the vertical plane F-F' of FIG. 20E.

FIG. 20G is vertical cross-sectional view of the first exemplary bonded assembly along the vertical plane G-G' of FIG. 20E.

FIG. 21A is a vertical cross-sectional view of a third alternative embodiment of the first exemplary bonded assembly according to an embodiment of the present disclosure.

FIG. 21B is a vertical cross-sectional view of a fourth alternative embodiment of the first exemplary bonded assembly according to an embodiment of the present disclosure.

FIG. 24 is a schematic vertical cross-sectional view of a region of the second configuration of the first semiconductor die after formation of a first distal dielectric diffusion barrier layer according to the second embodiment of the present disclosure.

FIG. 27B is a schematic top-down view of the first semiconductor die of FIG. 27A.

FIG. 33A is a schematic vertical cross-sectional view of a region of the second configuration of the second semiconductor die after formation of second integrated pad and via structures according to the second embodiment of the present disclosure.

DETAILED DESCRIPTION

Figure 1A:
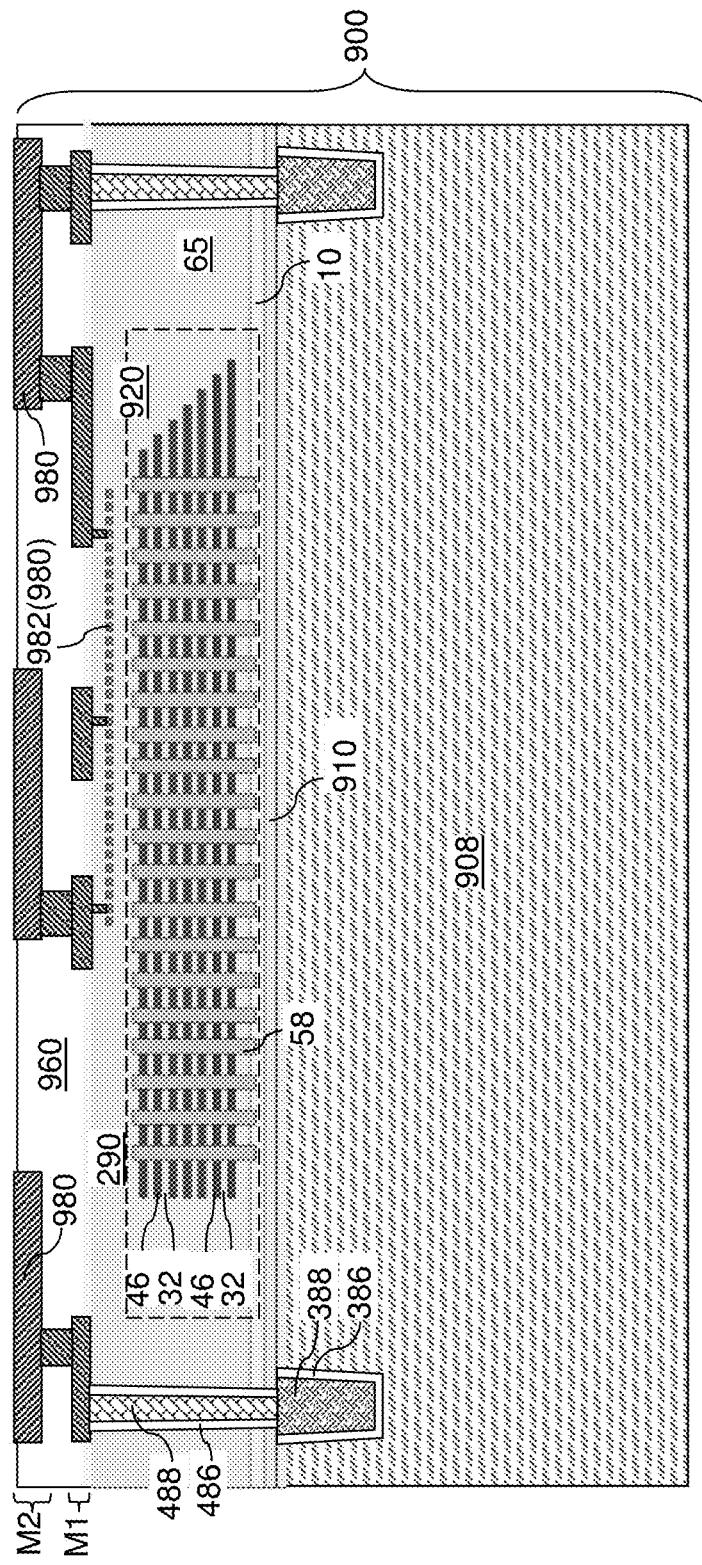
FIG. 1A is a schematic vertical cross-sectional view of a region of a first configuration of the first semiconductor die after formation of a first interconnect-level dielectric material layers and first metal interconnect structures according to a first embodiment of the present disclosure.

In semiconductor dies configured for pad-to-pad bonding, the metal bonding pads are provided as discrete structures without metal lines located between the bonding pads in order to reduce dishing or erosion of the metal bonding pads during a chemical mechanical planarization (i.e., chemical mechanical polishing, CMP) process. As a result, the bonding pads in the edge seal region do not completely surround the inner portion of the die and edge seal structures have a lateral opening at the level of the metal bonding pads. Moisture or ionic impurities may diffuse through a dielectric matrix embedding the metal bonding pads, and may penetrate into underlying semiconductor device components, such as field effect transistors, memory ells, or metal interconnect structures, and cause degradation in the reliability of the various components in the semiconductor devices. In other words, moisture or impurities can laterally diffuse through gaps between neighboring pairs of metal bonding pads. The embodiments of the present disclosure are directed to a semiconductor die including bonding pads surrounded by diffusion barrier layers and methods for manufacturing the same, the various aspects of which are discussed in detail herebelow. The diffusion barrier layers reduce or prevent diffusion of moisture and/or impurities into underlying semiconductor device components and improve reliability of the semiconductor device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
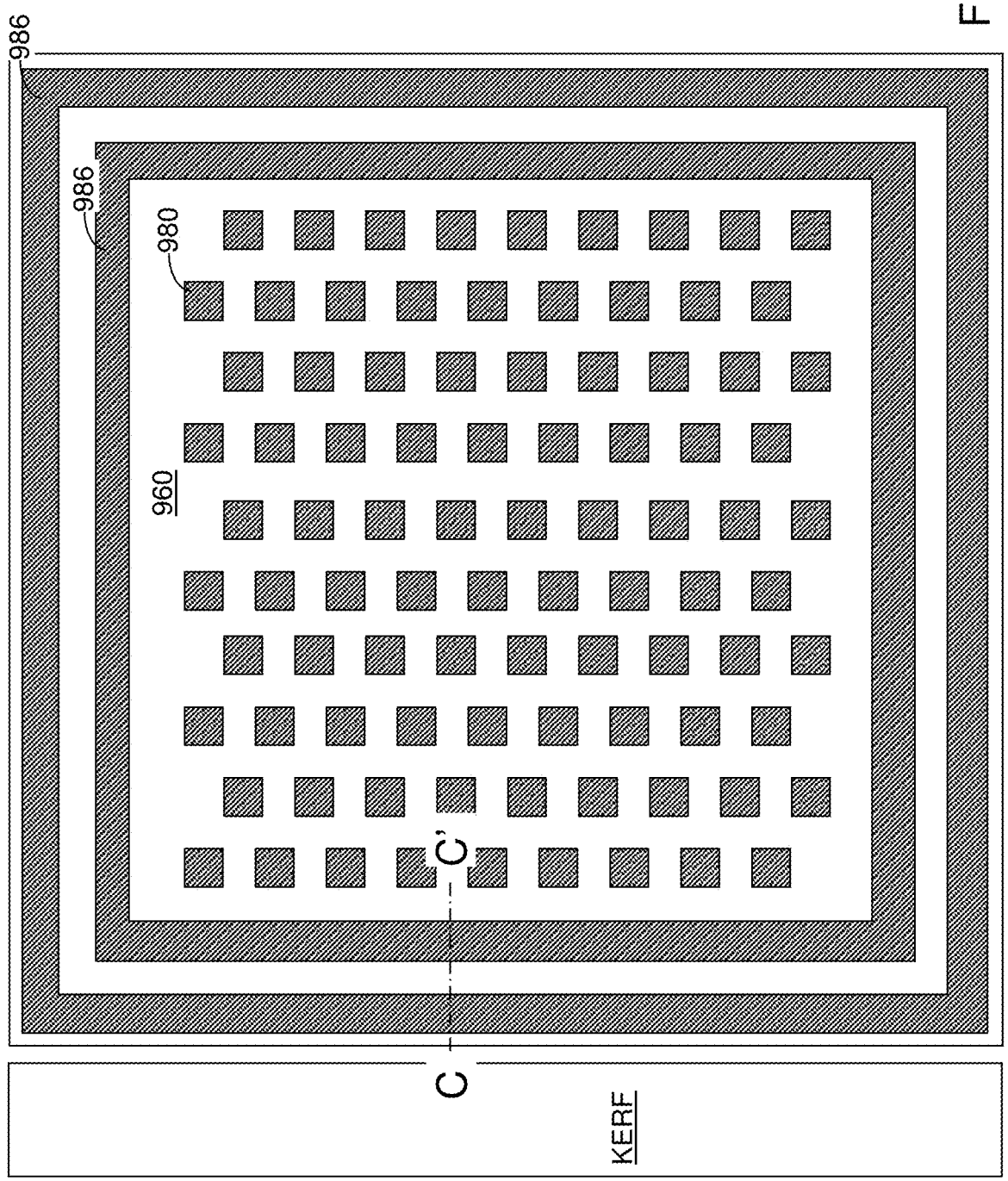
FIG. 1B is a schematic top-down view of the first semiconductor die of FIG. 1A.
Figure 1C:
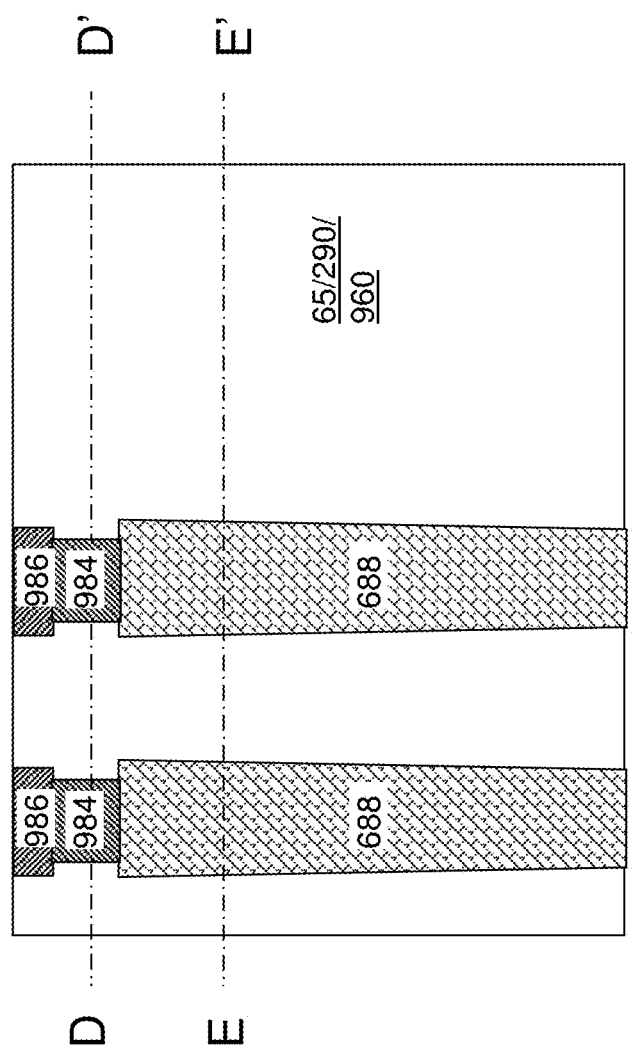
FIG. 1C is a schematic vertical cross-sectional view of the first configuration of the first semiconductor die along the vertical plane C-C' of FIG. 1B.
Figure 1D:
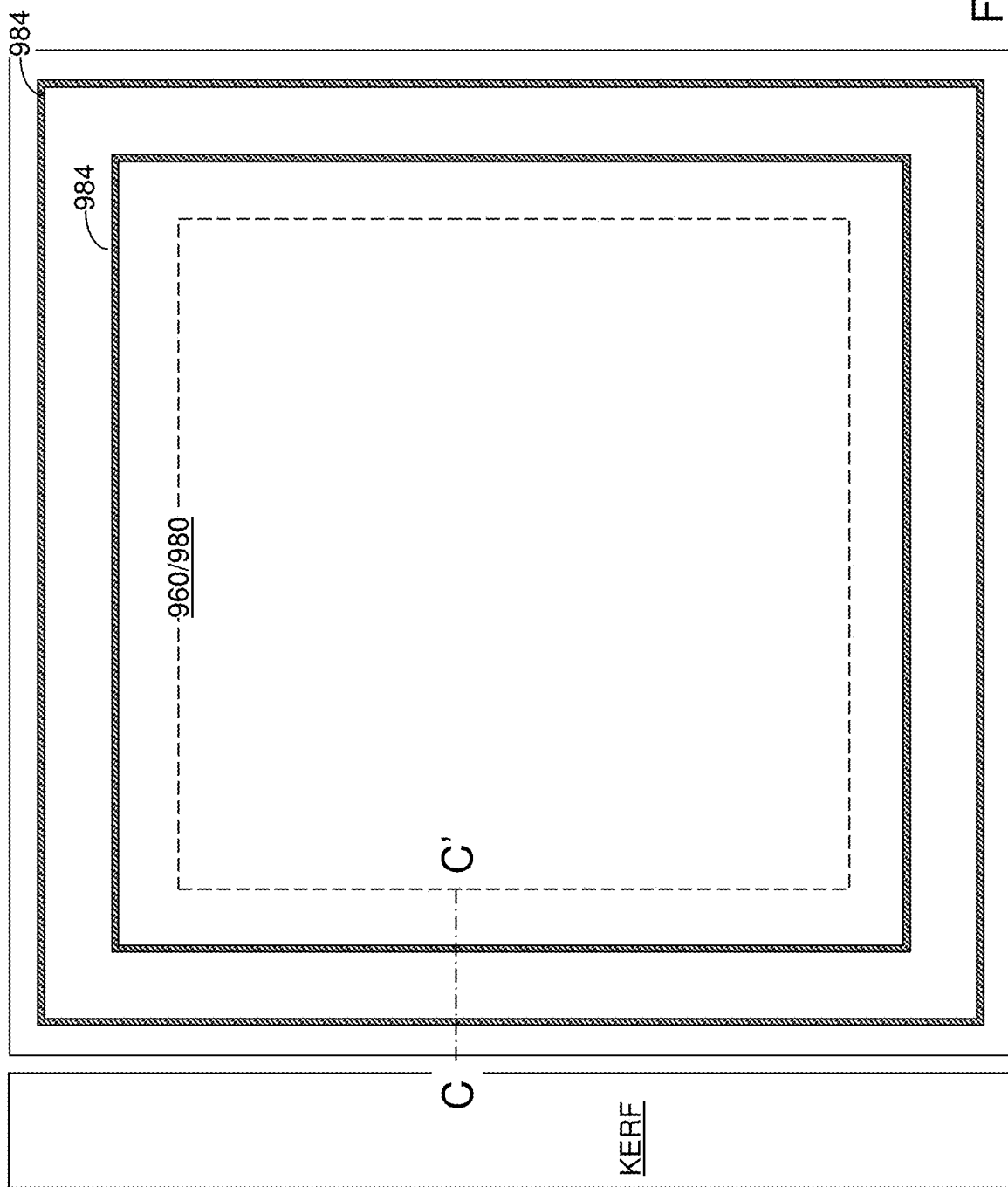
FIG. 1D is a schematic horizontal cross-sectional view of the first configuration of the first semiconductor die along the horizontal plane D-D' of FIG. 1C. The vertical plane C-C' is the plane of the vertical cross-sectional view of FIG. 1C.

Referring to FIGS. 1A-1E, a first semiconductor die 900 in a first configuration is illustrated. FIGS. 1B and 1D-1E correspond to a view of the entire area of the first semiconductor die 900 and an adjacent kerf area that is subsequently removed during a die singulation process. The first semiconductor die 900 includes a first substrate 908, first semiconductor devices 920 overlying the first substrate 908, first interconnect-level dielectric material layers (290, 960) overlying the first semiconductor devices, and first metal interconnect structures 980 embedded in the first interconnect-level dielectric material layers (290, 960). In one embodiment, the first substrate 908 may be a first semiconductor substrate such as a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be used. A through-substrate liner 386 and a through-substrate via structure 388 can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

A memory opening fill structure 58 may be formed within each memory opening. A memory opening fill structure 58 may include a memory film and a vertical semiconductor channel contacting the memory film. The memory film may include a blocking dielectric, a tunneling dielectric and a charge storage material located between the blocking and tunneling dielectric. The charge storage material may comprise charge trapping layer, such as a silicon nitride layer, or a plurality of discrete charge trapping regions, such as floating gates or discrete portions of a charge trapping layer. In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a terrace region in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 can be formed directly on a respective one of the through-substrate via structure 388.

The first interconnect-level dielectric material layers (290, 960) may include first proximal interconnect-level dielectric material layers 290 embedding contact via structures and bit lines 982 and first distal interconnect-level dielectric material layers 960 that embed a subset of the first metal interconnect structures 980 located above the first proximal interconnect-level dielectric material layers 290. The bit lines 982 are a subset of the first metal interconnect structures 980 and may electrically contact drain regions located above the semiconductor channel at the top of the memory opening fill structures 58. The contact via structures contact various nodes of the first semiconductor devices. Generally, the first metal interconnect structures 980 can be electrically connected to the first semiconductor devices 920. A proximal subset of the first metal interconnect structures 980 can be located within the first distal interconnect-level dielectric material layers 960. Interconnect metal lines and interconnect metal via structures, which are subsets of the first metal interconnect structures 980, can be embedded in the first distal interconnect-level dielectric material layers 960. In an illustrative example, the first metal interconnect structures 980 may include a first memory-side metal level M1 including memory-side first-level metal lines, and a second memory-side metal level M2 including memory-side second-level metal lines.

Each of the first proximal interconnect-level dielectric material layers 290 and the first distal interconnect-level dielectric material layers 960 may include a dielectric material such as undoped silicate glass, a doped silicate glass, organosilicate glass, silicon nitride, a dielectric metal oxide, or a combination thereof. The first distal interconnect-level dielectric material layers 960 may include one or more dielectric diffusion barrier layers (not expressly shown). In this case, each dielectric diffusion barrier layer embedded in the first distal interconnect-level dielectric material layers 960 may include silicon carbon nitride (i.e., silicon carbonitride "SiCN", which is also referred to silicon carbide nitride), silicon nitride ($Si_3N_4$), silicon oxyntirde, or any other dielectric material that is effective in blocking diffusion of copper. In one embodiment, each dielectric diffusion barrier layer embedded in the first distal interconnect-level dielectric material layers 960 may include a dielectric material having a dielectric constant less than 5, such as less than 4, such as SiCN having a dielectric constant of about 3.8, to reduce RC delay of the first metal interconnect structures 980. Each dielectric diffusion barrier layer may have a thickness in a range from 10 nm to 300 nm.

At least one edge seal structure (688, 984, 986) shown in FIGS. 1B-1E can be formed around the periphery of the first semiconductor die 900 through the dielectric material portions 65 and the first interconnect-level dielectric material layers (290, 960). For example, at least one moat trench vertically extending through the dielectric material portions 65 and optionally through a lower level of the first interconnect-level dielectric material layers (290, 960) can be formed, and can be subsequently filled with at least one dielectric material to form at least one first metallic wall structure 688. A plurality of nested metallic wall structures 688 can be formed. Each first metallic wall structure 688 continuously extends around the periphery of the first semiconductor die 900, and completely laterally encloses the first semiconductor devices 920. The entire bottom surface of each metallic wall structure 688 can contact the top surface of the first substrate 908.

Each of the at least one edge seal structure (688, 984, 986) can optionally also include at least one via-level ring structure 984 that overlies a respective one of the at least one metallic wall structure 688 and which is formed at a respective metal via level. Each via-level ring structure 984 is a component of the first metal interconnect structures 980. Further, each of the edge seal structure (688, 984, 986) can include at least one line-level ring structure 986. Each line-level ring structure 986 is a component of the first metal interconnect structures 980. Each line-level ring structure 986 overlies a respective one of the at least one metallic wall structure 688 and is formed at a respective metal line level. Generally, each edge seal structure (688, 984, 986) includes at least one continuous set of conductive material portions that vertically extends from the first substrate 908 to the top surface of the first interconnect-level dielectric material layers (290, 960). Each edge seal structure (688, 984, 986) includes a continuous set of conductive material portions that laterally surrounds the first semiconductor devices 920 without any opening therethrough.

In one embodiment, each of the at least one edge seal structure (688, 984, 986) can include a metallic wall structure 688 and a respective subset of the first metal interconnect structures 980 that provides a respective continuous barrier laterally surrounding the first semiconductor devices 920 without any lateral opening. Each of the at least one edge seal structure (688, 984, 986) vertically extends from the first substrate 908 to the topmost surface of the first distal interconnect-level dielectric material layers 980.

Figure 2A:
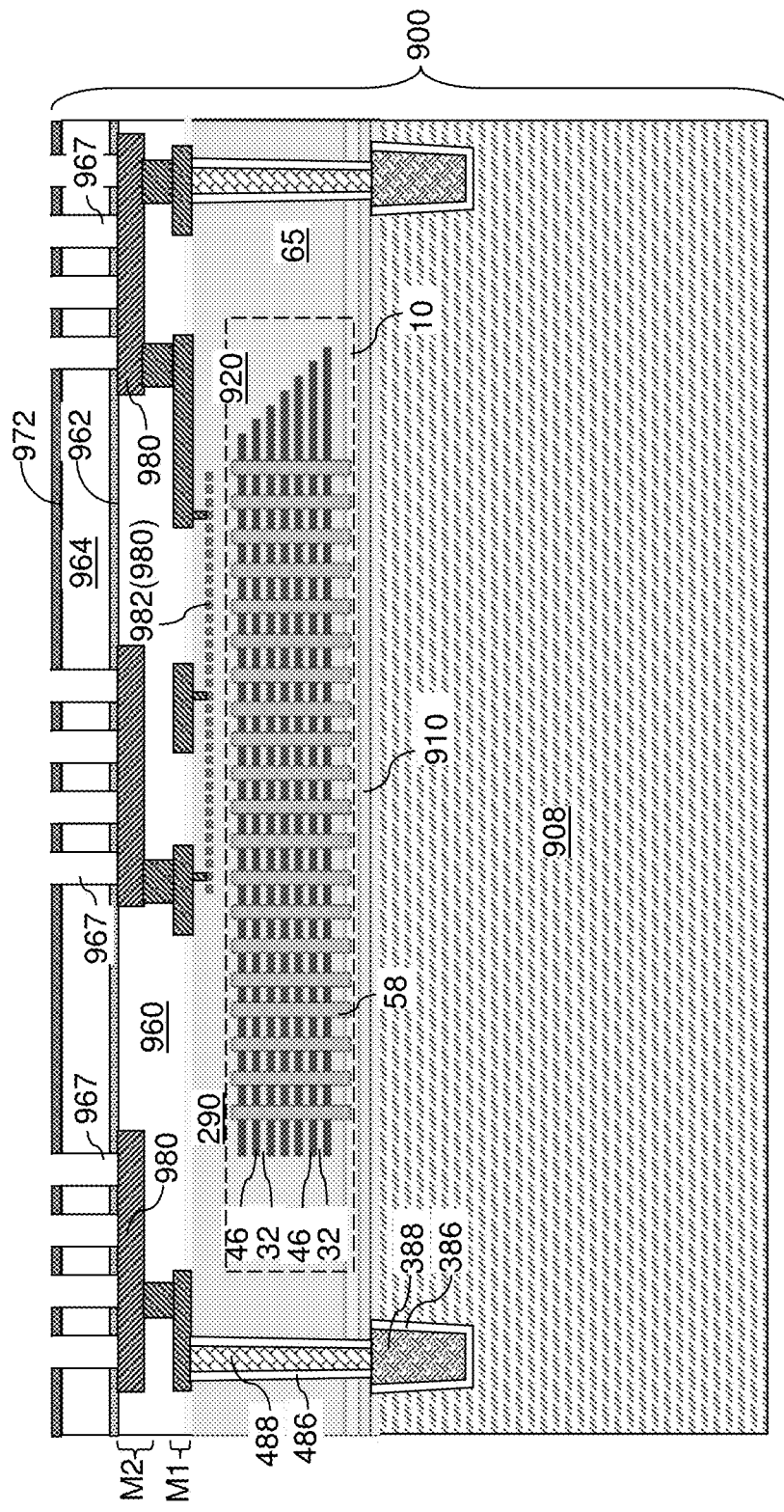
FIG. 2A is a schematic vertical cross-sectional view of a region of the first configuration of the first semiconductor die after formation of a interconnect-capping dielectric diffusion barrier layer, a first pad-connection-via-level dielectric material layer, a first proximal dielectric diffusion barrier layer, and first pad-connection via cavities according to the first embodiment of the present disclosure.
Figure 2B:
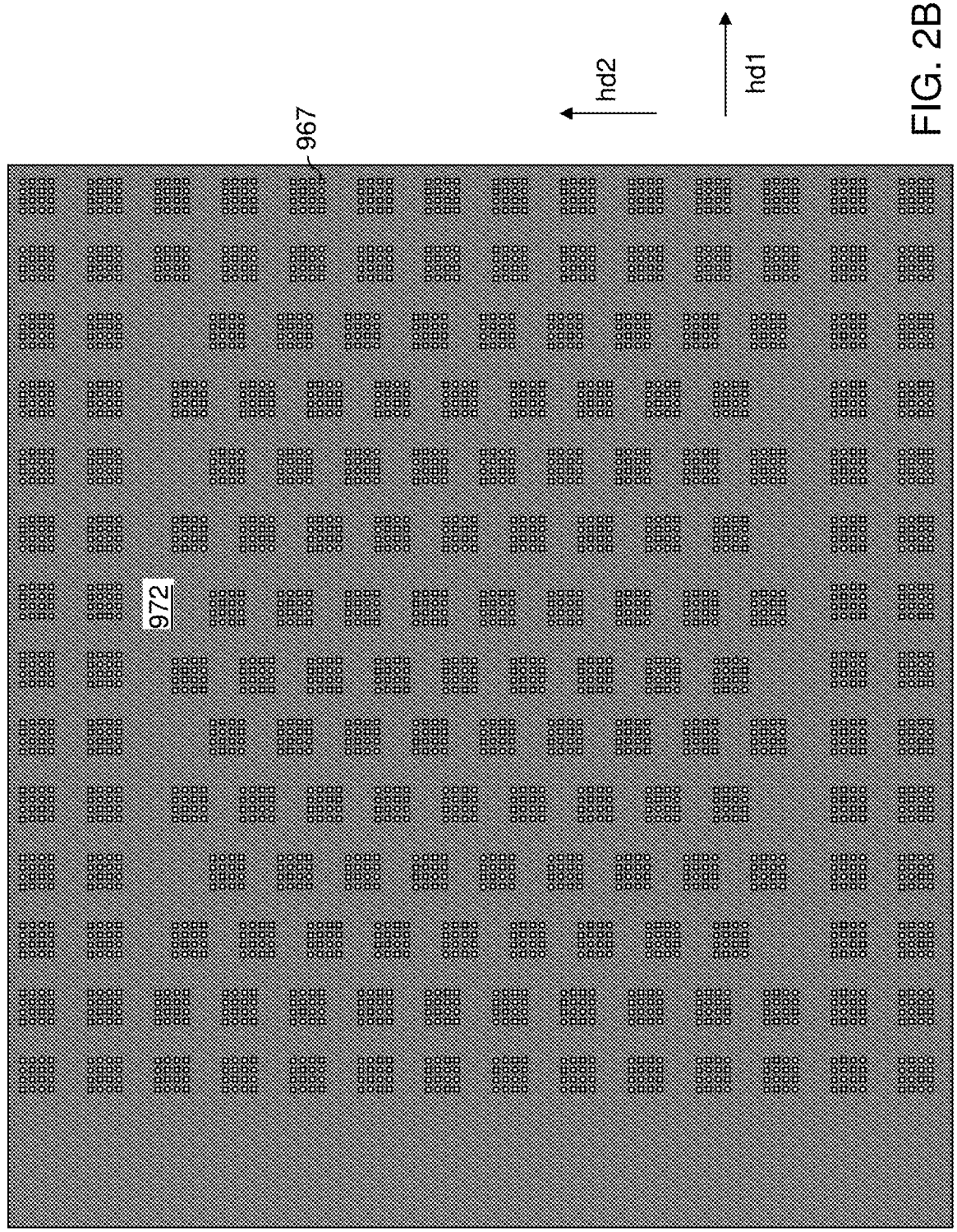
FIG. 2B is a schematic top-down view of the first semiconductor die of FIG. 2A.

Referring to FIGS. 2A and 2B, a layer stack including a first interconnect-capping dielectric diffusion barrier layer 962, a first pad-connection-via-level dielectric material layer 964, and a first proximal dielectric diffusion barrier layer 972 can be formed. The first interconnect-capping dielectric diffusion barrier layer 962 can include a dielectric material that blocks copper diffusion. In one embodiment, the first interconnect-capping dielectric diffusion barrier layer 962 can include silicon nitride, silicon carbon nitride, silicon oxynitride, or a stack thereof. In one embodiment, the first interconnect-capping dielectric diffusion barrier layer 962 can include a dielectric material having a dielectric constant less than 5, such as less than 4, such as silicon carbon nitride that has a dielectric constant of about 3.8. The thickness of the first interconnect-capping dielectric diffusion barrier layer 962 can be in a range from 5 nm to 50 nm, although lesser and greater thicknesses can also be used.

The first pad-connection-via-level dielectric material layer 964 may include, and/or consist essentially of, undoped silicate glass, a doped silicate glass, or organosilicate glass. The thickness of the first pad-connection-via-level dielectric material layer 964 may be in a range from 100 nm to 3,000 nm, although lesser and greater thicknesses may also be used. The first pad-connection-via-level dielectric material layer 964 may have a planar top surface.

The first proximal dielectric diffusion barrier layer 972 can include a dielectric material that blocks diffusion of moisture (e.g., moisture barrier). The first proximal dielectric diffusion barrier layer 972 comprises, and/or consists essentially of, a dielectric material such as silicon nitride, silicon oxynitride, or a stack thereof. In one embodiment, the first proximal dielectric diffusion barrier layer 972 can include a dielectric material having a dielectric constant greater than 5, such as silicon nitride having a dielectric constant of 7.9 or silicon oxynitride having a dielectric constant in a range from 5 to 7.9. The thickness of the first proximal dielectric diffusion barrier layer 972 can be in a range from 5 nm to 100 nm, although lesser and greater thicknesses can also be used.

A photoresist layer (not shown) can be applied over the first proximal dielectric diffusion barrier layer 972, and can be lithographically patterned to form discrete openings in areas that overlie topmost metal interconnect structures of the first metal interconnect structures 980. An anisotropic etch process can be performed to transfer the pattern of the openings in the photoresist layer through the first proximal dielectric diffusion barrier layer 972, the first pad-connection-via-level dielectric material layer 964, and the first interconnect-capping dielectric diffusion barrier layer 962. First pad-connection via cavities 967 are formed through the first proximal dielectric diffusion barrier layer 972. A top surface of a topmost metal interconnect structure 980 can be physically exposed at the bottom of each first pad-connection via cavity 967.

In one embodiment, the first pad-connection via cavities 967 can be arranged as clusters of first pad-connection via cavities 967, as shown in FIG. 2B. Each cluster of first pad-connection via cavities 967 can be located within the area of a respective one of the bonding pads to be subsequently formed. For example, each bonding pads can have a rectangular shape or a rounded rectangular shape having sides that are parallel to a first horizontal direction hd1 and a second horizontal direction hd2. The dimension of each bonding pad along the first horizontal direction hd1 and the dimension of each bonding pad along the second horizontal direction hd2 are in a range from 2 microns to 60 microns. In this case, each cluster of first pad-connection via cavities 967 can be arranged as a rectangular array. While the drawings illustrate each cluster of first pad-connection via cavities 967 as a 4×4 rectangular array, each cluster of first pad-connection via cavities 967 can be formed as an M×N rectangular array in which M and N are independent integers. Alternatively, a single first pad-connection via cavity 967 may be formed per each area of a bonding pad to be subsequently formed.

Each first pad-connection via cavity 967 is formed within the area of a respective one of the topmost metal interconnect structures 980. Clusters of first pad-connection via cavities 967 can be formed along each edge seal structure (688, 984, 986). Clusters of first pad-connection via cavities 967 and gap regions can alternate over the entire area of each edge seal structure (688, 984, 986) along the periphery of the first semiconductor die 900. In case multiple nested edge seal structures (688, 984, 986) are present, multiple laterally alternating sequences of clusters of first pad-connection via cavities 967 and gap regions are provided along the periphery of the first semiconductor die 900.

Figure 3A:
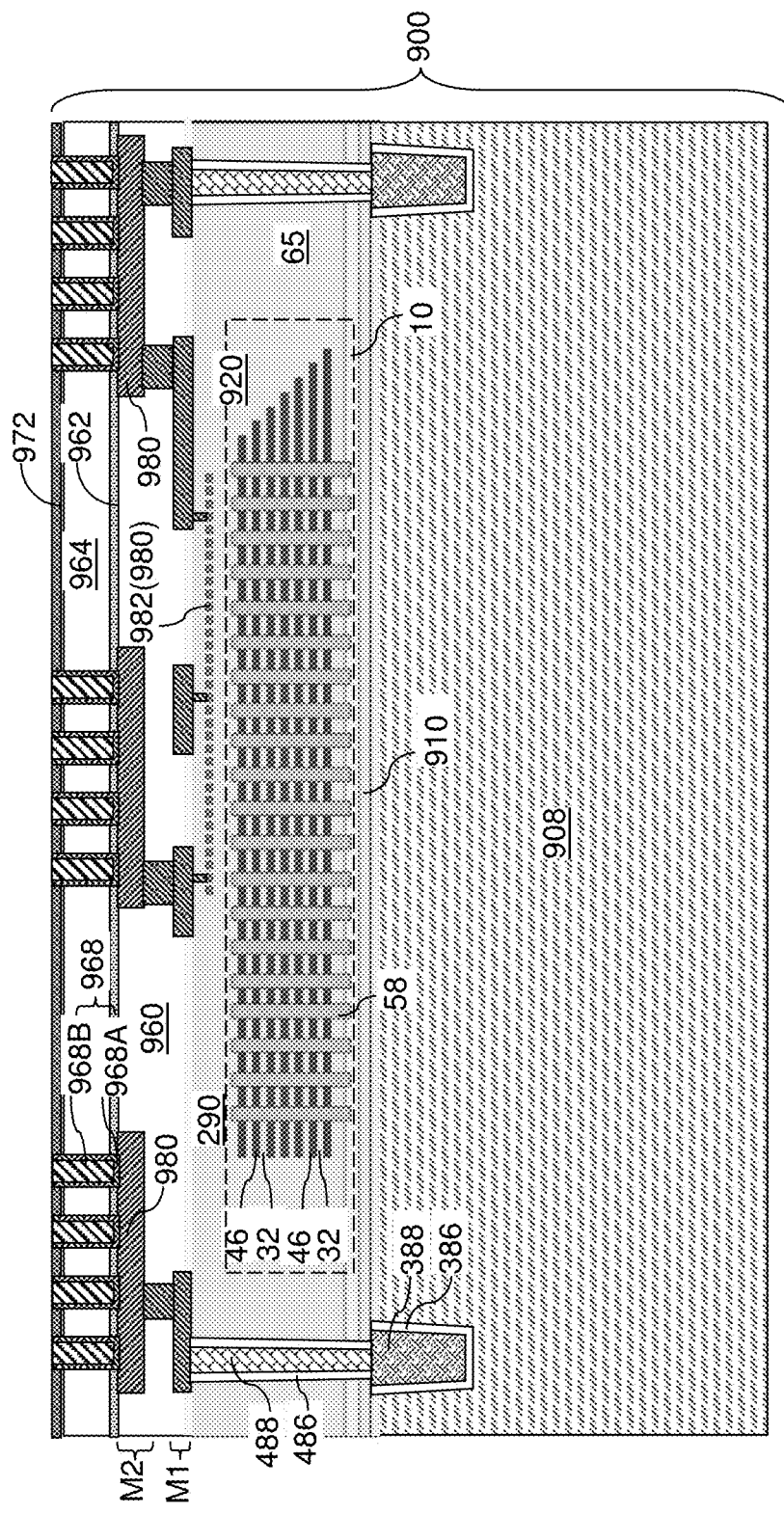
FIG. 3A is a schematic vertical cross-sectional view of a region of the first configuration of the first semiconductor die after formation of first pad-connection via structures according to the first embodiment of the present disclosure.
Figure 3B:
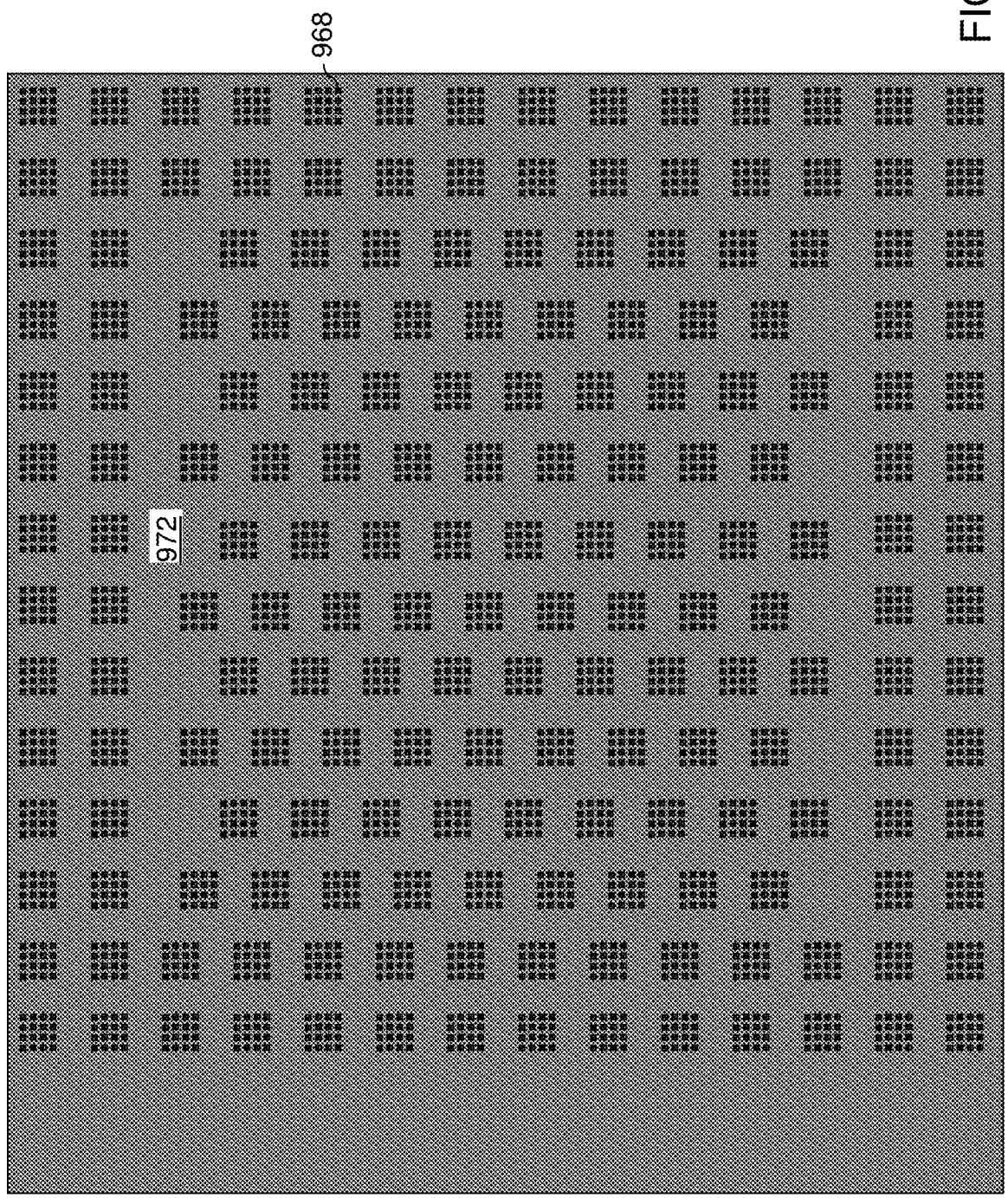
FIG. 3B is a schematic top-down view of the first semiconductor die of FIG. 3A.

Referring to FIGS. 3A and 3B, an optional pad-connection-via-level metallic barrier layer and a pad-connection-via-level metallic fill material can be sequentially deposited in the first pad-connection via cavities 967. The pad-connection-via-level metallic barrier layer includes a conductive metallic barrier material such as TiN, TaN, and/or WN. The conductive metallic barrier material can block diffusion of moisture and copper. The thickness of the pad-connection-via-level metallic barrier layer may be in a range from 4 nm to 80 nm, such as from 8 nm to 40 nm, although lesser and greater thicknesses can also be used. The pad-connection-via-level metallic fill material can include any suitable metal or metal alloy, such as tungsten.

Excess portions of the pad-connection-via-level metallic fill material and the pad-connection-via-level metallic barrier layer overlying the horizontal plane including the top surface of the first proximal dielectric diffusion barrier layer 972 can be removed by a planarization process such as chemical mechanical planarization. Remaining portions of the pad-connection-via-level metallic fill material and the pad-connection-via-level metallic barrier layer that fill the first pad-connection via cavities 967 constitute first pad-connection via structures 968. Each first pad-connection via structure 968 can include an optional pad-connection-via-level metallic barrier liner 968A and a pad-connection-via-level metallic fill material portion 968B. The pad-connection-via-level metallic barrier liner 968A is a patterned remaining portion of the pad-connection-via-level metallic barrier layer, and the pad-connection-via-level metallic fill material portion 968B is a patterned remaining plug portion (e.g., tungsten plug) of the pad-connection-via-level metallic fill material. Alternatively, the pad-connection-via-level metallic barrier liner 968A may be omitted. Top surfaces of the first pad-connection via structures 968 can be within a same horizontal plane as the top surface of the first proximal dielectric diffusion barrier layer 972.

Figure 4A:
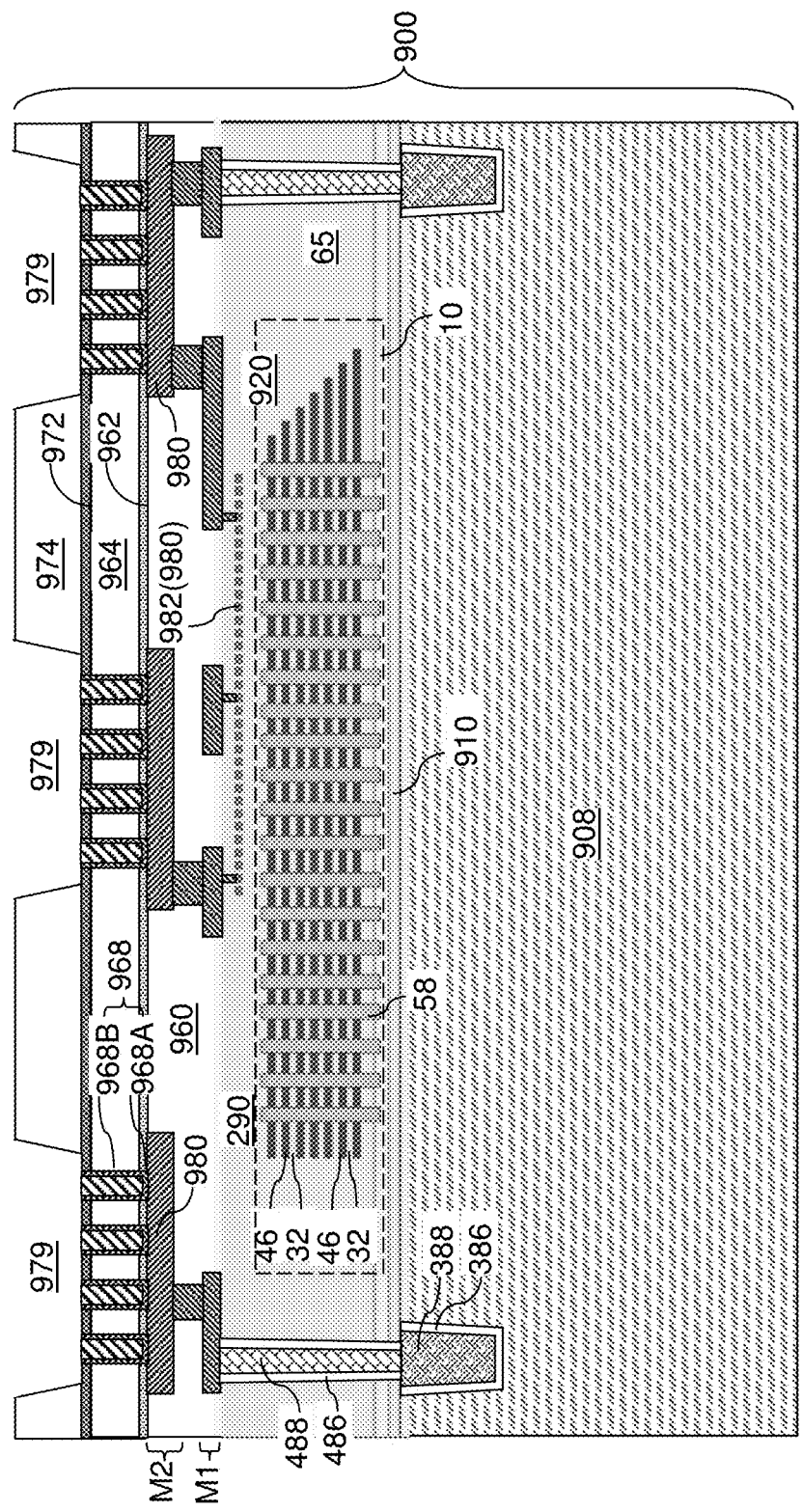
FIG. 4A is a schematic vertical cross-sectional view of a region of the first configuration of the first semiconductor die after formation of a first pad-level dielectric material layer and first pad cavities according to the first embodiment of the present disclosure.
Figure 4B:
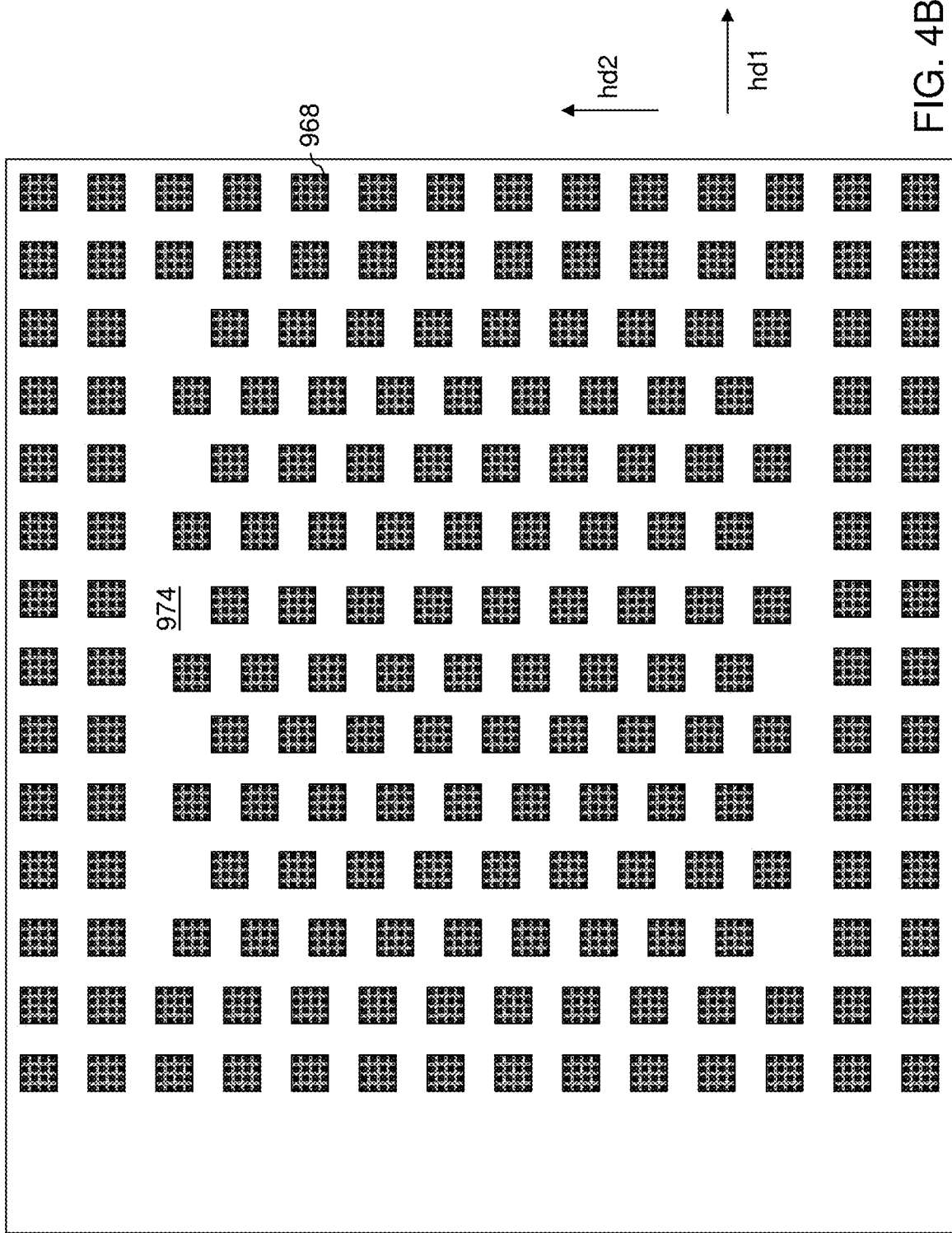
FIG. 4B is a schematic top-down view of the first semiconductor die of FIG. 4A.

Referring to FIGS. 4A and 4B, a first pad-level dielectric material layer 974 can be formed over the first proximal dielectric diffusion barrier layer 972. The first pad-level dielectric material layer 974 may include, and/or consist essentially of, undoped silicate glass, a doped silicate glass, or organosilicate glass. The thickness of the first pad-level dielectric material layer 974 may be in a range from 300 nm to 3,000 nm, although lesser and greater thicknesses may also be used. The first pad-level dielectric material layer 974 may have a planar top surface.

A photoresist layer (not shown) can be applied over the first pad-level dielectric material layer 974, and can be lithographically patterned to form discrete openings in each area of clusters of first pad-connection via structures 968. In other words, each discrete opening in the photoresist layer overlies a respective cluster of first pad-connection via structures 968. Each discrete opening in the photoresist layer has a shape of a bonding pad to be subsequently formed. For example, each discrete opening in the photoresist layer can have a rectangular shape or a rounded rectangular shape having sides that are parallel to a first horizontal direction hd1 and a second horizontal direction hd2. The dimension of each opening along the first horizontal direction hd1 and the dimension of each opening along the second horizontal direction hd2 are in a range from 2 microns to 60 microns.

An etch process, such as an anisotropic etch process, can be performed to transfer the pattern of the openings in the photoresist layer through the first pad-level dielectric material layer 974. First pad cavities 979 are formed through the first pad-level dielectric material layer 974. Top surfaces of an array of first pad-connection via structures 968 can be physically exposed at the bottom of each first pad cavity 979. Alternatively a top surface of a single pad-connection via structure 968 may be physically exposed at the bottom of each first pad cavity 979. Each first pad cavity 979 can have a horizontal cross-sectional shape of a rectangle or a rounded rectangle such that the dimension of each first pad cavity 979 along the first horizontal direction hd1 is in a range from 2 microns to 60 microns and the dimension of each first pad cavity 979 along the second horizontal direction hd2 is in a range from 2 microns to 60 microns. In one embodiment, each first pad cavity 979 can have a horizontal cross-sectional shape of a square or a rounded square such that the dimension of the each first pad cavity 979 along the first horizontal direction hd1 and the dimension of each first pad cavity 979 along the second horizontal direction hd2 are the same. In this case, the dimension of each first pad cavity 979 along the first horizontal direction hd1 and along the second horizontal direction hd2 can be in a range from 2 microns to 60 microns, such as from 4 microns to 30 microns. Sidewalls of the first pad cavities 979 may be vertical, or may have a taper angle greater than 0 degree and less than 30 degrees (such as a taper angle in a range from 3 degrees to 10 degrees) with respect to the vertical direction.

Figure 5:
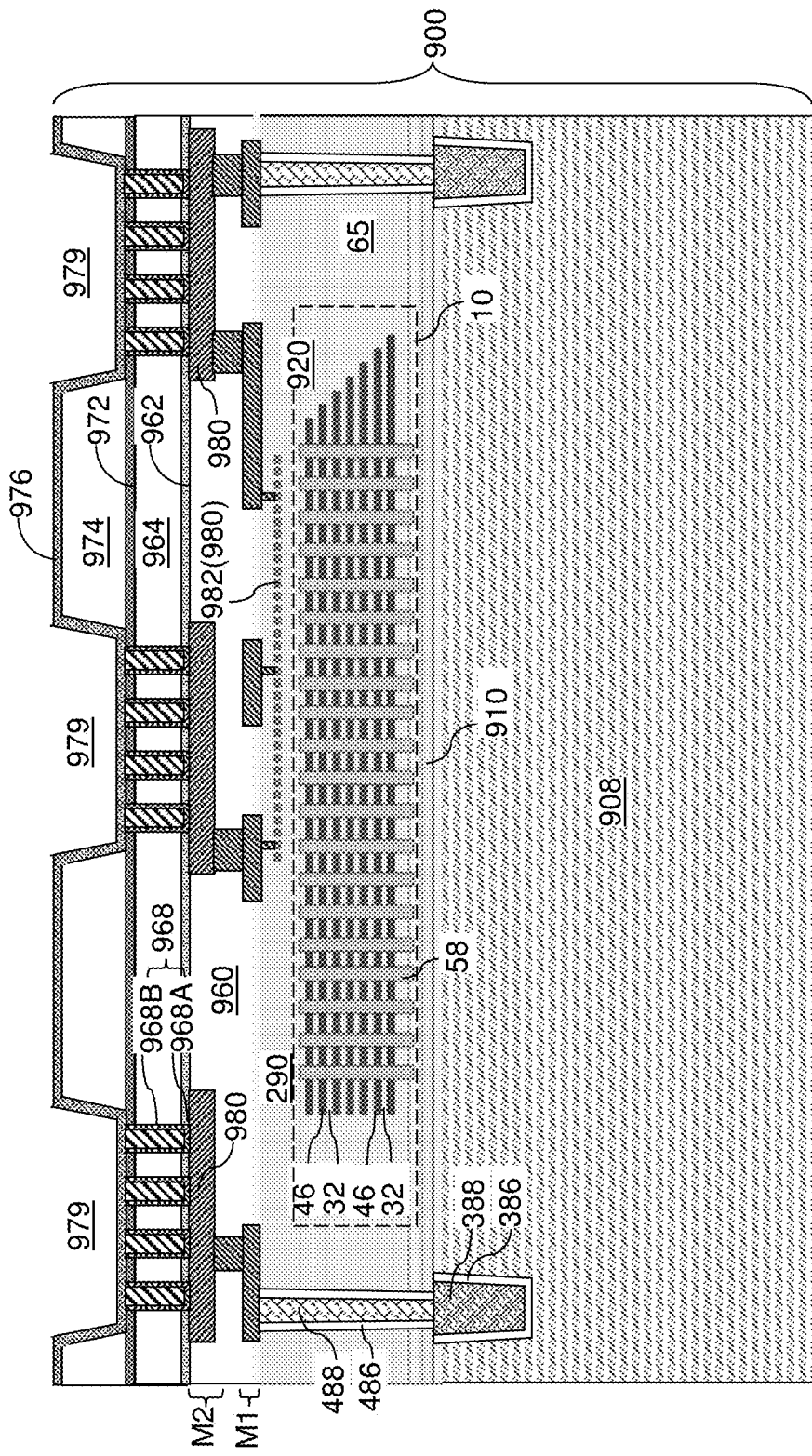
FIG. 5 is a schematic vertical cross-sectional view of a region of the first configuration of the first semiconductor die after formation of a first distal dielectric diffusion barrier layer according to the first embodiment of the present disclosure.

Referring to FIG. 5, a first distal dielectric diffusion barrier layer 976 can be deposited in the first pad cavities 979 and over the first pad-level dielectric material layer 974. The first distal dielectric diffusion barrier layer 976 is deposited on the top surfaces of the first pad-connection via structures 968. The first distal dielectric diffusion barrier layer 976 comprises, and/or consists essentially of, a diffusion blocking dielectric material such as silicon nitride, silicon oxynitride, or a stack thereof. In one embodiment, the first distal dielectric diffusion barrier layer 976 includes a moisture-blocking dielectric material having a dielectric constant greater than 5 (such as silicon nitride having a dielectric constant of 7.9 or silicon oxynitride having a dielectric constant in a range from 5 to 7.9). The thickness of the first distal dielectric diffusion barrier layer 976 can be in a range from 5 nm to 50 nm, such as from 10 nm to 25 nm, although lesser and greater thicknesses can also be used.

Figure 6:
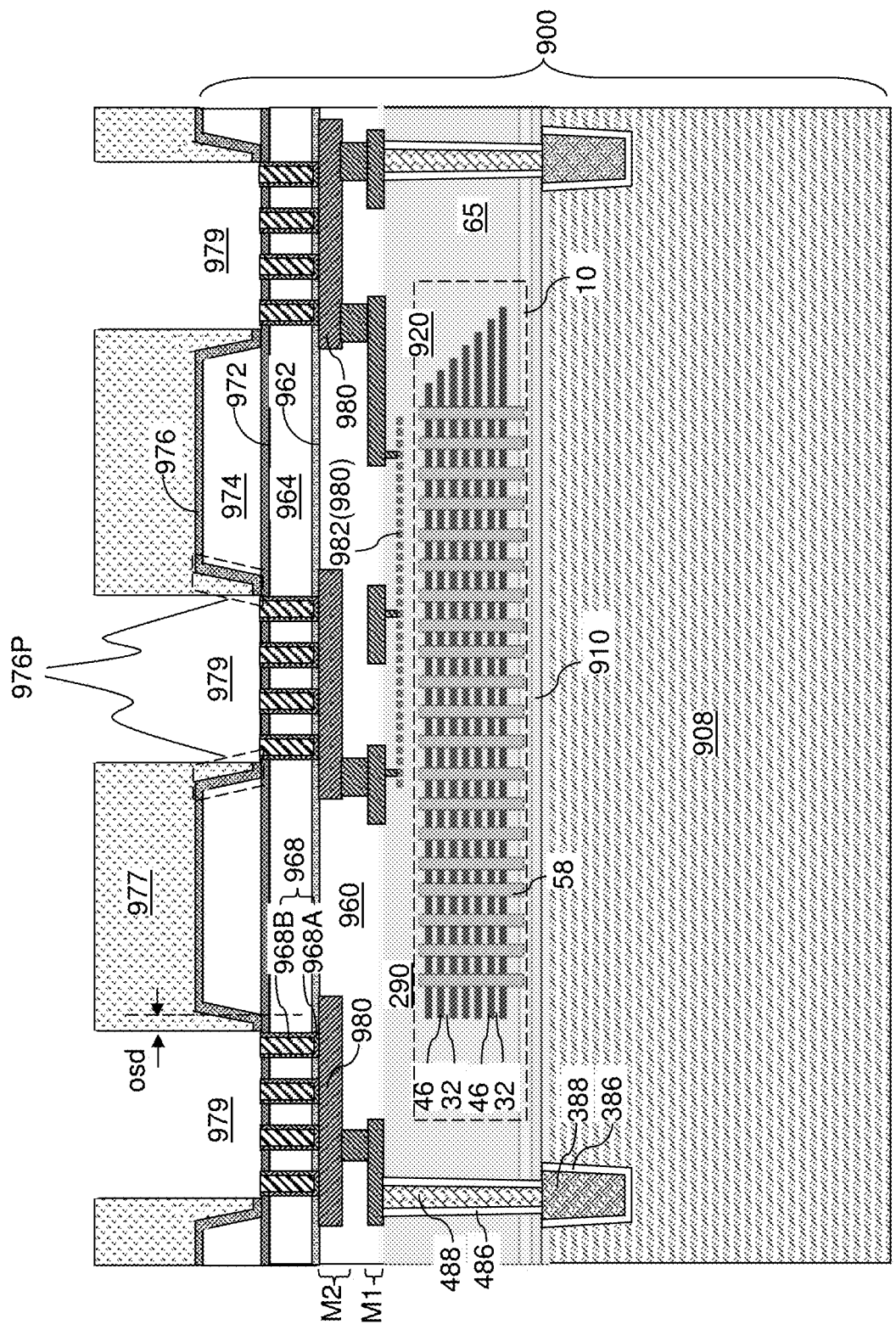
FIG. 6 is a schematic vertical cross-sectional view of a region of the first configuration of the first semiconductor die after patterning the first distal dielectric diffusion barrier layer according to the first embodiment of the present disclosure.

Referring to FIG. 6, a photoresist layer 977 can be applied over the first distal dielectric diffusion barrier layer 976, and can be lithographically patterned to form discrete openings therethrough. Each area of the discrete openings in the photoresist layer 977 can be located inside a bottom periphery of a respective first pad cavity 979, i.e., inside a closed bottom edge of a set of sidewalls of the respective first pad cavity 979 that adjoins the top surface of the first proximal dielectric diffusion barrier layer 972. In other words, openings through the photoresist layer 977 can be formed within areas of bottom surfaces of the first pad cavities 979 by lithographically patterning the photoresist layer 977.

Unmasked portions of the first distal dielectric diffusion barrier layer 976 can be anisotropically etched by performing an anisotropic etch process that employs the patterned photoresist layer 977 as an etch mask. Openings are formed through the first distal dielectric diffusion barrier layer 976 at bottom portions of the first pad cavities 979. Remaining portions of the patterned first distal dielectric diffusion barrier layer 976 comprise first dielectric diffusion barrier portions 976P that laterally surround a respective one of the first pad cavities 979. Top surfaces of the first pad-connection via structures 968 are physically exposed underneath the first pad cavities 979.

Each of the first dielectric diffusion barrier portions 976P of the first distal dielectric diffusion barrier layer 976 that laterally surrounds a respective one of the first pad cavities 979 contacts a top surface of the first proximal dielectric diffusion barrier layer 972. Specifically, each of the first dielectric diffusion barrier portions 976P comprises sidewall segments in contact with the first pad-level dielectric material layer 974 and vertically extending from a bottom surface of the first pad-level dielectric material layer 974 and a top surface of the first pad-level dielectric material layer 974. In one embodiment, the periphery of each opening through first distal dielectric diffusion barrier layer 976 can be laterally offset inward from a bottom periphery of a respective opening through the first pad-level dielectric material layer 974. In this case, each of the first dielectric diffusion barrier portions 976P comprises a horizontal segment having a bottom surface that contacts the first proximal dielectric diffusion barrier layer 972. The bottom surface can comprise an outer periphery that is adjoined to bottom edges of the sidewall segments of a respective first dielectric diffusion barrier portion 976P, and an inner periphery that is laterally offset inward from the outer periphery by an offset distance osd that is greater than the thickness of the sidewall segments of the first dielectric diffusion barrier portions 976P.

Figure 7:
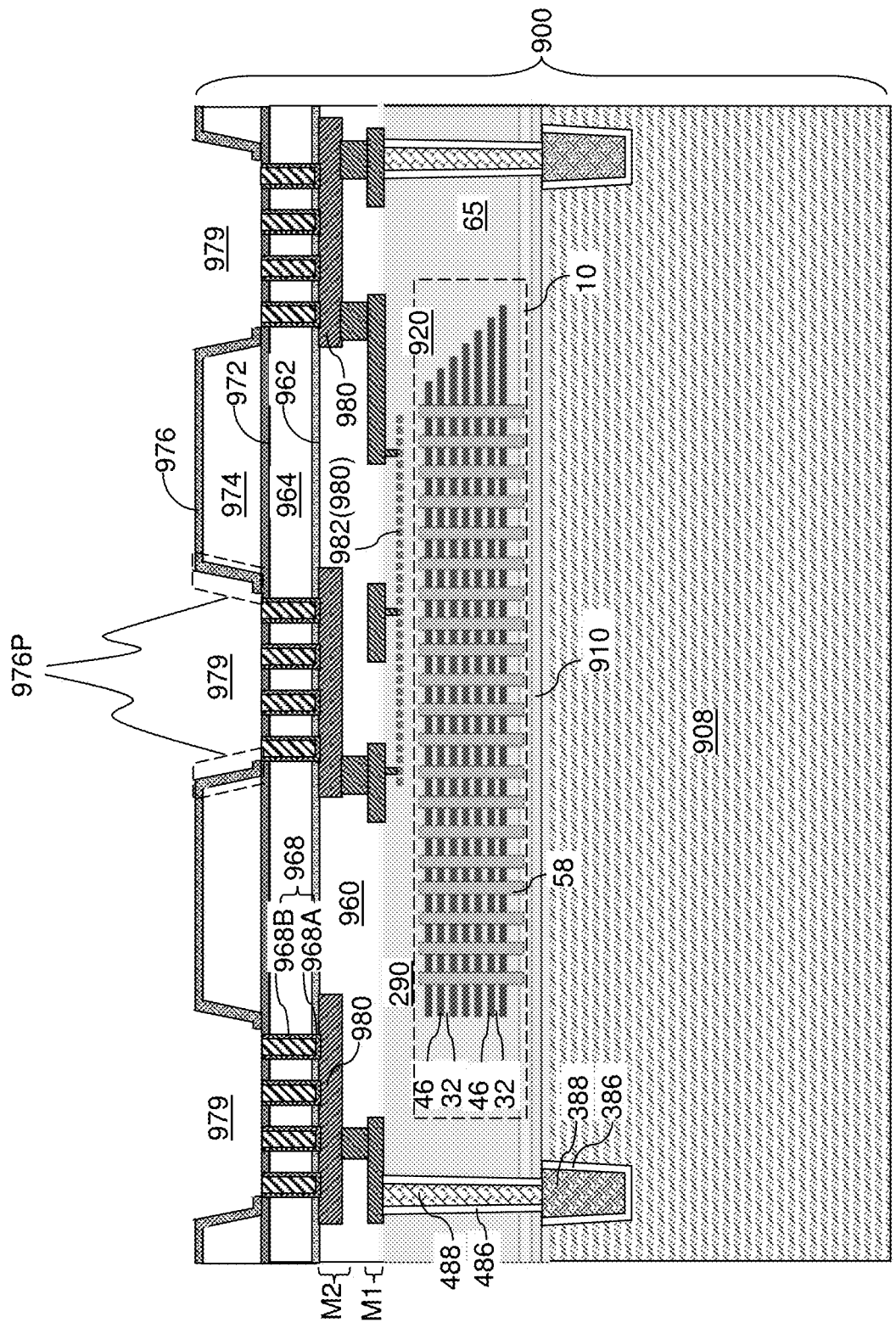
FIG. 7 is a schematic vertical cross-sectional view of a region of the first configuration of the first semiconductor die after removal of a patterned photoresist layer according to the first embodiment of the present disclosure.
Figure 8A:
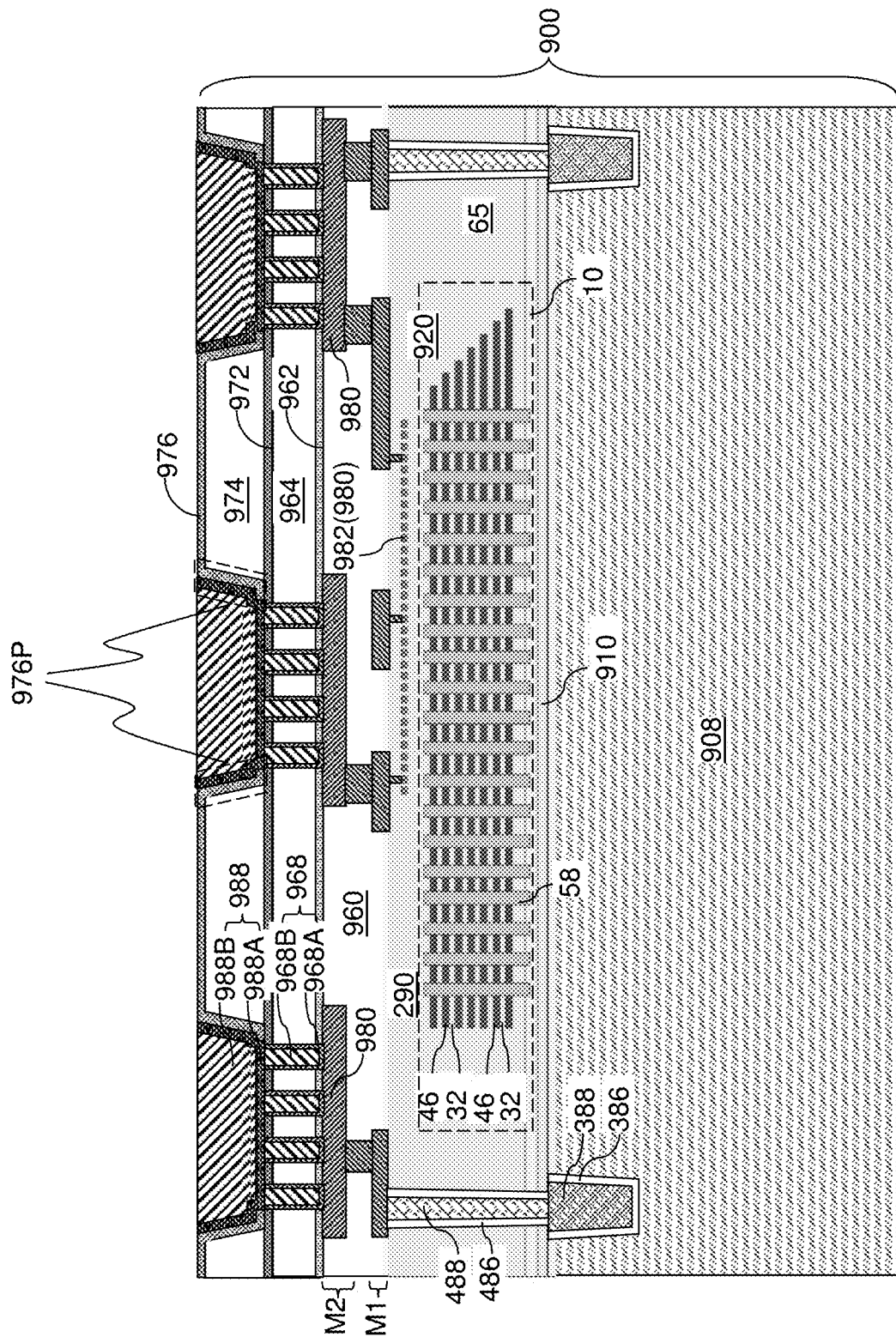
FIG. 8A is a schematic vertical cross-sectional view of a region of the first configuration of the first semiconductor die after formation of first bonding pads according to the first embodiment of the present disclosure.
Figure 8B:
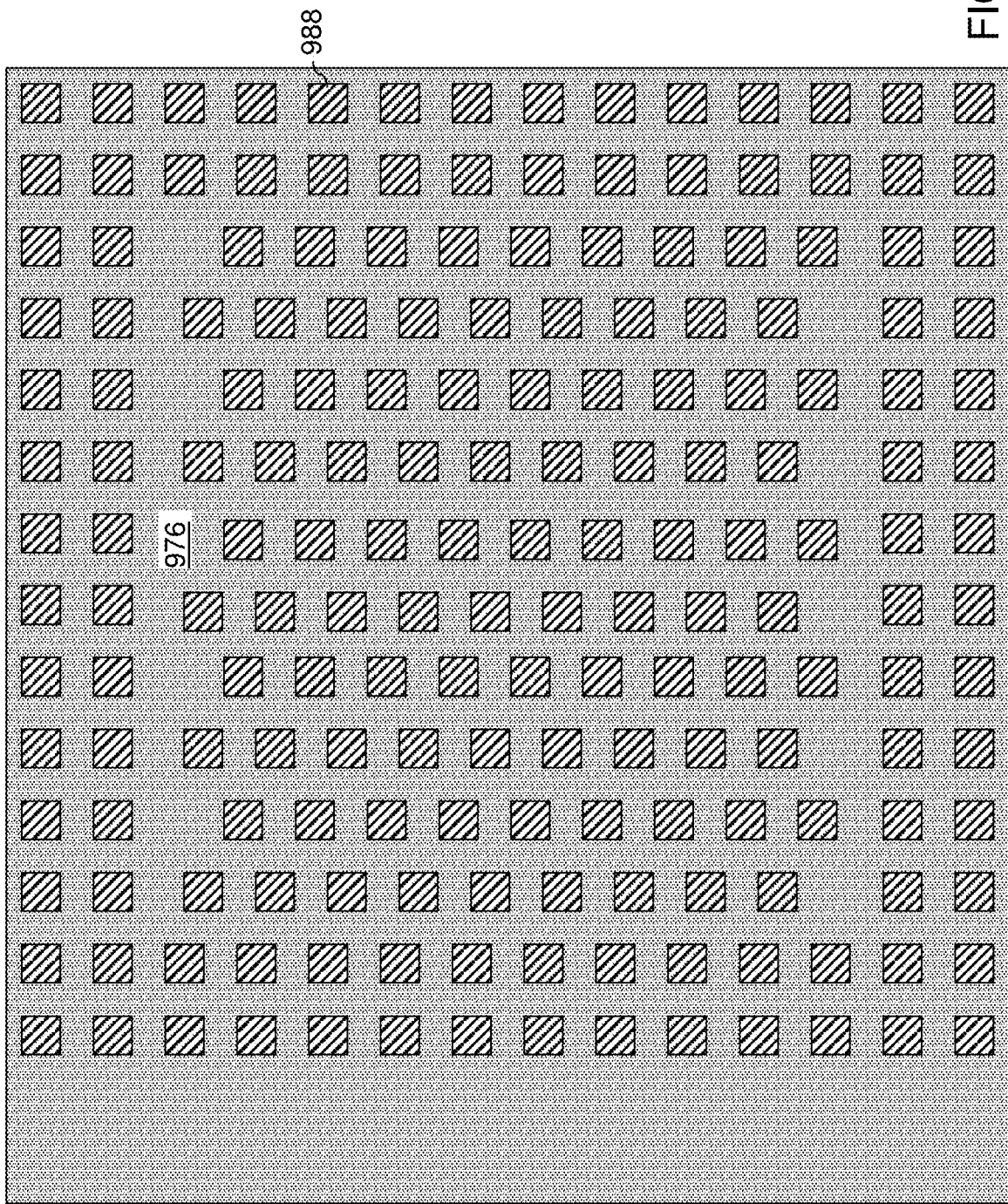
FIG. 8B is a schematic top-down view of the first semiconductor die of FIG. 8A.

Referring to FIG. 7, the patterned photoresist layer 977 can be removed, for example, by ashing. Referring to FIGS. 8A and 8B, a first bonding pad liner layer and a first metallic pad fill material can be sequentially deposited in the first pad cavities 979. The first bonding pad liner layer includes a metallic nitride material such as TiN, TaN, and/or WN. The conductive metallic barrier material can block diffusion of copper. The first bonding pad liner layer is formed on top surfaces of the first pad-connection via structures 968 and on portions of the top surface of the proximal dielectric diffusion barrier layer 972 within the openings (i.e., within the first pad cavities 979) through the first distal dielectric diffusion barrier layer 976. The thickness of the first bonding pad liner layer may be in a range from 4 nm to 80 nm, such as from 8 nm to 40 nm, although lesser and greater thicknesses can also be used. The first metallic pad fill material can include copper, which may be deposited by a combination of a copper seed layer deposition process employing physical vapor deposition and a copper electroplating process that fills remaining volumes of the first pad cavities 979.

Excess portions of the first metallic pad fill material and the first bonding pad liner layer overlying the horizontal plane including the top surface of the first distal dielectric diffusion barrier layer 976 can be removed by a planarization process such as chemical mechanical planarization. Remaining portions of the first metallic pad fill material and the first bonding pad liner layer that fill the first pad cavities 979 constitute first bonding pads 988. Each first bonding pad 988 can include a first bonding pad liner 988A and a first metallic pad fill material portion 988B. The first bonding pad liner 988A is a patterned remaining portion of the first bonding pad liner layer, and the first metallic pad fill material portion 988B is a patterned remaining portion of the first metallic pad fill material. Top surfaces of the first bonding pads 988 can be within a same horizontal plane as the top surface of the first distal dielectric diffusion barrier layer 976.

Generally, the first bonding pads 988 are formed in remaining volumes of the first pad cavities 979 after patterning the first distal dielectric diffusion barrier layer 976 directly on the top surfaces of the first pad-connection via structures 966. Each of the first bonding pads 988 comprises, and/or consists of, a first bonding pad liner 988A comprising a metallic nitride material, and a first metallic pad fill material portion 988B (e.g., copper portion) embedded in the bonding pad liner 988A.

In one embodiment, the first dielectric diffusion barrier portions 976P are interconnected with each other through a first horizontally extending diffusion barrier portion that overlie the first pad-level dielectric material layer 974. Top surfaces of the first bonding pads 988 can be located within the horizontal plane including the top surface of the first horizontally extending diffusion barrier portion of the first distal dielectric diffusion barrier layer 976.

In one embodiment, each first bonding pad 988 can physically and electrically contact a respective underlying subset of the first pad-connection via structures 968, which may be a respective plurality of first pad-connection via structures 968. Each of the first bonding pads 988 can directly contact a portion of a top surface of the first proximal dielectric diffusion barrier layer 972 located among the respective plurality of first pad-connection via structures 968. Generally, the first pad-level dielectric material layer 974 includes first pad cavities that are filled with a respective combination of a first bonding pad 988 and a respective first dielectric diffusion barrier portion 976P.

A first subset of the first bonding pads 988 can be located within the areas surrounded by the at least one edge seal structure (688, 984, 986), and can be electrically connected to a respective node of the first semiconductor devices 920. A second subset of the first bonding pads 988 can be located on, and can be electrically connected to, a respective one of the at least one edge seal structure (688, 984, 986).

Figure 9:
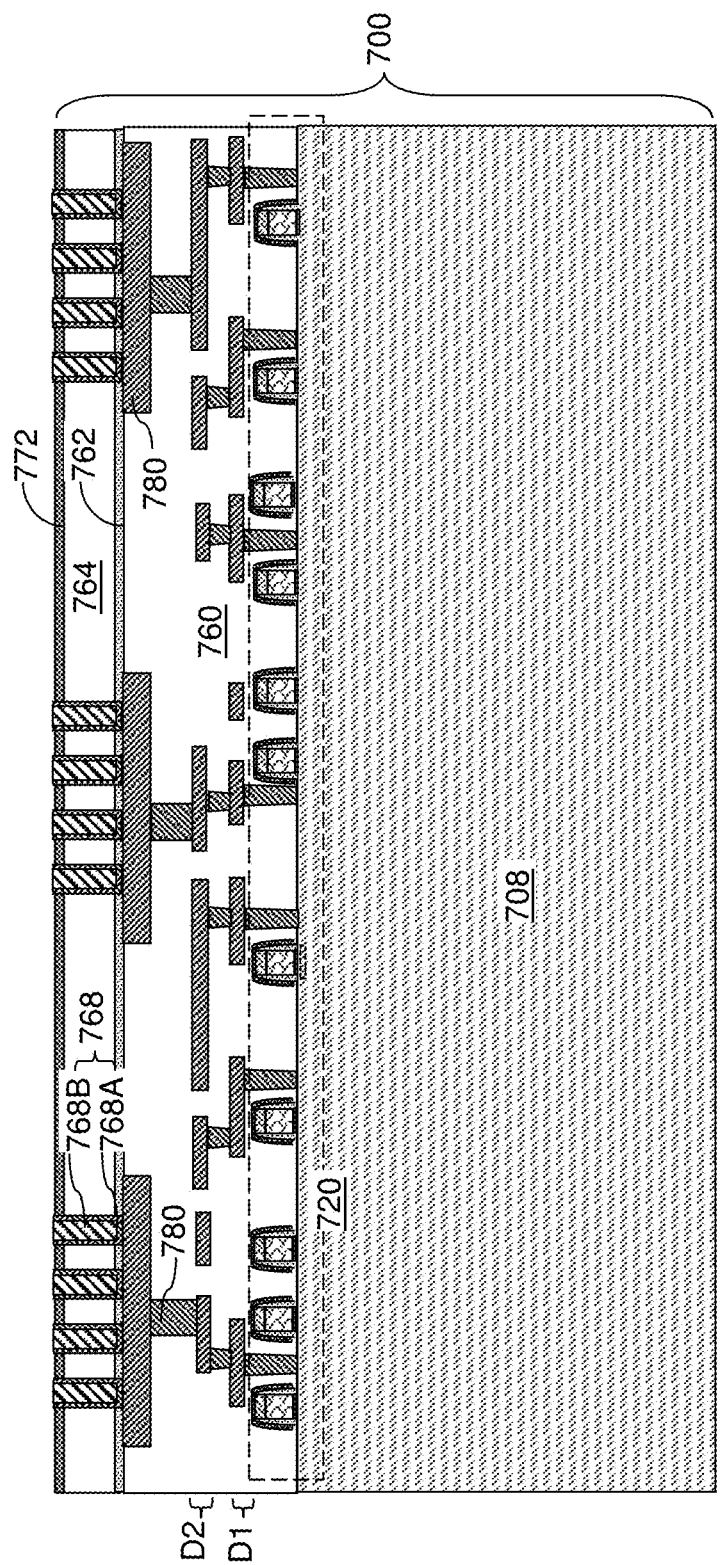
FIG. 9 is a schematic vertical cross-sectional view of a region of the first configuration of the second semiconductor die after formation of second pad-connection via structures according to the first embodiment of the present disclosure.

Referring to FIG. 9, a region of a second semiconductor die 700 in a first configuration is illustrated. The second semiconductor die 700 includes a second substrate 708, second semiconductor devices 720 overlying the second substrate 708, second interconnect-level dielectric material layers 760 overlying the second semiconductor devices 720, and second metal interconnect structures 780 embedded in the second interconnect-level dielectric material layers 760. In one embodiment, the second semiconductor devices 720 may include at least one complementary metal oxide semiconductor (CMOS) circuitry including field effect transistors. In one embodiment, the second substrate 708 may be a second semiconductor substrate such as a commercially available silicon substrate having a thickness in a range from 500 microns to 1 mm.

Generally, the second semiconductor devices may comprise any semiconductor device that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., a peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive layers 46), and bit lines 982, and the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second interconnect-level dielectric material layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level D1 including logic-side first-level metal lines, and a second logic-side metal level D2 including logic-side second-level metal lines.

The second interconnect-level dielectric material layers 760 may include one or more dielectric diffusion barrier layers (not expressly shown). In this case, each dielectric diffusion barrier layer embedded in the second interconnect-level dielectric material layers 760 may include silicon carbon nitride (SiCN), silicon nitride ($Si_3N_4$), silicon oxynitride, or any other dielectric material that is effective in blocking diffusion of copper. In one embodiment, each dielectric diffusion barrier layer embedded in the second interconnect-level dielectric material layers 760 may include a dielectric material having a dielectric constant less than 5, such as less than 4, such as SiCN having a dielectric constant of about 3.8, to reduce RC delay of the first metal interconnect structures 980. Each dielectric diffusion barrier layer may have a thickness in a range from 10 nm to 300 nm. At least one edge seal structure (not illustrated) can be formed around the periphery of the second semiconductor die 700 through the second interconnect-level dielectric material layers 760 in the same manner as in the first semiconductor die 900. Each of the at least one edge seal structure in the second semiconductor die 700 can include a metallic wall structure, and optionally at least one via-level ring structure and/or at least one line-level ring structure. Each edge seal structure in the second semiconductor die 700 includes a continuous set of conductive material portions that laterally surrounds the second semiconductor devices 720 without any opening therethrough. Each of the at least one edge seal structure in the second semiconductor die 700 vertically extends from the second substrate 708 to the top surface of the second interconnect-level dielectric material layer 780.

A layer stack including a second interconnect-capping dielectric diffusion barrier layer 762, a second pad-connection-via-level dielectric material layer 764, and a second proximal dielectric diffusion barrier layer 772 can be formed over the second interconnect-level dielectric material layer 780. The second interconnect-capping dielectric diffusion barrier layer 762 can include a dielectric material that blocks copper diffusion. In one embodiment, the second interconnect-capping dielectric diffusion barrier layer 762 can include silicon nitride, silicon carbon nitride, silicon oxynitride, or a stack thereof. In one embodiment, the second interconnect-capping dielectric diffusion barrier layer 762 can include a dielectric material having a dielectric constant less than 5, such as less than 4, such as silicon carbon nitride that has a dielectric constant of about 3.8. The thickness of the second interconnect-capping dielectric diffusion barrier layer 762 can be in a range from 5 nm to 50 nm, although lesser and greater thicknesses can also be used.

The second pad-connection-via-level dielectric material layer 764 may include, and/or consist essentially of, undoped silicate glass, a doped silicate glass, or organosilicate glass. The thickness of the second pad-connection-via-level dielectric material layer 764 may be in a range from 100 nm to 3,000 nm, although lesser and greater thicknesses may also be used. The second pad-connection-via-level dielectric material layer 764 may have a planar top surface.

The second proximal dielectric diffusion barrier layer 772 can include a dielectric material that blocks diffusion of moisture. The second proximal dielectric diffusion barrier layer 772 comprises, and/or consists essentially of, a dielectric material such as silicon nitride, silicon oxynitride or a stack thereof. In one embodiment, the second proximal dielectric diffusion barrier layer 772 can include a dielectric material having a dielectric constant greater than 5, such as silicon nitride having a dielectric constant of 7.9 or silicon oxynitride having a dielectric constant in a range from 5 to 7.9. The thickness of the second proximal dielectric diffusion barrier layer 772 can be in a range from 5 nm to 100 nm, although lesser and greater thicknesses can also be used.

A photoresist layer (not shown) can be applied over the second proximal dielectric diffusion barrier layer 772, and can be lithographically patterned to form discrete openings in areas that overlie topmost metal interconnect structures of the second metal interconnect structures 780. An anisotropic etch process can be performed to transfer the pattern of the openings in the photoresist layer through the second proximal dielectric diffusion barrier layer 772, the second pad-connection-via-level dielectric material layer 764, and the second interconnect-capping dielectric diffusion barrier layer 762. Second pad-connection via cavities are formed through the second proximal dielectric diffusion barrier layer 772. A top surface of a topmost metal interconnect structure 780 can be physically exposed at the bottom of each second pad-connection via cavity.

In one embodiment, the second pad-connection via cavities can be arranged as clusters of second pad-connection via cavities. Each cluster of second pad-connection via cavities can be located within the area of a respective one of the bonding pads to be subsequently formed. For example, each bonding pads can have a rectangular shape or a rounded rectangular shape having orthogonal sides. The dimension of each bonding pad along direction of the sides of the rectangular or rounded rectangular shapes can be in a range from 2 microns to 60 microns. In this case, each cluster of second pad-connection via cavities can be arranged as a rectangular array. Each cluster of second pad-connection via cavities can be formed as an M'×N' rectangular array in which M' and N' are independent integers. Alternatively, a single second pad-connection via cavity may be formed per each area of a bonding pad to be subsequently formed.

Each second pad-connection via cavity is formed within the area of a respective one of the topmost metal interconnect structures 780. Clusters of second pad-connection via cavities can be formed along each edge seal structure. Clusters of second pad-connection via cavities and gap regions can alternate over the entire area of each edge seal structure along the periphery of the second semiconductor die 700. In case multiple nested edge seal structures are present, multiple laterally alternating sequences of clusters of second pad-connection via cavities and gap regions are provided along the periphery of the second semiconductor die 700.

An optional pad-connection-via-level metallic barrier layer and a pad-connection-via-level metallic fill material can be sequentially deposited in the second pad-connection via cavities. The pad-connection-via-level metallic barrier layer includes a conductive metallic barrier material such as TiN, TaN, and/or WN. The conductive metallic barrier material can block diffusion of copper. The thickness of the pad-connection-via-level metallic barrier layer may be in a range from 4 nm to 80 nm, such as from 8 nm to 40 nm, although lesser and greater thicknesses can also be used. The pad-connection-via-level metallic fill material can include any suitable metal or metal alloy, such as tungsten.

Excess portions of the pad-connection-via-level metallic fill material and the pad-connection-via-level metallic barrier layer overlying the horizontal plane including the top surface of the second proximal dielectric diffusion barrier layer 772 can be removed by a planarization process such as chemical mechanical planarization. Remaining portions of the pad-connection-via-level metallic fill material and the pad-connection-via-level metallic barrier layer that fill the second pad-connection via cavities constitute second pad-connection via structures 768. Each second pad-connection via structure 768 can include an optional pad-connection-via-level metallic barrier liner 768A and a pad-connection-via-level metallic fill material portion 768B. The pad-connection-via-level metallic barrier liner 768A is a patterned remaining portion of the pad-connection-via-level metallic barrier layer, and the pad-connection-via-level metallic fill material portion 768B is a patterned remaining plug portion (e.g., tungsten plug) of the pad-connection-via-level metallic fill material. Alternatively, the pad-connection-via-level metallic barrier liner 768A may be omitted, Top surfaces of the second pad-connection via structures 768 can be within a same horizontal plane as the top surface of the second proximal dielectric diffusion barrier layer 772.

Figure 10:
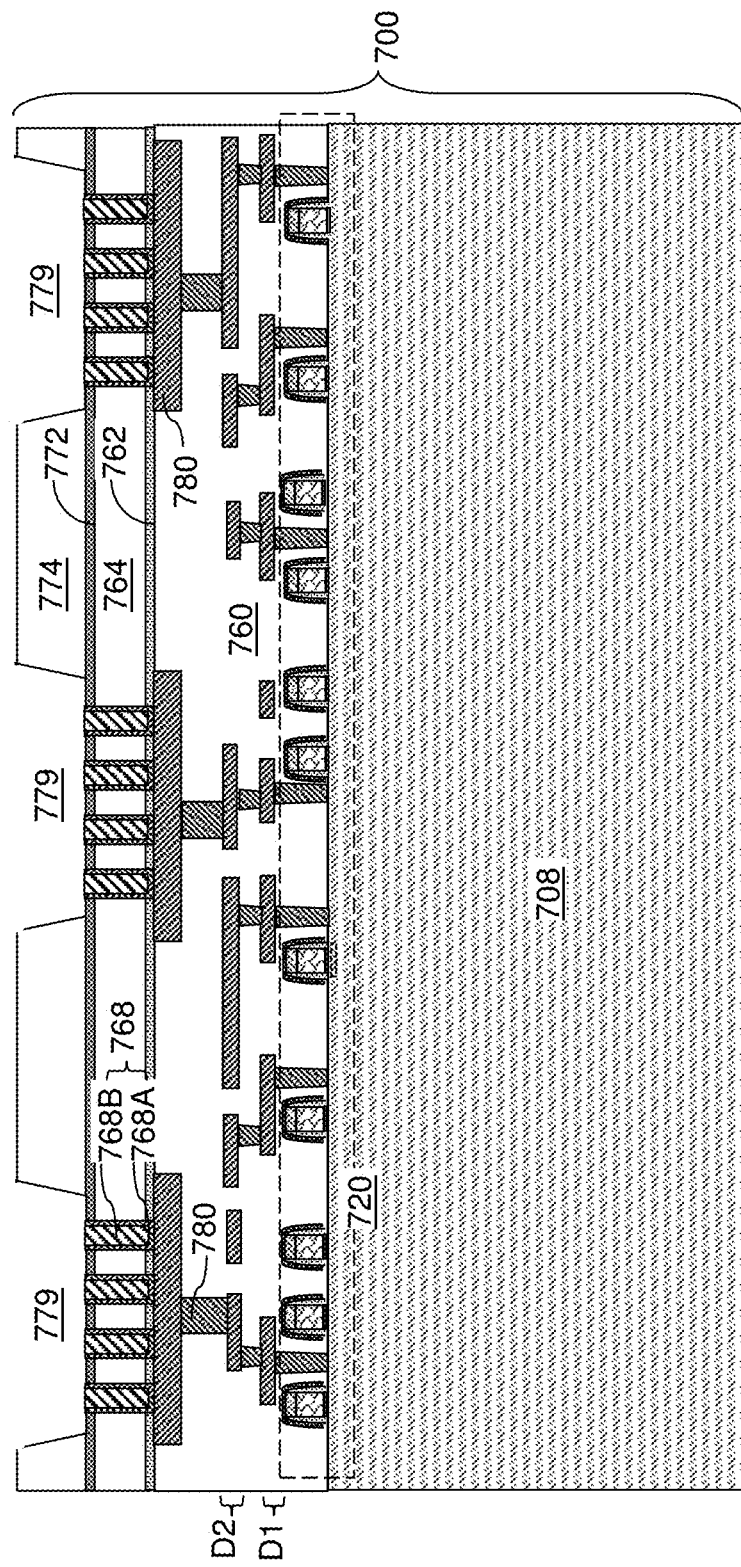
FIG. 10 is a schematic vertical cross-sectional view of a region of the first configuration of the second semiconductor die after formation of a second pad-level dielectric material layer and second pad cavities according to the first embodiment of the present disclosure.

Referring to FIG. 10, a second pad-level dielectric material layer 774 can be formed over the second proximal dielectric diffusion barrier layer 772. The second pad-level dielectric material layer 774 may include, and/or consist essentially of, undoped silicate glass, a doped silicate glass, or organosilicate glass. The thickness of the second pad-level dielectric material layer 774 may be in a range from 300 nm to 3,000 nm, although lesser and greater thicknesses may also be used. The second pad-level dielectric material layer 774 may have a planar top surface.

A photoresist layer (not shown) can be applied over the second pad-level dielectric material layer 774, and can be lithographically patterned to form discrete openings in each area of clusters of second pad-connection via structures 768. In other words, each discrete opening in the photoresist layer overlies a respective cluster of second pad-connection via structures 768. Each discrete opening in the photoresist layer has a shape of a bonding pad to be subsequently formed. For example, each discrete opening in the photoresist layer can have a rectangular shape or a rounded rectangular shape having sides that are parallel to a second horizontal direction hd1 and a second horizontal direction hd2. The dimension of each opening along the second horizontal direction hd1 and the dimension of each opening along the second horizontal direction hd2 are in a range from 2 microns to 60 microns.

An etch process, such as an anisotropic etch process can be performed to transfer the pattern of the openings in the photoresist layer through the second pad-level dielectric material layer 774. Second pad cavities 779 are formed through the second pad-level dielectric material layer 774. Top surfaces of an array of second pad-connection via structures 768 can be physically exposed at the bottom of each second pad cavity 779. Alternatively a top surface of a single pad-connection via structure 768 may be physically exposed at the bottom of each second pad cavity 779. Each pad cavity 779 can have a horizontal cross-sectional shape of a rectangle or a rounded rectangle such that the dimension of each pad cavity 779 along a horizontal direction of a side of the rectangle or the rounded rectangle is in a range from 2 microns to 60 microns. In one embodiment, each pad cavity 779 can have a horizontal cross-sectional shape of a square or a rounded square.

Figure 11:
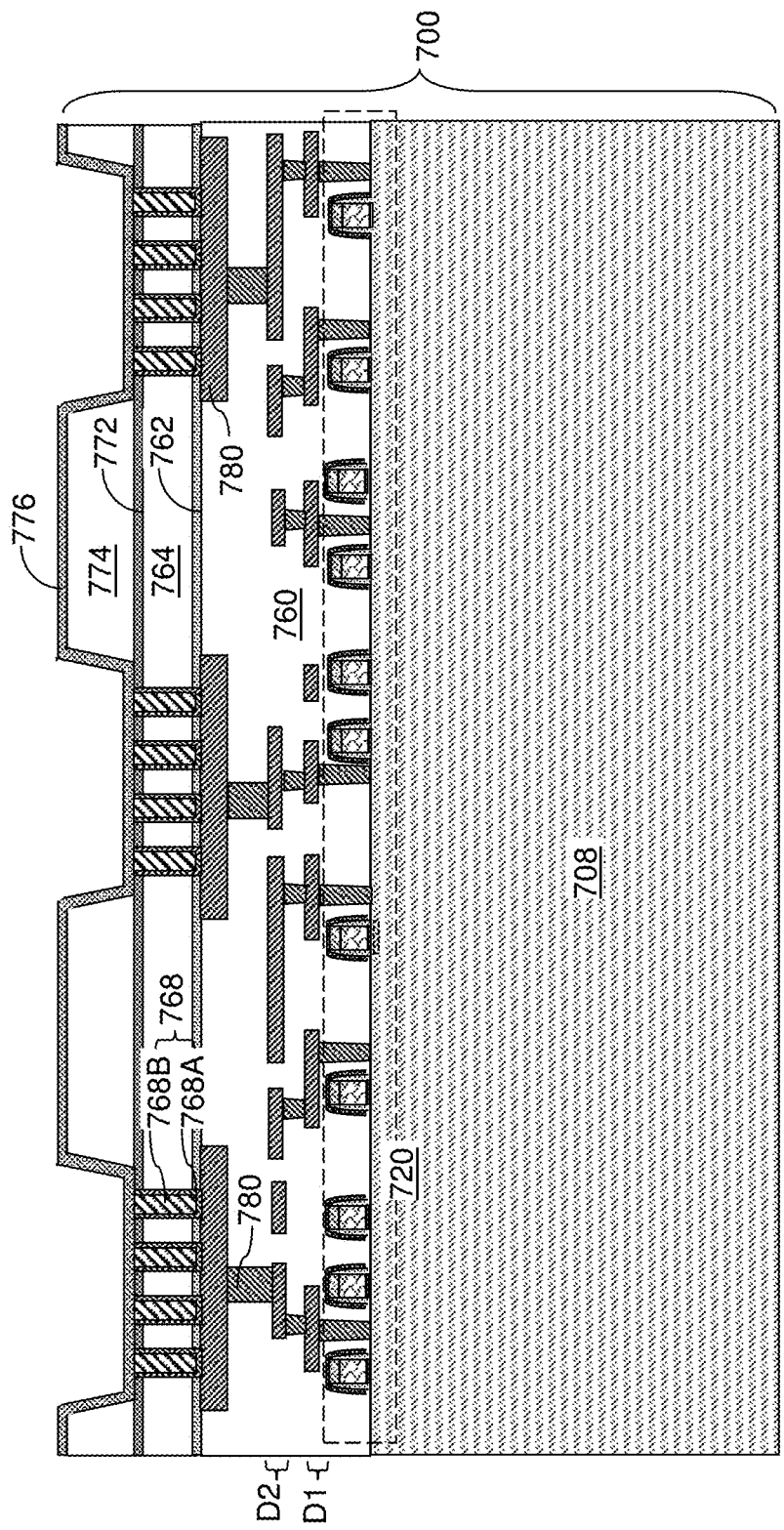
FIG. 11 is a schematic vertical cross-sectional view of a region of the first configuration of the second semiconductor die after formation of a second distal dielectric diffusion barrier layer according to the first embodiment of the present disclosure.

Referring to FIG. 11, a second distal dielectric diffusion barrier layer 776 can be deposited in the second pad cavities 779 and over the second pad-level dielectric material layer 774. The second distal dielectric diffusion barrier layer 776 is deposited on the top surfaces of the second pad-connection via structures 768. The second distal dielectric diffusion barrier layer 776 comprises, and/or consists essentially of, a diffusion blocking dielectric material such as silicon nitride, silicon oxynitride, or a stack thereof. In one embodiment, the second distal dielectric diffusion barrier layer 776 includes a moisture-blocking dielectric material having a dielectric constant greater than 5 (such as silicon nitride having a dielectric constant of 7.9 or silicon oxynitride having a dielectric constant in a range from 5 to 7.9). The thickness of the second distal dielectric diffusion barrier layer 776 can be in a range from 5 nm to 50 nm, such as from 10 nm to 25 nm, although lesser and greater thicknesses can also be used.

Figure 12:
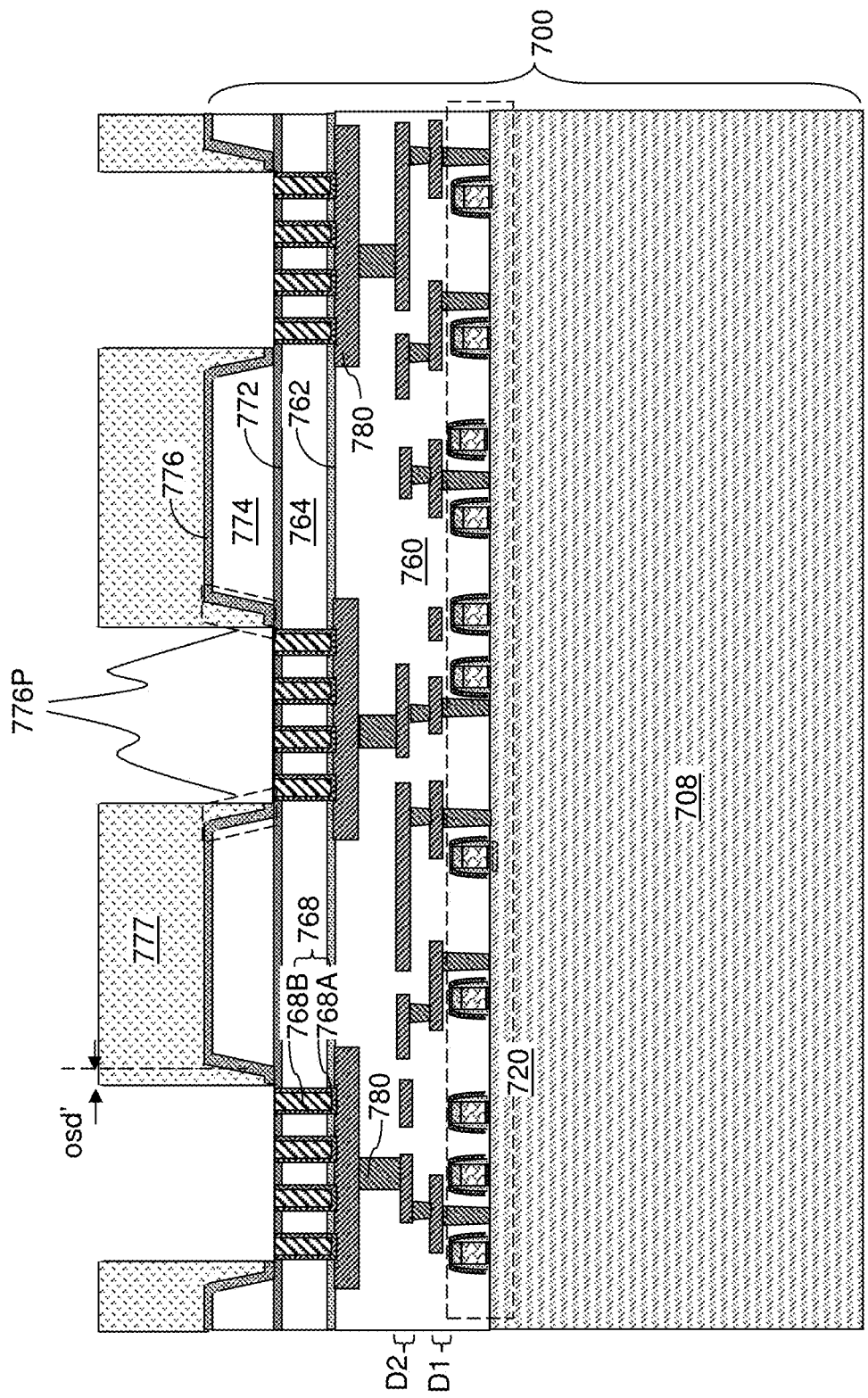
FIG. 12 is a schematic vertical cross-sectional view of a region of the first configuration of the second semiconductor die after patterning the second distal dielectric diffusion barrier layer according to the first embodiment of the present disclosure.

Referring to FIG. 12, a photoresist layer 777 can be applied over the second distal dielectric diffusion barrier layer 776, and can be lithographically patterned to form discrete openings therethrough. Each area of the discrete openings in the photoresist layer 777 can be located inside a bottom periphery of a respective second pad cavity 779, i.e., inside a closed bottom edge of a set of sidewalls of the respective second pad cavity 779 that adjoins the top surface of the second proximal dielectric diffusion barrier layer 772. In other words, openings through the photoresist layer 777 can be formed within areas of bottom surfaces of the second pad cavities 779 by lithographically patterning the photoresist layer 777.

Unmasked portions of the second distal dielectric diffusion barrier layer 776 can be anisotropically etched by performing an anisotropic etch process that employs the patterned photoresist layer 777 as an etch mask. Openings are formed through the second distal dielectric diffusion barrier layer 776 at bottom portions of the second pad cavities 779. Remaining portions of the patterned second distal dielectric diffusion barrier layer 776 comprise second dielectric diffusion barrier portions 776P that laterally surround a respective one of the second pad cavities 779. Top surfaces of the second pad-connection via structures 768 are physically exposed underneath the second pad cavities 779.

Each of the second dielectric diffusion barrier portions 776P of the second distal dielectric diffusion barrier layer 776 that laterally surrounds a respective one of the second pad cavities 779 contacts a top surface of the second proximal dielectric diffusion barrier layer 772. Specifically, each of the second dielectric diffusion barrier portions 776P comprises sidewall segments in contact with the second pad-level dielectric material layer 772 and vertically extending from a bottom surface of the second pad-level dielectric material layer 774 and a top surface of the second pad-level dielectric material layer 774. In one embodiment, the periphery of each opening through second distal dielectric diffusion barrier layer 776 can be laterally offset inward from a bottom periphery of a respective opening through the second pad-level dielectric material layer 774. In this case, each of the second dielectric diffusion barrier portions 776P comprises a horizontal segment having a bottom surface that contacts the second proximal dielectric diffusion barrier layer 772. The bottom surface can comprise an outer periphery that is adjoined to bottom edges of the sidewall segments of a respective second dielectric diffusion barrier portion 776P, and an inner periphery that is laterally offset inward from the outer periphery by an offset distance osd' that is greater than the thickness of the sidewall segments of the second dielectric diffusion barrier portions 776P.

Figure 13:
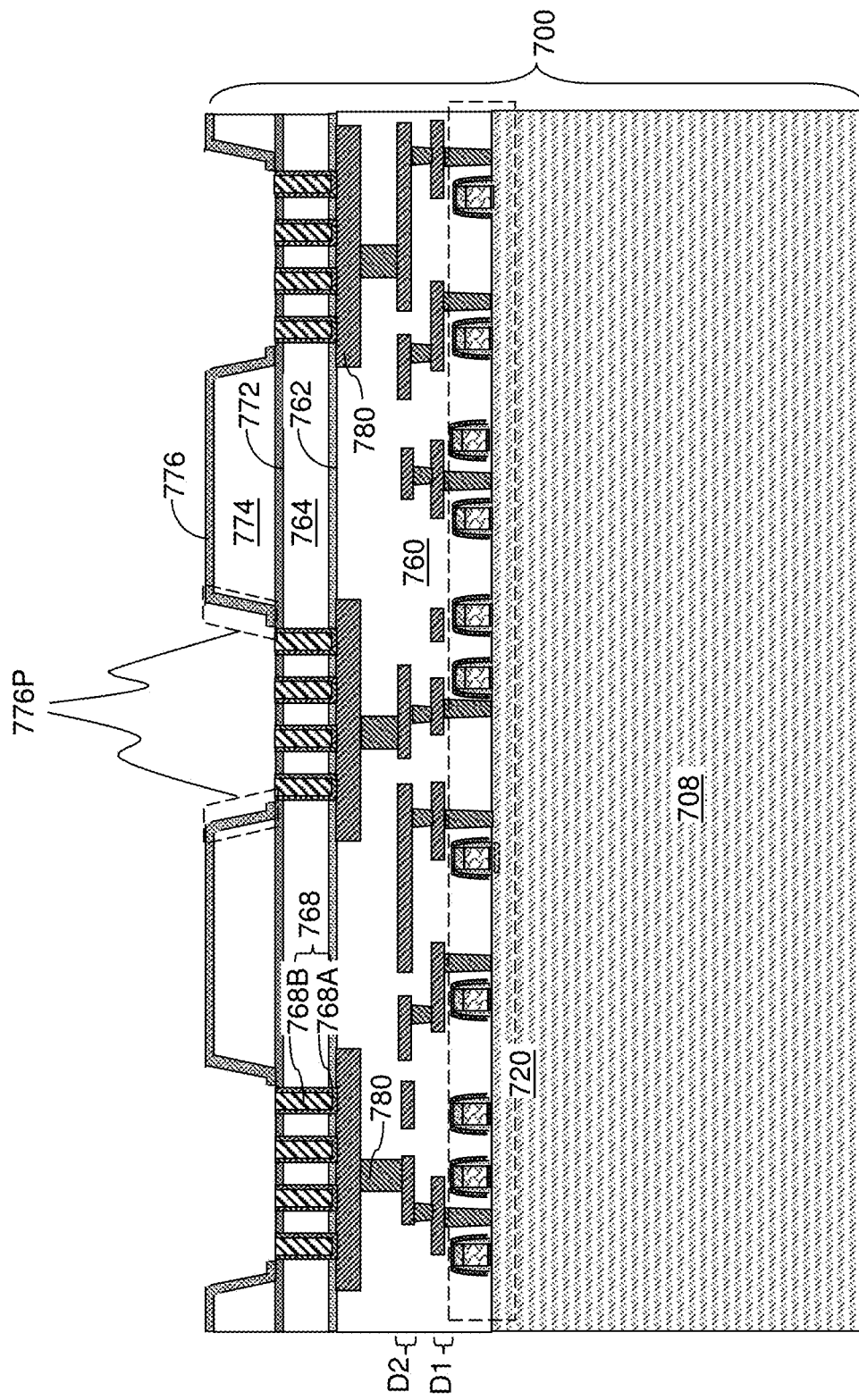
FIG. 13 is a schematic vertical cross-sectional view of a region of the first configuration of the second semiconductor die after removal of a patterned photoresist layer according to the first embodiment of the present disclosure.

Referring to FIG. 13, the patterned photoresist layer 777 can be removed, for example, by ashing.

Figure 14:
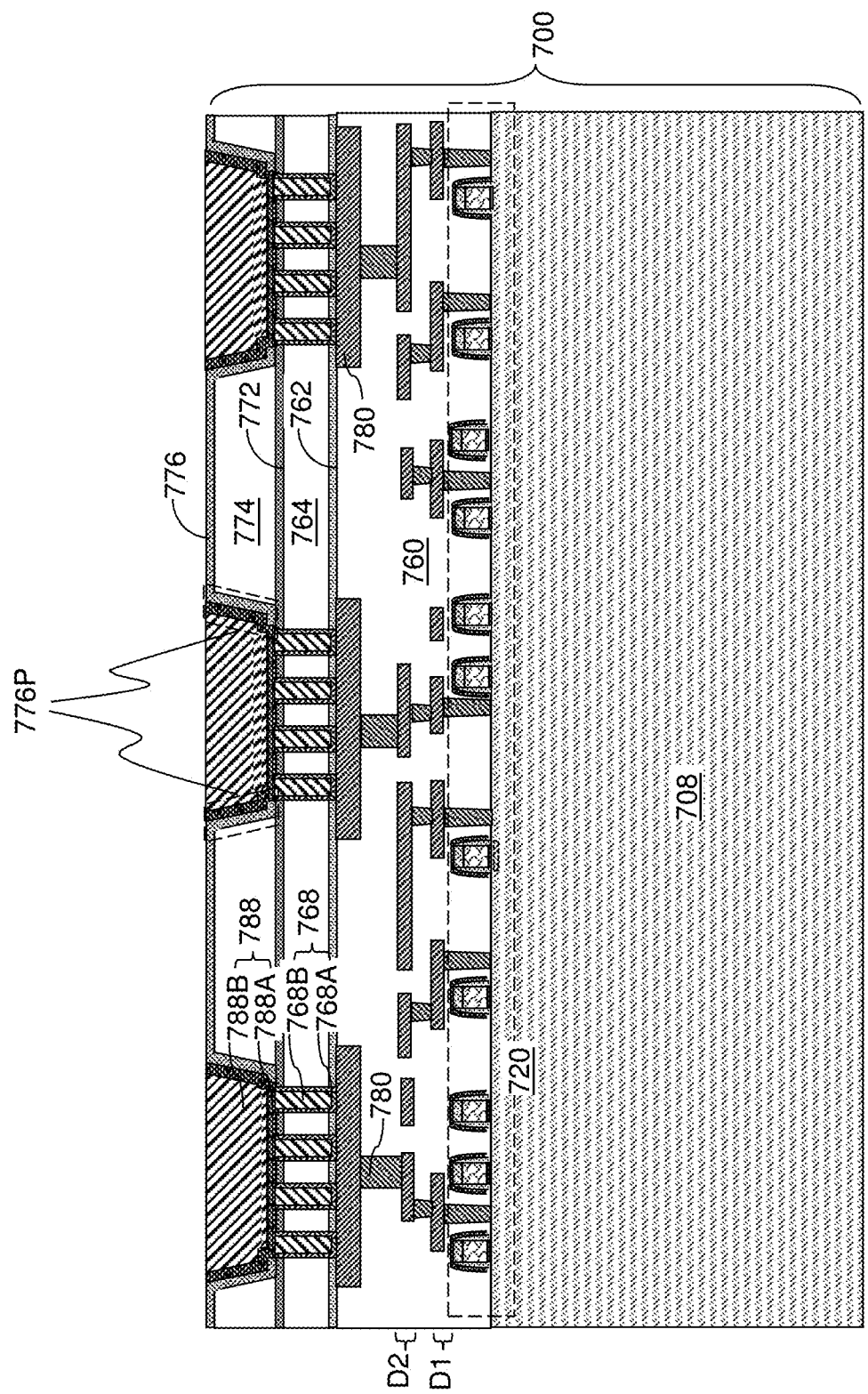
FIG. 14 is a schematic vertical cross-sectional view of a region of the first configuration of the second semiconductor die after formation of second bonding pads according to the first embodiment of the present disclosure.

Referring to FIG. 14, a second bonding pad liner layer and a second metallic pad fill material can be sequentially deposited in the second pad cavities 779. The second bonding pad liner layer includes a metallic nitride material such as TiN, TaN, and/or WN. The conductive metallic barrier material can block diffusion of copper. The second bonding pad liner layer is formed on top surfaces of the second pad-connection via structures 768 and on portions of the top surface of the proximal dielectric diffusion barrier layer 772 within the openings (i.e., within the second pad cavities 779) through the second distal dielectric diffusion barrier layer 776. The thickness of the second bonding pad liner layer may be in a range from 4 nm to 80 nm, such as from 8 nm to 40 nm, although lesser and greater thicknesses can also be used. The second metallic pad fill material can include copper, which may be deposited by a combination of a copper seed layer deposition process employing physical vapor deposition and a copper electroplating process that fills remaining volumes of the second pad cavities 779.

Excess portions of the second metallic pad fill material and the second bonding pad liner layer overlying the horizontal plane including the top surface of the second distal dielectric diffusion barrier layer 776 can be removed by a planarization process such as chemical mechanical planarization. Remaining portions of the second metallic pad fill material and the second bonding pad liner layer that fill the second pad cavities 779 constitute second bonding pads 788. Each second bonding pad 788 can include a second bonding pad liner 788A and a second metallic pad fill material portion 788B. The second bonding pad liner 788A is a patterned remaining portion of the second bonding pad liner layer, and the second metallic pad fill material portion 788B is a patterned remaining portion of the second metallic pad fill material. Top surfaces of the second bonding pads 788 can be within a same horizontal plane as the top surface of the second pad-level dielectric material layer 774.

Generally, the second bonding pads 788 are formed in remaining volumes of the second pad cavities 779 after patterning the second distal dielectric diffusion barrier layer 776 directly on the top surfaces of the second pad-connection via structures 766. Each of the second bonding pads 788 comprises, and/or consists of, a second bonding pad liner 788A comprising a metallic nitride material, and a second metallic pad fill material portion 788B embedded in the second bonding pad liner 788A.

In one embodiment, the second dielectric diffusion barrier portions 776P are interconnected with each other through a second horizontally extending diffusion barrier portion that overlie the second pad-level dielectric material layer 774. Top surfaces of the second bonding pads 788 can be located within the horizontal plane including the top surface of the second horizontally extending diffusion barrier portion of the second distal dielectric diffusion barrier layer 776.

In one embodiment, each second bonding pad 788 can physically and electrically contact a respective underlying subset of the second pad-connection via structures 768, which may be a respective plurality of second pad-connection via structures 768. Each of the second bonding pads 788 can directly contact a portion of a top surface of the second proximal dielectric diffusion barrier layer 772 located among the respective plurality of second pad-connection via structures 768. Generally, the second pad-level dielectric material layer 774 includes second pad cavities that are filled with a respective combination of a second bonding pad 788 and a respective second dielectric diffusion barrier portion 776P.

A first subset of the second bonding pads 788 can be located within the areas surrounded by the at least one edge seal structure in the second semiconductor die 700, and can be electrically connected to a respective node of the second semiconductor devices 720. A second subset of the second bonding pads 788 can be located on, and can be electrically connected to, a respective one of the at least one edge seal structure. The pattern of the second bonding pads 788 can be arranged in a mirror image pattern of the pattern of the first bonding pads 988.

Figure 15:
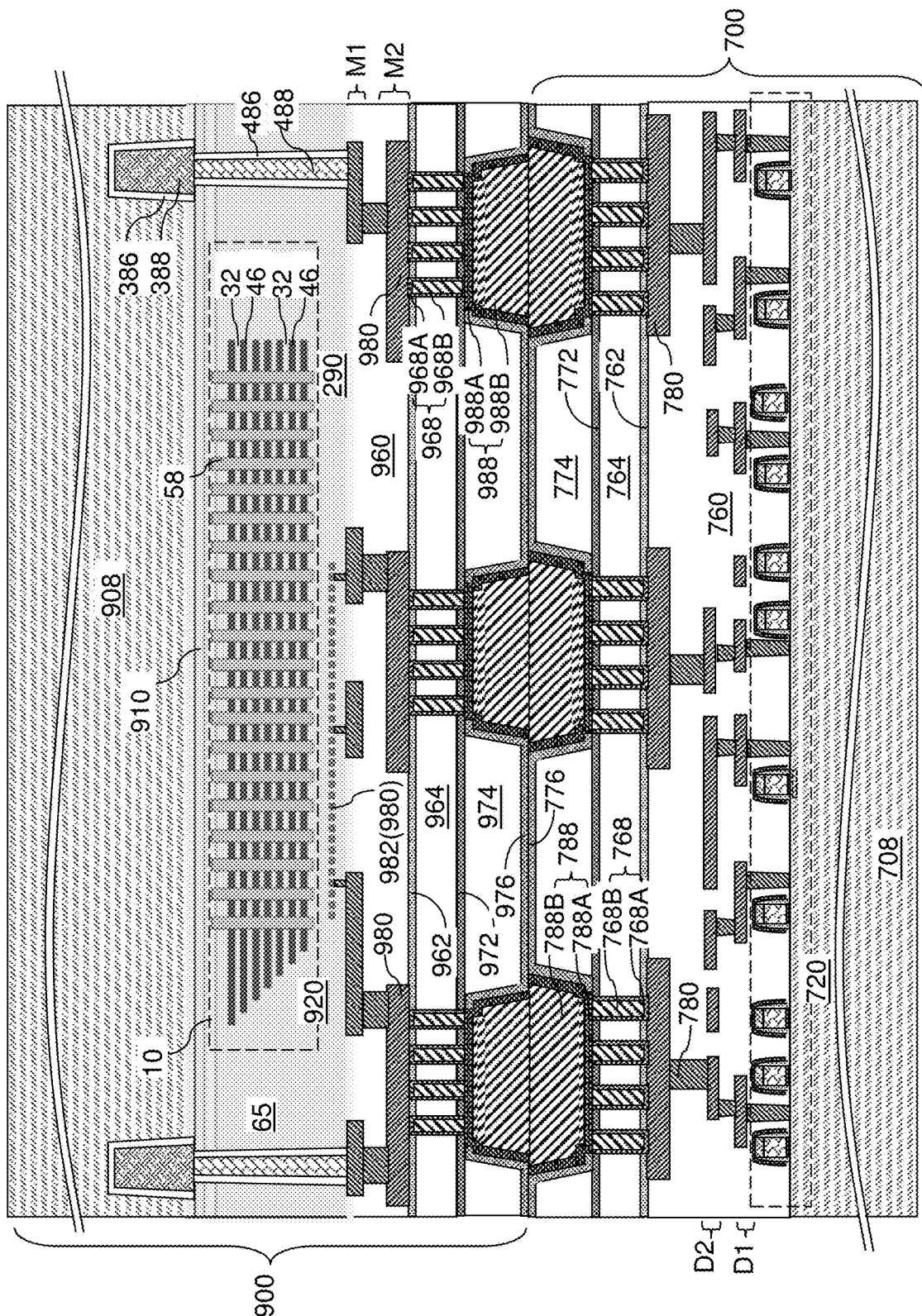
FIG. 15 is a schematic vertical cross-sectional view of a first exemplary bonded structure after bonding the first configuration of the first semiconductor die to the first configuration of the second semiconductor die according to the first embodiment of the present disclosure.

Referring to FIG. 15, the second semiconductor die 700 and the first semiconductor die 700 can be aligned such that each second bonding pad 788 faces a respective one of the first bonding pads 988. Each facing pair of a first bonding pad 988 and a second bonding pad 788 can be aligned to maximize the areal overlap between the first bonding pads 988 and the second bonding pads 788. If the first bonding pads 988 and the second bonding pads 788 have different areas, each overlap area between a facing pair of a first bonding pad 988 and a second bonding pad 788 can be the same as the area of the smaller bonding pad between the facing pair of the first bonding pad 988 and the second bonding pad 788. If the first bonding pads 988 and the second bonding pads 788 have the same area, the overlap area between a facing pair of a first bonding pad 988 and a second bonding pad 788 can be in a range from 90% to 100%, such as from 95% to 100%, of the area of the first bonding pad 988 (which is the same as the area of the second bonding pad 788).

The first semiconductor die 900 and the second semiconductor die 700 can be brought into contact each other so that each first bonding pad 988 contacts a respective one of the second bonding pads 788 with a respective areal overlap therebetween. The assembly of the first semiconductor die 900 and the second semiconductor die 700 are annealed at an elevated temperature in a range from 250 degrees Celsius to 400 degrees Celsius to induce copper diffusion across each interface between facing pairs of a respective first bonding pad 988 and a respective second bonding pad 788. The duration of the anneal process at the elevated temperature can be in a range from 5 minutes to 2 hours, although shorter or longer anneal duration may also be used. Each facing pair of a first bonding pad 988 and a second bonding pad 788 is bonded to each other during the anneal process at the elevated temperature. A first exemplary bonded structure including the first semiconductor die 900 and the second semiconductor die 700 can be formed.

A layer stack including a horizontally extending portion of the first distal dielectric diffusion barrier layer 976 and a horizontally extending portion of the second distal dielectric diffusion barrier layer 776 can be located between the first pad-level dielectric material layer 974 and the second pad-level dielectric material layer 774. The vertical separation distance between the first pad-level dielectric material layer 974 and the second pad-level dielectric material layer 774 can be the sum of the thickness of the first distal dielectric diffusion barrier layer 976 and the thickness of the second distal dielectric diffusion barrier layer 776.

Figure 16:
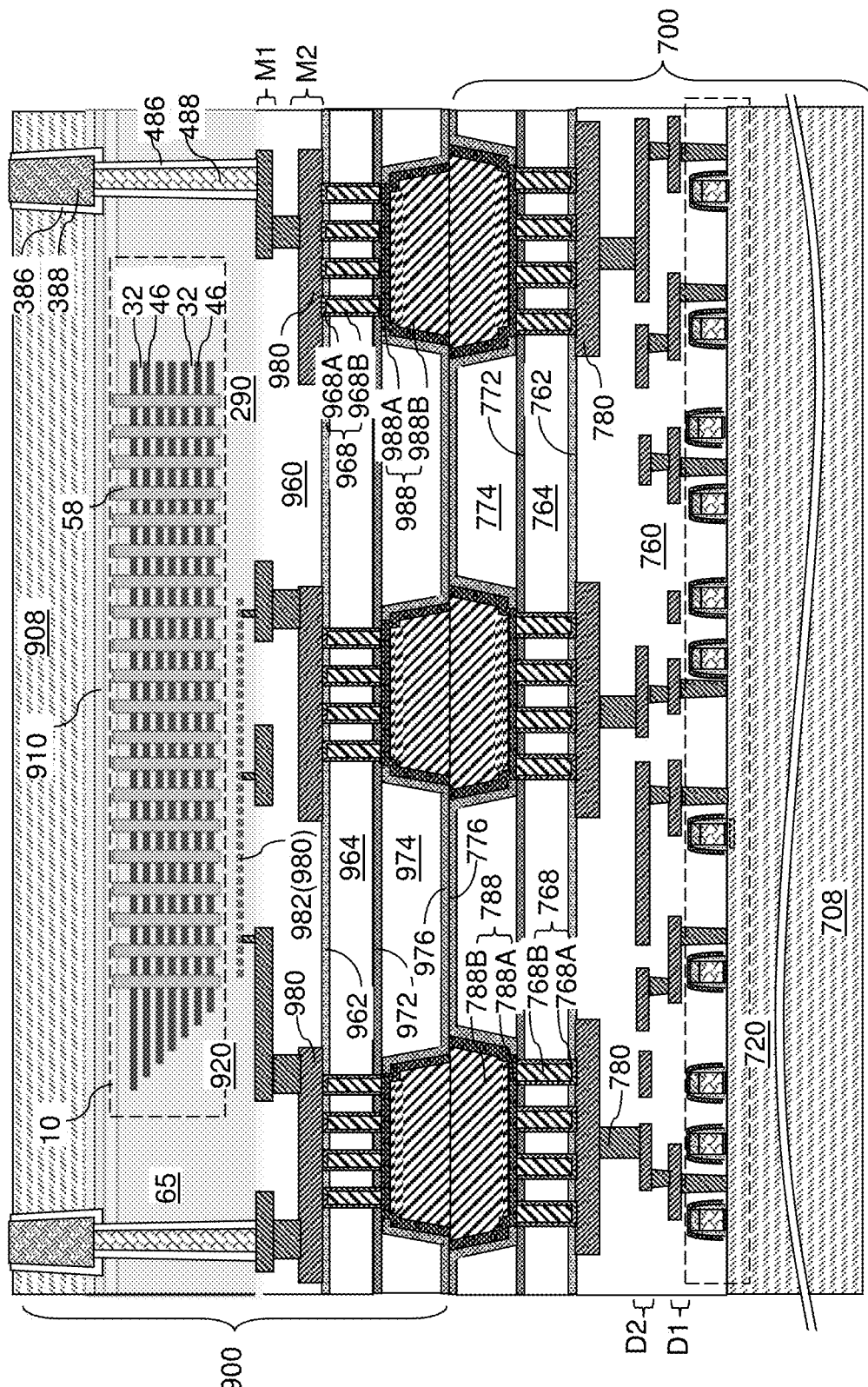
FIG. 16 is a schematic vertical cross-sectional view of the first exemplary bonded structure after thinning the first semiconductor die from the backside according to the first embodiment of the present disclosure.

Referring to FIG. 16, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be used.

Figure 17:
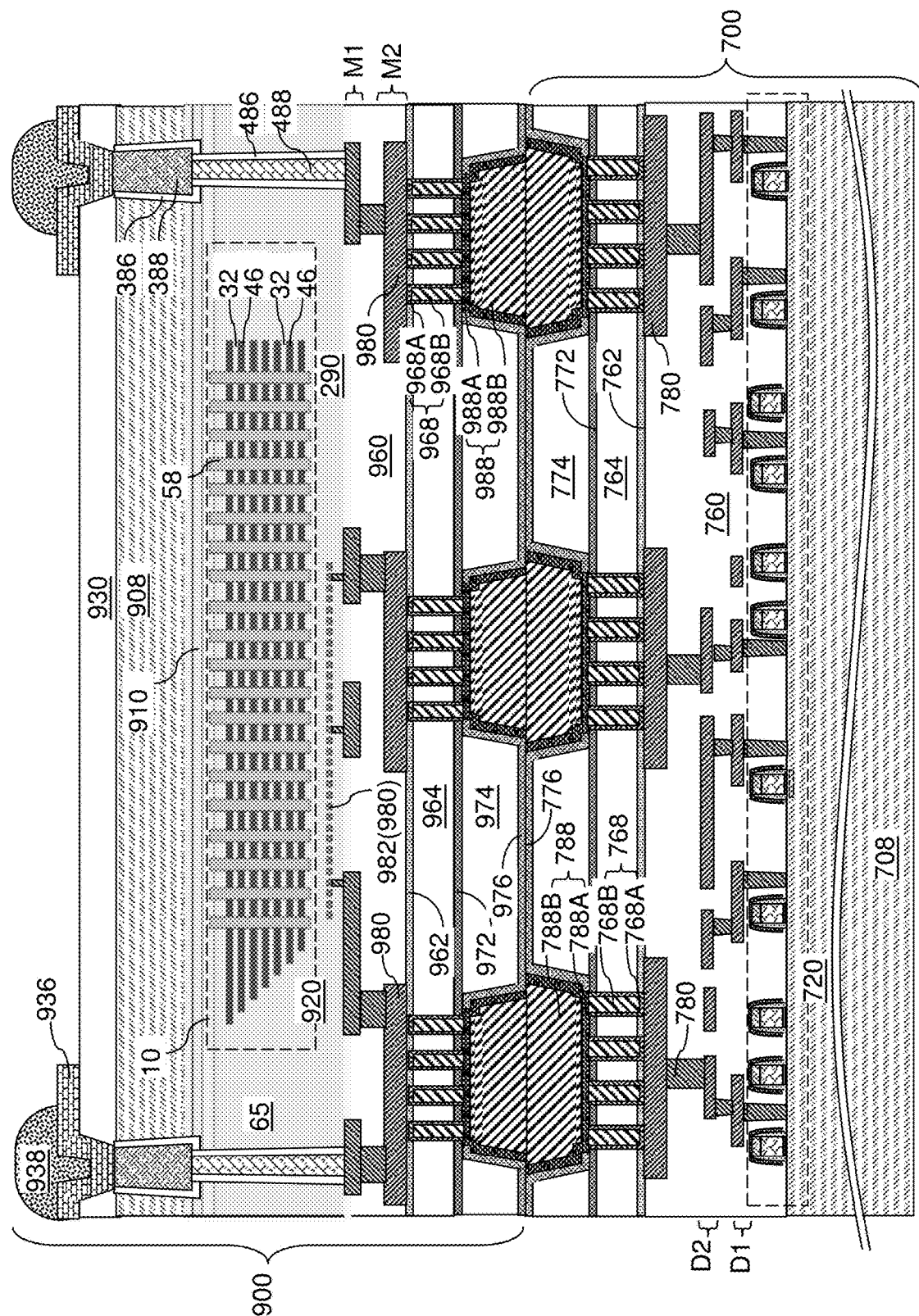
FIG. 17 is a schematic vertical cross-sectional view of the first exemplary bonded structure after formation of a backside insulating layer, external bonding pads, and solder material portions according to the first embodiment of the present disclosure.

Referring to FIG. 17, a backside insulating layer 930 may be formed on the backside of the first substrate 908. The backside insulating layer 930 includes an insulating material such as silicon oxide. The thickness of the backside insulating layer 930 can be in a range from 50 nm to 500 nm, although lesser and greater thicknesses can also be used. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be used. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be used.

The at least one metallic fill material and the metallic material layer can be subsequently patterned to form discrete backside bonding pads 936 contacting a respective one of the through-substrate via structures 388. The backside bonding pads 936 can function as external bonding pads that can be used to electrically connect various nodes of within the first semiconductor die 900 and the second semiconductor die 700 to external nodes, such as bonding pads on a packaging substrate or C4 bonding pads of another semiconductor die. For example, solder material portions 938 can be formed on the backside bonding pads 936, and a C4 bonding process or a wire bonding process can be performed to electrically connect the backside bonding pads 936 to external electrically active nodes.

Generally, backside bonding pads 936 can be formed on a backside surface of the first semiconductor die 900 (which may be a memory die) that is located on an opposite side of the bonding interface between the first semiconductor die 900 and the second semiconductor die 700. Through-substrate via structures 388 can vertically extend through the first semiconductor die 900, and can provide electrical connection between the backside bonding pads 936 and a subset of the bonding pads (988, 788).

Figure 18:
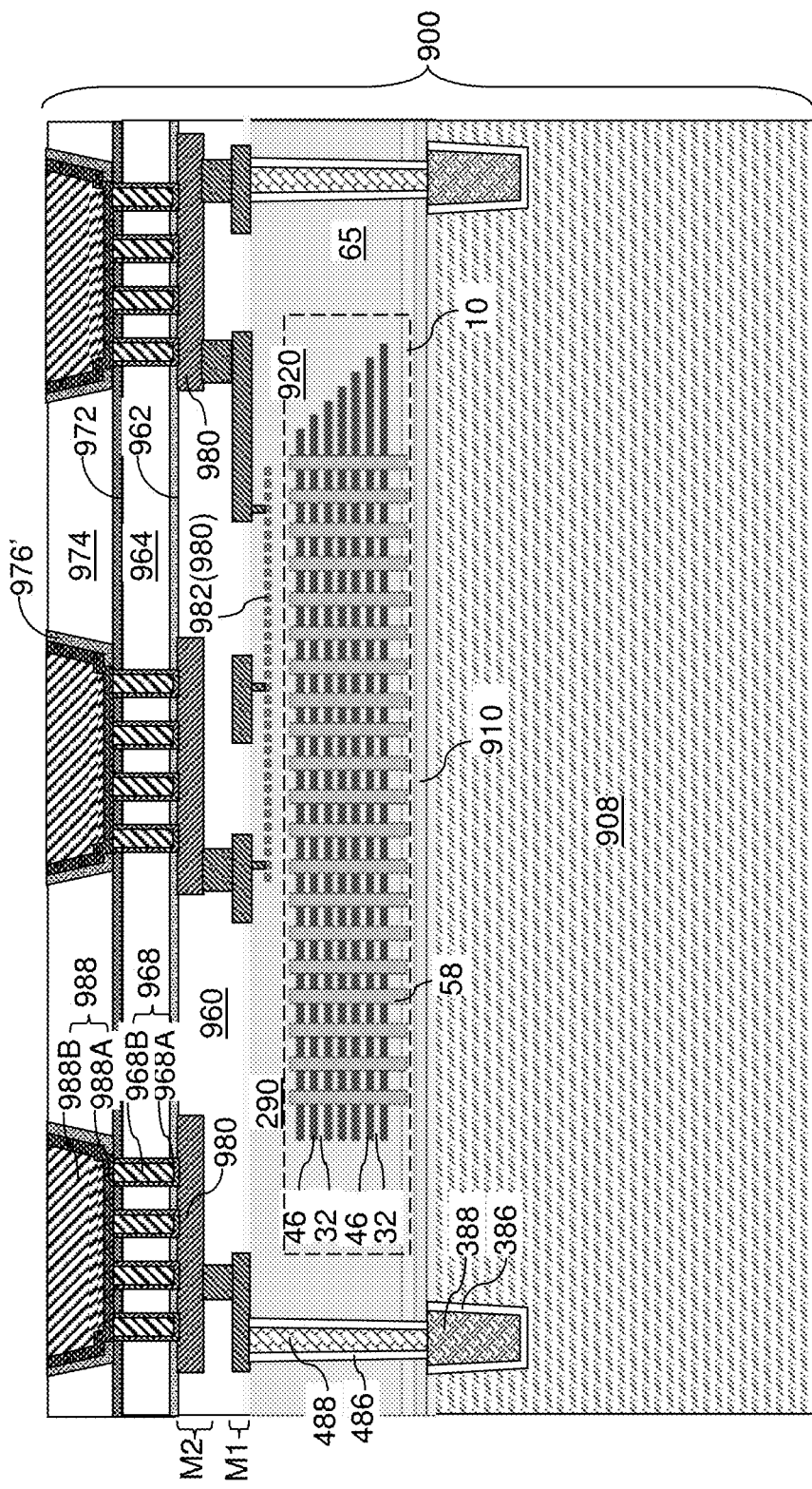
FIG. 18 is a schematic vertical cross-sectional view of an alternative embodiment of the first semiconductor die according to the first embodiment of the present disclosure.

Referring to FIG. 18, an alternative embodiment of the first semiconductor die 900 according to the first embodiment of the present disclosure is illustrated. The alternative embodiment of the first semiconductor die 900 can be derived from the first semiconductor die 900 of FIGS. 8A and 8B by removing the horizontally extending portion of the first distal dielectric diffusion barrier layer 976 that overlies the first pad-level dielectric material layer 974. For example, the horizontally extending portion of the first distal dielectric diffusion barrier layer 976 overlying the first pad-level dielectric material layer 974 can be removed by an additional polishing step of the chemical mechanical planarization process after removal of the metallic materials from above the top surface of the first distal dielectric diffusion barrier layer 976. In this case, the top surface of the first pad-level dielectric material layer 974 can be physically exposed after the planarization process, and the top surfaces of the first bonding pads 988 can be formed within the same horizontal plane as the top surface of the first pad-level dielectric material layer 974. Upon removal of the horizontally extending portion of the first distal dielectric diffusion barrier layer 976, the remaining portions of the first distal dielectric diffusion barrier layer 976 include first dielectric diffusion barrier portions 976'. The first dielectric diffusion barrier portions 976' are not interconnected among one another, and are formed as discrete structures laterally surrounding a respective first bonding pad 988.

Figure 19:
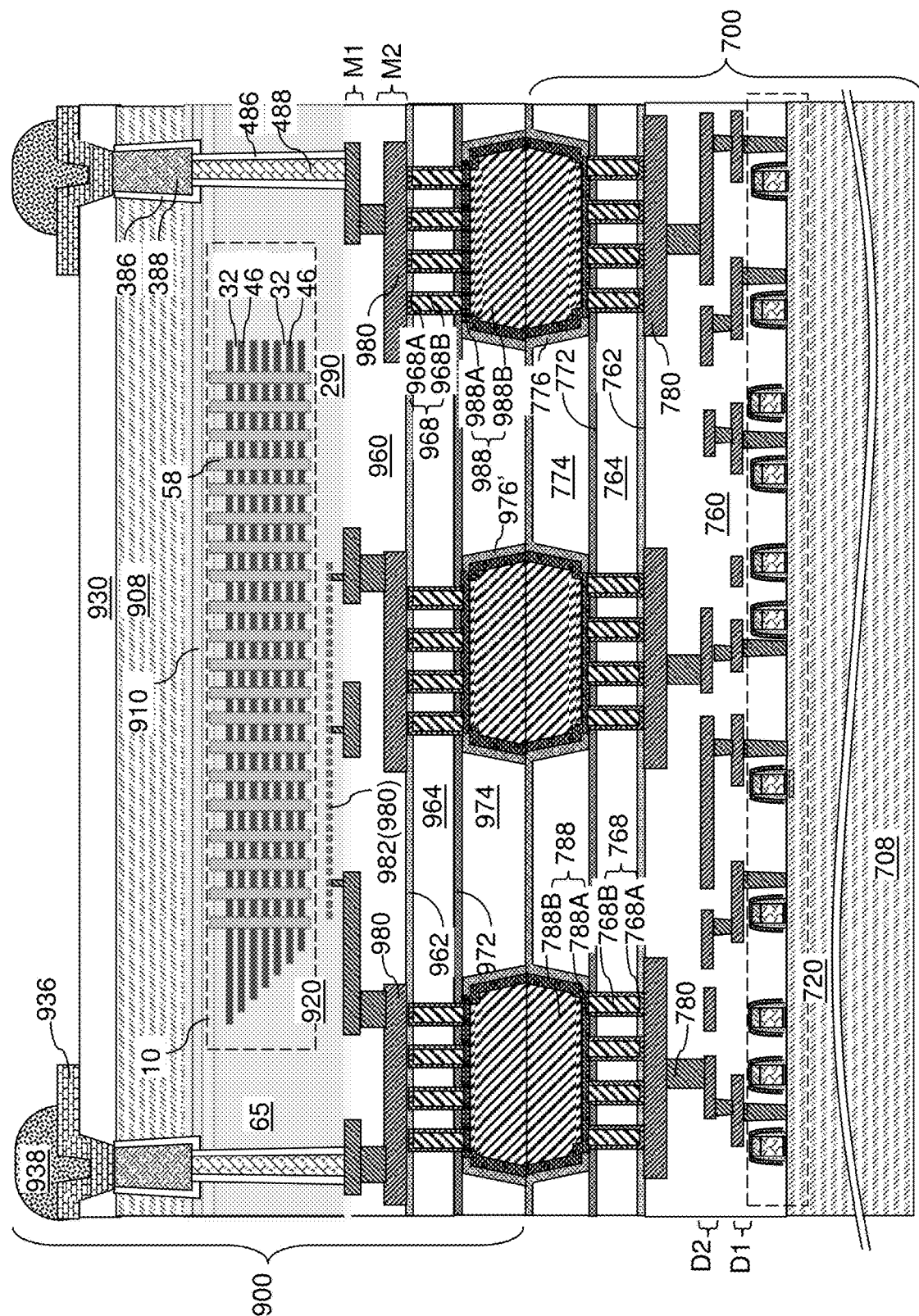
FIG. 19 is a schematic vertical cross-sectional view of an alternative embodiment of the first exemplary bonded structure according to the first embodiment of the present disclosure.
Figure 20E:
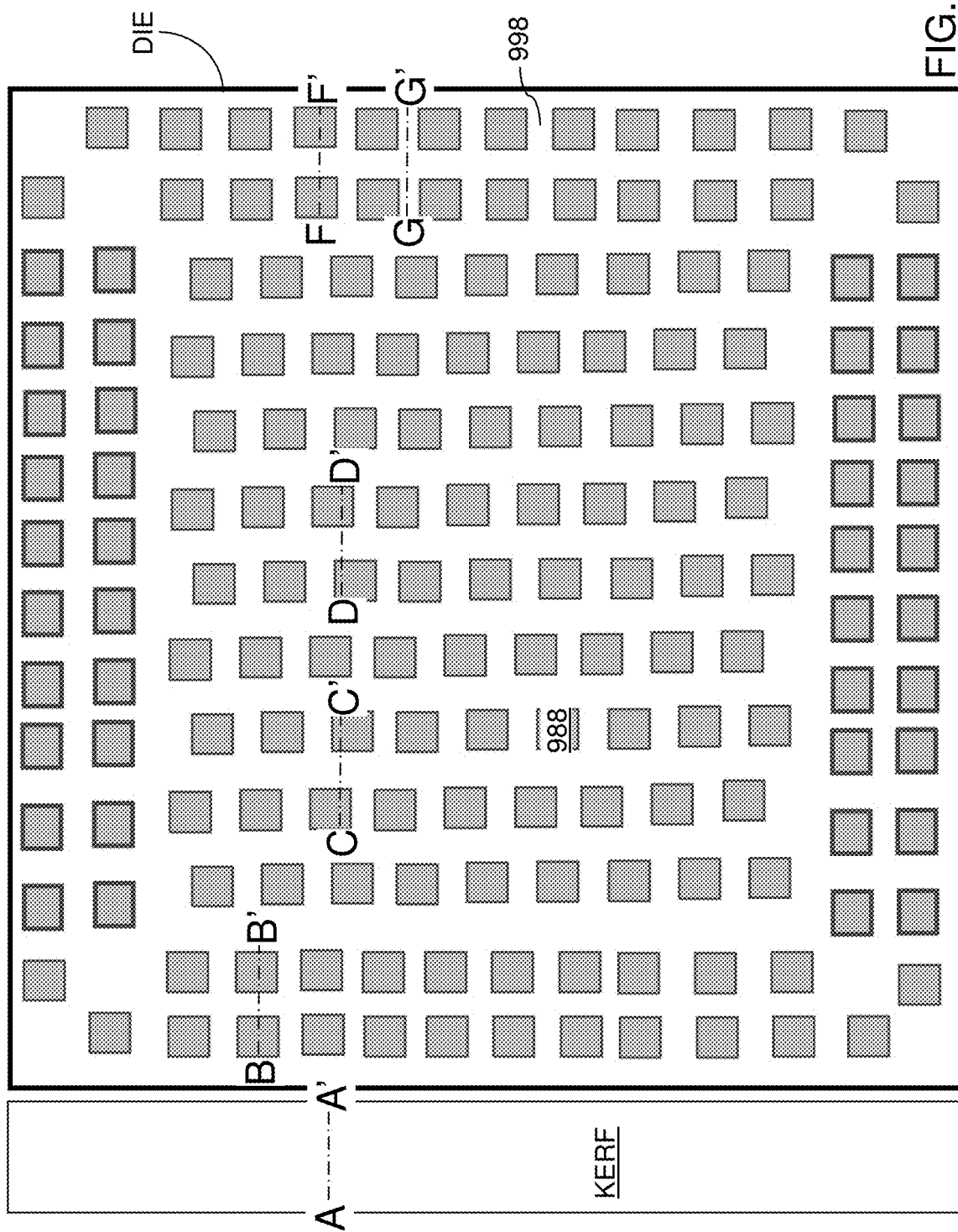
FIG. 20E is a see-through plan view of the first exemplary bonded assembly illustrated in FIGS. 20A-20D.

Referring to FIG. 19, a second semiconductor die 700 can be provided in the same manner as described above, and can be bonded with the alternative configuration of the first semiconductor die illustrated in FIG. 18 to provide an alternative embodiment of the first bonded assembly. The processing steps of FIGS. 16 and 17 can be performed the structure illustrated in FIG. 19. In this case, a horizontally extending portion of the second distal dielectric diffusion barrier layer 776 can be located between the first pad-level dielectric material layer 974 and the second pad-level dielectric material layer 774. The vertical separation distance between the first pad-level dielectric material layer 974 and the second pad-level dielectric material layer 774 can be the same as the thickness of the second distal dielectric diffusion barrier layer 776. The first dielectric diffusion barrier portions 976' are discrete material portions that are laterally spaced among one another by the first pad-level dielectric material layer 974. Top surfaces of the first bonding pads 988 can be located within the horizontal plane including the top surface of the first pad-level dielectric material layer 974.

In another alterative embodiment of the first semiconductor die 900 according to the first embodiment of the present disclosure, the horizontally extending portion of the second distal dielectric diffusion barrier layer 776 that overlies the second pad-level dielectric material layer 774 may be removed. In this alternative embodiment, the vertical separation distance between the first pad-level dielectric material layer 974 and the second pad-level dielectric material layer 774 can be the same as the thickness of the first distal dielectric diffusion barrier layer 976 which is provided between the first pad-level dielectric material layer 974 and the second pad-level dielectric material layer 774.

Referring to FIGS. 20A-20G, a second alternative embodiment of the first exemplary bonded assembly is illustrated. In this case, the horizontal semiconductor channel layer 10 and the optional dielectric spacer layer 910 may be omitted from the first semiconductor die 900 illustrated in FIG. 17, and a three-dimensional array of memory elements may be formed directly on the first substrate 908. The first semiconductor die 900 may include backside metallic material plates 906, which may be used as an electrically conductive path for a subset of the through-memory-level via structure 488. The backside metallic material plates 906 can be embedded in a backside insulating layer 930, which may include a first backside insulating sublayer 930A, a second backside insulating sublayer 930B, and a third backside insulating sublayer 930C. For example, the first backside insulating sublayer 930A can include silicon oxide, the second backside insulating sublayer 930B can include silicon oxide, and the third backside insulating sublayer 930C can include polyimide. The backside metallic material plates 906 may be formed between the first backside insulating sublayer 930A and the second backside insulating sublayer 930B.

Dielectric diffusion barrier layers 952 can be embedded within the first distal interconnect-level dielectric material layers 960. In one embodiment, the dielectric diffusion barrier layer 952 can include a copper blocking dielectric material having a dielectric constant less than 5, such as less than 4, such as silicon carbon nitride having a dielectric constant of about 3.8. Further, additional dielectric diffusion barrier layers 752 can be embedded within the second interconnect-level dielectric material layers 760. In one embodiment, the additional dielectric diffusion barrier layer 752 can include a copper blocking dielectric material having a dielectric constant less than 5, such as less than 4, such as silicon carbon nitride having a dielectric constant of about 3.8.

The combination of the first proximal dielectric diffusion barrier layer 972, the first distal dielectric diffusion barrier layer 976, the second proximal dielectric diffusion barrier layer 772, and the second distal dielectric diffusion barrier layer 776 forms a continuous diffusion barrier structure that protects the first metal interconnect structures 980 embedded in the first distal interconnect-level dielectric material layers 960 and protects the second metal interconnect structures 780 embedded in the second interconnect-level dielectric material layers 760 from diffusion of moisture and/or contaminants through the first pad-level dielectric material layer 974 or the second pad-level dielectric material layer 774. Further, the combination of the first proximal dielectric diffusion barrier layer 972, the first distal dielectric diffusion barrier layer 976, and the pad-connection-via-level metallic barrier liner 968A forms a continuous diffusion barrier structure that protects the first metal interconnect structures 980 embedded in the first distal interconnect-level dielectric material layers 960 from diffusion of moisture and/or contaminants through the first pad-connection-via-level dielectric material layer 964. The combination of the second proximal dielectric diffusion barrier layer 772, the second distal dielectric diffusion barrier layer 776, and the pad-connection-via-level metallic barrier liner 768A forms a continuous diffusion barrier structure that protects the second metal interconnect structures 780 embedded in the second interconnect-level dielectric material layers 760 from diffusion of moisture and/or contaminants through the second pad-connection-via-level dielectric material layer 764. Furthermore, if the opposing copper bonding pads of the first and the second semiconductor die are misaligned with each other, then at least one of the first and second distal dielectric diffusion barrier layers (976, 776) blocks copper from diffusing out of the edge of the misaligned copper bonding pad into the opposing first or second pad-level dielectric material layer (974, 774). This reduces void formation in the bonding pads and possible delamination of the bonded assembly.

Referring to FIGS. 21A and 21B, alternative embodiments of the first exemplary bonded assembly are illustrated. In the embodiment illustrated in FIG. 21A, the edge seal structures of the first semiconductor die 900 that include the first metallic wall structures 688 are electrically grounded to the second substrate 708 of the second semiconductor die 700 through edge seal structures of the second semiconductor die 700 that include second metallic wall structures 388. In the embodiment illustrated in FIG. 21B, the edge seal structures of the first semiconductor die 900 that include the first metallic wall structures 688 and the edge seal structures of the second semiconductor die 700 that include second metallic wall structures 388 are electrically grounded to an external electrical ground through a backside metallic material plate 906 that includes a stack of a metallic plate liner 906A and a metallic fill material portion 906B. The backside metallic material plate 906 can be formed through an opening in the backside insulating layer 930.

Referring to FIGS. 1A-21B and according to various embodiments of the present disclosure, a structure includes a first semiconductor die 900. The first semiconductor die 900 comprises: first semiconductor devices 920 located over a first substrate 908; first interconnect-level dielectric material layers (290, 960) embedding first metal interconnect structures 980 that are electrically connected to the first semiconductor devices 920 and overlie the first semiconductor devices 920 (i.e., the first metal interconnect structures 980 are located on the opposite side of the first substrate 908 from the first semiconductor devices 920); a layer stack of a first pad-connection-via-level dielectric material layer 964 and a first proximal dielectric diffusion barrier layer 972 overlying the first interconnect-level dielectric material layers (290, 960) and embedding first pad-connection via structures 968; and a first pad-level dielectric material layer 974 including first pad cavities that are filled with a respective combination of a first bonding pad 988 and a respective first dielectric diffusion barrier portion (976P or 976'), wherein each of the first bonding pads 988 contacts a respective subset of the first pad-connection via structures 968.

In one embodiment, each of the first dielectric diffusion barrier portions (976P or 976') contacts a top surface of the first proximal dielectric diffusion barrier layer 972. In one embodiment, each of the first dielectric diffusion barrier portions (976P or 976') comprises sidewall segments in contact with the first pad-level dielectric material layer 974 and extending from a bottom surface of the first pad-level dielectric material layer 974 to a top surface of the first pad-level dielectric material layer 974. In one embodiment, each of the first dielectric diffusion barrier portions (976P or 976') further comprises a horizontal segment having a bottom surface that contacts the first proximal dielectric diffusion barrier layer 972, wherein the bottom surface comprises an outer periphery that is adjoined to bottom edges of the sidewall segments and an inner periphery that is laterally offset inward from the outer periphery by an offset distance osd that is greater than a thickness of the sidewall segments of the first dielectric diffusion barrier portions (976P or 976').

In one embodiment, the respective subset of the first pad-connection via structures 968 comprises a plurality of first pad-connection via structures 968; and each of the first bonding pads 988 directly contacts a portion of a top surface of the first proximal dielectric diffusion barrier layer 972 located between the plurality of first pad-connection via structures 968. In one embodiment, top surfaces of the first pad-connection via structures 968 are within a same horizontal plane as a top surface of the first proximal dielectric diffusion barrier layer 972.

In one embodiment, each of the first bonding pads 988 comprises: a first bonding pad liner 988A comprising a metallic nitride material; and a copper containing first metallic pad fill material portion 988B embedded in the bonding pad liner 988A. In one embodiment, the first dielectric diffusion barrier portions 976P are interconnected with each other through a first horizontally extending diffusion barrier portion (i.e., a horizontally extending portion of a first distal dielectric diffusion barrier layer 976) that overlies the first pad-level dielectric material layer 974; and top surfaces of the first bonding pads 988 are located within a horizontal plane including a top surface of the first horizontally extending diffusion barrier portion. In another embodiment, the first dielectric diffusion barrier portions 976' are discrete material portions that are laterally spaced from each other by the first pad-level dielectric material layer 974; and top surfaces of the first bonding pads 988 are located within a horizontal plane including a top surface of the first pad-level dielectric material layer 974.

In one embodiment, the first dielectric diffusion barrier portions (976P or 976') comprise a dielectric material selected from silicon nitride, silicon oxynitride, or a stack thereof; and the first proximal dielectric diffusion barrier layer 972 comprises a dielectric material selected from silicon nitride, silicon oxynitride, or silicon carbon nitride.

In one embodiment, the structure comprises a second semiconductor die 700 comprising: second semiconductor devices 720 located over a second substrate 708; second interconnect-level dielectric material layers 760 embedding second metal interconnect structures 780 that are electrically connected to the second semiconductor devices 720 and overlie the second semiconductor devices 720; and second bonding pads 788 that are electrically connected to the second metal interconnect structures 780 and bonded to a respective one of the first bonding pads 988. In one embodiment, each of the second bonding pads 788 contacts, and is laterally surrounded by, a respective second dielectric diffusion barrier portion 776P; and the second bonding pads 788 and the second dielectric diffusion barrier portions 776P are embedded in a second pad-level dielectric material layer 774. In one embodiment, the second semiconductor die 700 comprises a layer stack of a second pad-connection-via-level dielectric material layer 764 and a second proximal dielectric diffusion barrier layer 772 located between the second interconnect-level dielectric material layers 760 and the second pad-level dielectric material layer 774 and embedding second pad-connection via structures 768, wherein each of the second bonding pads 788 contacts a respective subset of the second pad-connection via structures 768.

In one embodiment, the first semiconductor die 900 comprises: an additional planar diffusion barrier layer 962 (such as a first interconnect-capping dielectric diffusion barrier layer 962) located between the first interconnect-level dielectric material layers (290, 960) and the first pad-connection-via-level dielectric material layer 964; and at least one edge seal structure (688, 984, 986) comprising a respective subset of the first metal interconnect structures 980 that provides a respective continuous barrier laterally surrounding the first semiconductor devices 920 without any lateral opening and vertically extending from the first substrate 908 to the additional planar diffusion barrier layer.

Figure 22:
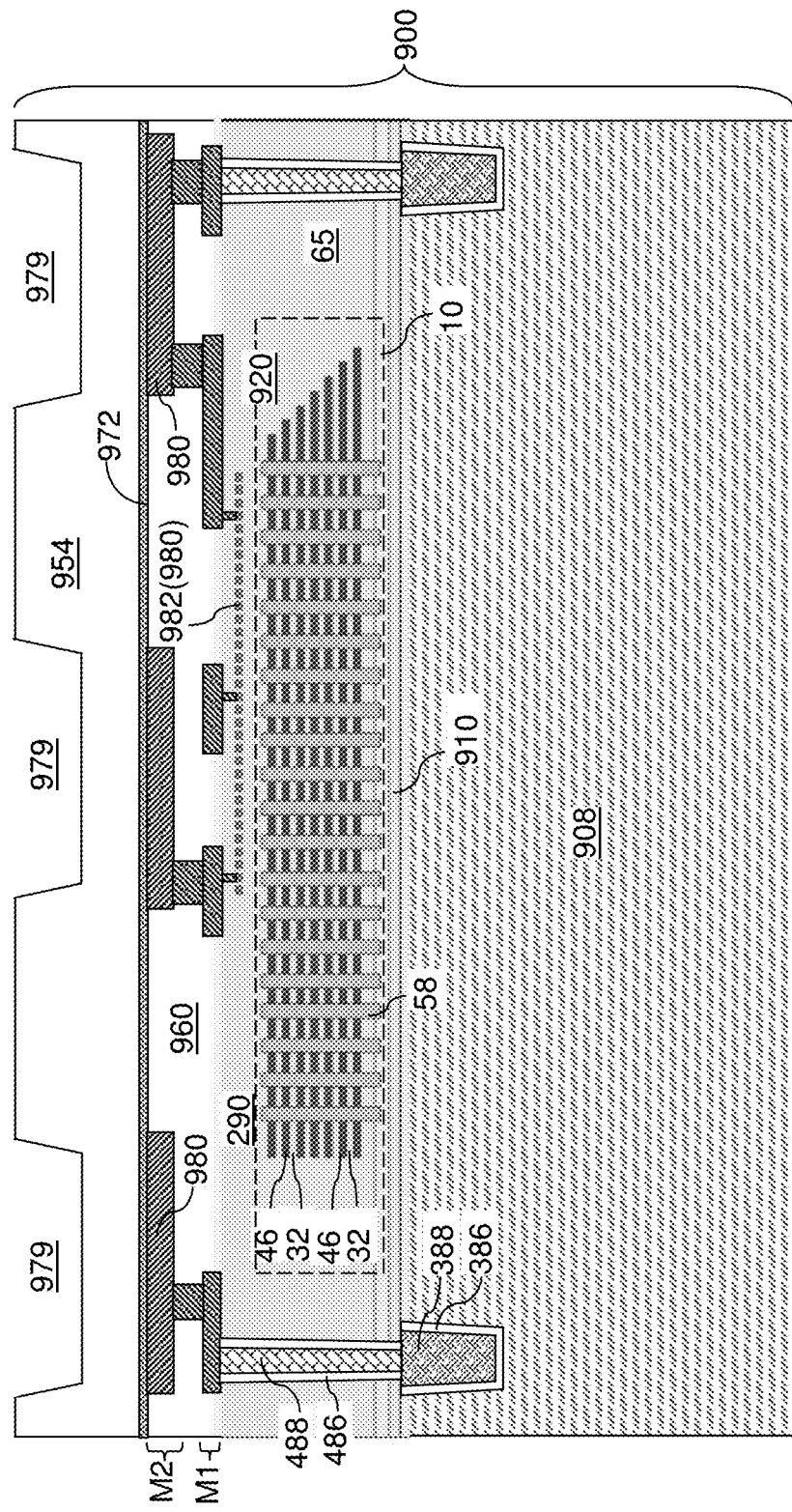
FIG. 22 is a schematic vertical cross-sectional view of a region of a second configuration of a first semiconductor die after formation of a first interconnect-level dielectric material layers, first metal interconnect structures, a first proximal dielectric diffusion barrier layer, a first pad-and-via-level dielectric material layer, and first pad cavities according to a second embodiment of the present disclosure.

In the first exemplary bonded structure according to the first embodiment of the present disclosure, the bonding pads may be formed by a single damascene process. In the second exemplary bonded structure according to the second embodiment of the present disclosure illustrated in FIGS. 22 to 38, the bonding pads may be formed by a double damascene process. Referring to FIG. 22, a region of a second configuration of a first semiconductor die 900 is illustrated. The second configuration of the first semiconductor die 900 can be derived from the first configuration of the first semiconductor die 900 illustrated in FIGS. 1A-1E by sequentially depositing a layer stack including a first proximal dielectric diffusion barrier layer 972 and a first pad-and-via-level dielectric material layer 954 over the first distal interconnect-level dielectric material layers 960.

The first proximal dielectric diffusion barrier layer 972 contacts top surfaces of a subset of the first metal interconnect structures 980 and a topmost surface of the first interconnect-level dielectric material layers 960. The first proximal dielectric diffusion barrier layer 972 can include a dielectric material that blocks diffusion of moisture. The first proximal dielectric diffusion barrier layer 972 comprises, and/or consists essentially of, a dielectric material such as silicon nitride, silicon oxynitride, and/or silicon carbon nitride. In one embodiment, the first proximal dielectric diffusion barrier layer 972 can include silicon nitride, silicon oxynitride, or a stack thereof. In one embodiment, the first proximal dielectric diffusion barrier layer 972 can include a dielectric material having a dielectric constant greater than 5 (such as silicon nitride having a dielectric constant of 7.9 or silicon oxide nitride having a dielectric constant in a range from 5 to 7.9). The thickness of the first proximal dielectric diffusion barrier layer 972 can be in a range from 5 nm to 100 nm, although lesser and greater thicknesses can also be used.

The first pad-and-via-level dielectric material layer 954 can be formed over the first proximal dielectric diffusion barrier layer 972. The first pad-and-via-level dielectric material layer 954 may include, and/or consist essentially of, undoped silicate glass, a doped silicate glass, or organosilicate glass. The thickness of the first pad-and-via-level dielectric material layer 954 may be in a range from 600 nm to 6,000 nm, although lesser and greater thicknesses may also be used. The first pad-and-via-level dielectric material layer 954 may have a planar top surface.

A photoresist layer (not shown) can be applied over the first pad-and-via-level dielectric material layer 954, and can be lithographically patterned to form discrete openings in areas that overlie a first metal interconnect structure 980 embedded within a topmost layer of the first distal interconnect-level dielectric material layers 960. Each discrete opening in the photoresist layer has a shape of a bonding pad to be subsequently formed. For example, each discrete opening in the photoresist layer can have a rectangular shape or a rounded rectangular shape. The dimension of each opening along a direction of sides of the openings in the photoresist layer can be in a range from 2 microns to 60 microns.

An anisotropic etch process can be performed to transfer the pattern of the openings in the photoresist layer through an upper portion of the first pad-and-via-level dielectric material layer 954. First pad cavities 979 are formed partially through the first pad-and-via-level dielectric material layer 954. The depth of the first pad cavities 979 may be in a range from 20% to 80%, such as from 40% to 60%, of the thickness of the first pad-and-via-level dielectric material layer 954. Each first pad cavity 979 can have a horizontal cross-sectional shape of a rectangle or a rounded rectangle such that the lateral dimension of each first pad cavity 979 along a direction of each side of the rectangular or rounded rectangular shape is in a range from 2 microns to 60 microns. In one embodiment, each first pad cavity 979 can have a horizontal cross-sectional shape of a square or a rounded square. Sidewalls of the first pad cavities 979 may be vertical, or may have a taper angle greater than 0 degree and less than 30 degrees (such as a taper angle in a range from 3 degrees to 10 degrees) with respect to the vertical direction.

Figure 23A:
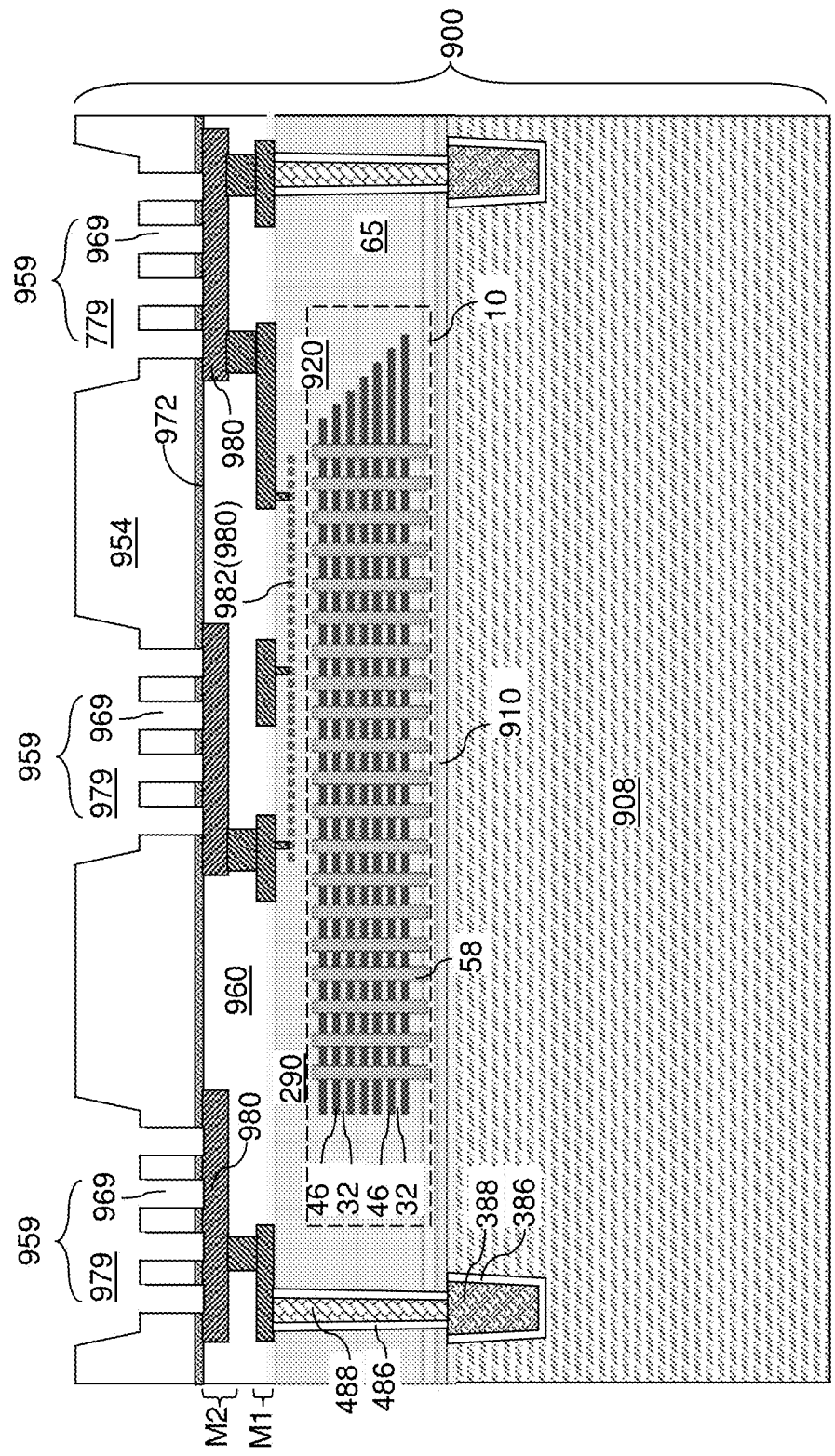
FIG. 23A is a schematic vertical cross-sectional view of a region of the second configuration of the first semiconductor die after formation of first integrated pad and via cavities according to the second embodiment of the present disclosure.
Figure 23B:
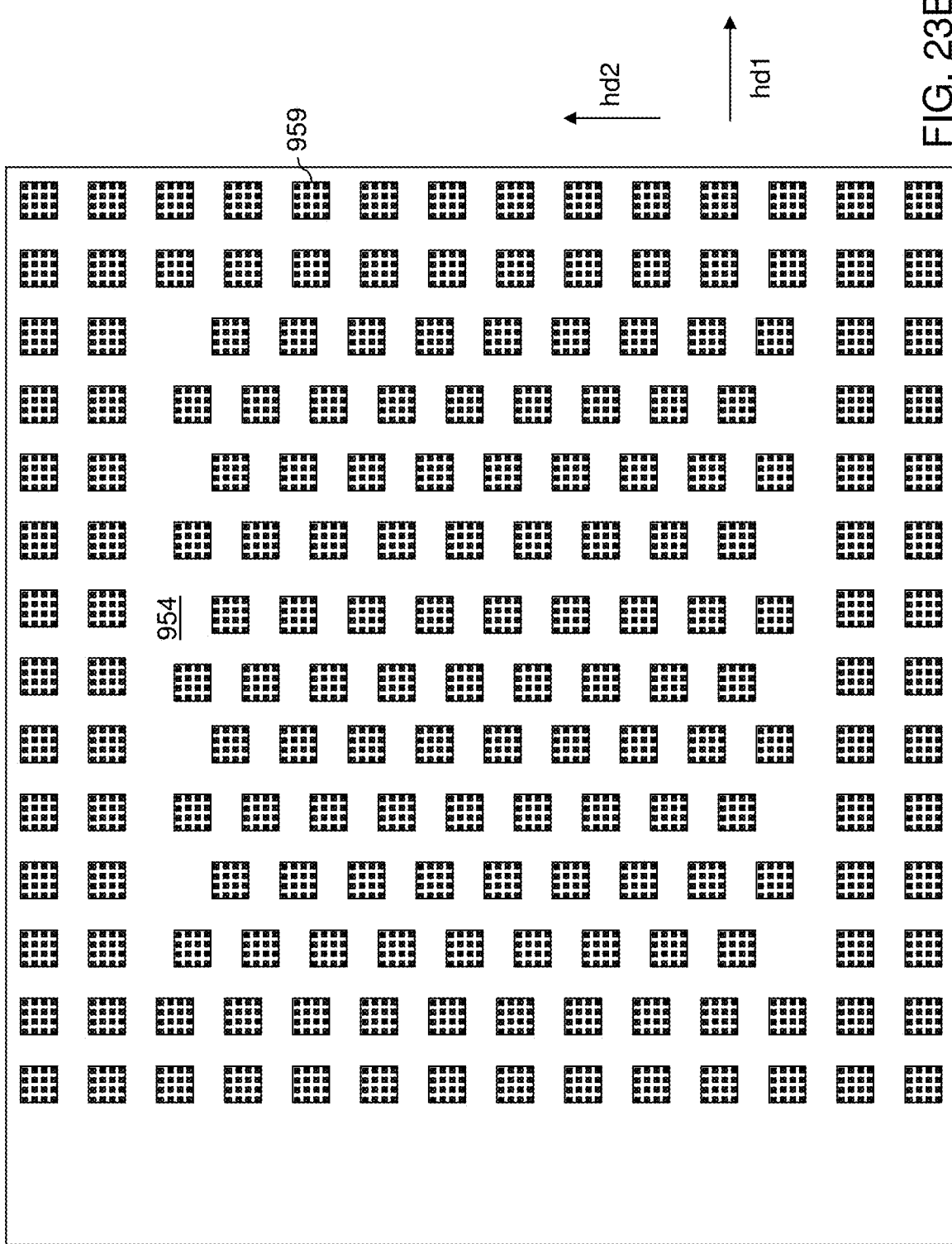
FIG. 23B is a schematic top-down view of the first semiconductor die of FIG. 23A.

Referring to FIGS. 23A and 23B, another photoresist layer (not shown) can be applied over the first pad-and-via-level dielectric material layer 954, and can be lithographically patterned to form discrete openings within the areas of the first pad cavities 979. Specifically, at least one opening in the photoresist layer can be formed within each area of the first pad cavities 979. In one embodiment, a cluster of openings such as an array of openings in the photoresist layer can be formed within each pad cavity area. In another embodiment, one opening in the photoresist layer can be formed within each pad cavity area. An anisotropic etch process can be performed to transfer the pattern of the openings in the photoresist layer through the lower portion of the first pad-and-via-level dielectric material layer 954. First pad-connection via cavities 969 are formed through the lower portion of the first pad-and-via-level dielectric material layer 954. A top surface of a topmost metal interconnect structure 980 can be physically exposed at the bottom of each first pad-connection via cavity 969. The photoresist layer can be subsequently removed, for example, by ashing.

First integrated line and via cavities 959 are formed through the first pad-and-via-level dielectric material layer 954. Each first integrated line and via cavity 959 includes a respective one of the first pad cavities 979 and at least one first pad-connection via cavity 969. In one embodiment, a first integrated line and via cavity 959 can include a first pad cavity 979 and a plurality of first pad-connection via cavities 969 (such as a cluster of pad-connection via cavities). Top surfaces of a subset of the first metal interconnect structures 980 are physically exposed to the first pad and via cavities 959 upon formation of the first pad and via cavities 959.

In one embodiment, the first pad-connection via cavities 969 can be arranged as clusters of first pad-connection via cavities. Each cluster of first pad-connection via cavities 969 can be located within the area of a respective one of the first pad cavities 979. For example, each first pad cavity 979 can have a rectangular shape or a rounded rectangular shape having sides that are parallel to a first horizontal direction hd1 and a second horizontal direction hd2. The dimension of each first pad cavity 979 along the first horizontal direction hd1 and the dimension of each first pad cavity 979 along the second horizontal direction hd2 are in a range from 2 microns to 60 microns. In this case, each cluster of first pad-connection via cavities 969 can be arranged as a rectangular array. Each cluster of first pad-connection via cavities 969 can be formed as an M×N rectangular array in which M and N are independent integers. Alternatively, a single first pad-connection via cavity 969 may be formed per each area of a bonding pad to be subsequently formed.

Each first pad-connection via cavity 969 is formed within the area of a respective one of the topmost metal interconnect structures 980. Clusters of first pad-connection via cavities 969 can be formed along each edge seal structure (688, 984, 986). Clusters of first pad-connection via cavities 969 and gap regions can alternate over the entire area of each edge seal structure (688, 984, 986) along the periphery of the first semiconductor die 900. In case multiple nested edge seal structures (688, 984, 986) are present, multiple laterally alternating sequences of clusters of first pad-connection via cavities 969 and gap regions are provided along the periphery of the first semiconductor die 900.

Referring to FIG. 24, a first distal dielectric diffusion barrier layer 956L can be deposited in the first integrated line and via cavities 959 and over the first pad-and-via-level dielectric material layer 954. The first distal dielectric diffusion barrier layer 956L is deposited on the top surfaces of underlying first metal interconnect structures 980 and on the physically exposed surfaces of the first pad-and-via-level dielectric material layer 954. The first distal dielectric diffusion barrier layer 956L comprises, and/or consists essentially of, a diffusion blocking dielectric material such as silicon nitride, silicon oxynitride, or a stack thereof. In one embodiment, the first distal dielectric diffusion barrier layer 956L includes a moisture-blocking dielectric material having a dielectric constant greater than 5 (such as silicon nitride having a dielectric constant of 7.9 or silicon oxynitride having a dielectric constant in a range from 5 to 7.9). The first distal dielectric diffusion barrier layer 956L can be deposited by a conformal deposition process such as a chemical vapor deposition process. The thickness of the first distal dielectric diffusion barrier layer 956L can be in a range from 5 nm to 50 nm, such as from 10 nm to 25 nm, although lesser and greater thicknesses can also be used.

Figure 25:
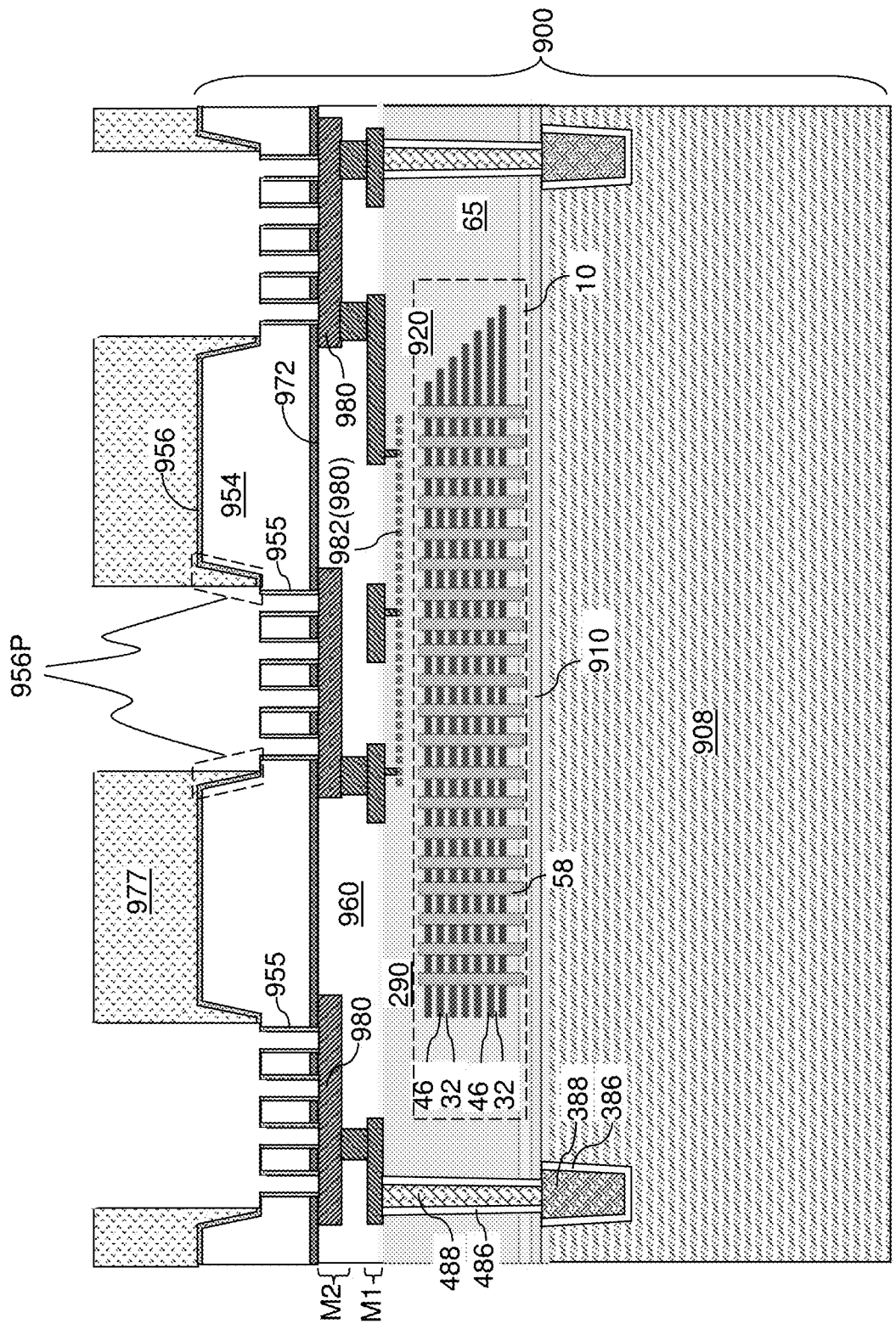
FIG. 25 is a schematic vertical cross-sectional view of a region of the second configuration of the first semiconductor die after patterning the first distal dielectric diffusion barrier layer according to the second embodiment of the present disclosure.

Referring to FIG. 25, a photoresist layer 977 can be applied over the first distal dielectric diffusion barrier layer 956L, and can be lithographically patterned to form discrete openings therethrough. Openings are formed through the photoresist layer 977 within areas of bottom surfaces of the first integrated pad and via cavities 959 by lithographically patterning the photoresist layer 977. Each area of the discrete openings in the photoresist layer 977 can be located inside a bottom periphery of a pad cavity portion of a respective first integrated line and via cavity 959, i.e., inside a closed bottom edge of a set of sidewalls of the pad cavity portion of the respective first integrated line and via cavity 959. Each opening through the photoresist layer 977 can include the entire area of a set of at least one first pad-connection via cavity 969 that underlies the pad cavity portion 979 of a respective first integrated line and via cavity 959.

Unmasked portions of the first distal dielectric diffusion barrier layer 956L are anisotropically etched by performing an anisotropic etch process that employs the patterned photoresist layer 977 as an etch mask. Unmasked horizontal portions of the first distal dielectric diffusion barrier layer 956L can be anisotropically etched by the anisotropic etch process. The horizontal portions of the first distal dielectric diffusion barrier layer 956L within areas of the first integrated pad and via cavities 959 can be removed by the anisotropic etch process, and top surfaces of a subset of the first metal interconnect structures 980 that directly underlie the first proximal dielectric diffusion barrier layer 972 are physically exposed.

Openings are formed through the first distal dielectric diffusion barrier layer 956L along each periphery of the openings through the patterned photoresist layer 977. Horizontally extending portions of the first distal dielectric diffusion barrier layer 956L located at bottom regions of the pad cavity portions of the first integrated line and via cavities 959 and above the first pad-connection via cavities 969 are removed. Thus, the horizontal portions of the first distal dielectric diffusion barrier layer 956L located at bottom portions of the first pad-connection via cavities 969 are removed. Remaining portions of the patterned first distal dielectric diffusion barrier layer 956L comprise first dielectric diffusion barrier portions 956P that laterally surround a respective pad cavity portion 979 of the first integrated line and via cavities 959. Portions of a top surface of a respective first metal interconnect structures 980 are physically exposed underneath each first integrated line and via cavity 959.

Remaining portions of the first distal dielectric diffusion barrier layer 956L after the anisotropic etch process comprise first dielectric diffusion barrier portions 956P formed on sidewalls of pad cavity portions 979 of the first integrated pad and via cavities 959, and first tubular dielectric diffusion barrier liners 955 formed on sidewalls of the first via cavity portions 969 of the first integrated pad and via cavities 959 that underlie the pad cavity portions 979. The continuous remaining portion of the first distal dielectric diffusion barrier layer 956L that includes the first dielectric diffusion barrier portions 956P after the anisotropic etch process is herein referred to as a first distal dielectric diffusion barrier layer 956. The first distal dielectric diffusion barrier layer 956 includes a first horizontally extending diffusion barrier portion that overlies the first pad-and-via-level dielectric material layer 954. The first dielectric diffusion barrier portions 956P are interconnected with each other through the first horizontally extending diffusion barrier portion of the first distal dielectric diffusion barrier layer 956.

Each of the first dielectric diffusion barrier portions 956P is vertically spaced from the first proximal dielectric diffusion barrier layer 972. Each of the tubular dielectric diffusion barrier liners 955 laterally surrounds a first via cavity portion 969 of a respective one of the first integrated pad and via cavities 959. In one embodiment, the tubular dielectric diffusion barrier liners 955 do not contact, and are laterally spaced from, the first dielectric diffusion barrier portions 956P. Each tubular dielectric diffusion barrier liner 955 can contact a cylindrical sidewall of a respective opening in the first proximal dielectric diffusion barrier layer 972.

Each of the first dielectric diffusion barrier portions 956P of the first distal dielectric diffusion barrier layer 956 laterally surrounds the pad cavity portion 979 of a respective first integrated line and via cavity 959, and is vertically spaced from the first proximal dielectric diffusion barrier layer 972 by a lower portion of the first pad-and-via-level dielectric material layer 954. In one embodiment, the periphery of each opening through first distal dielectric diffusion barrier layer 956 can be laterally offset outward from a respective set of at least one tubular dielectric diffusion barrier liner 955. In this case, each of the first dielectric diffusion barrier portions 956P comprises a horizontal segment having a bottom surface that contacts a horizontal surface of the first pad-and-via-level dielectric material layer 954. The patterned photoresist layer 977 can be subsequently removed, for example, by ashing.

Figure 26:
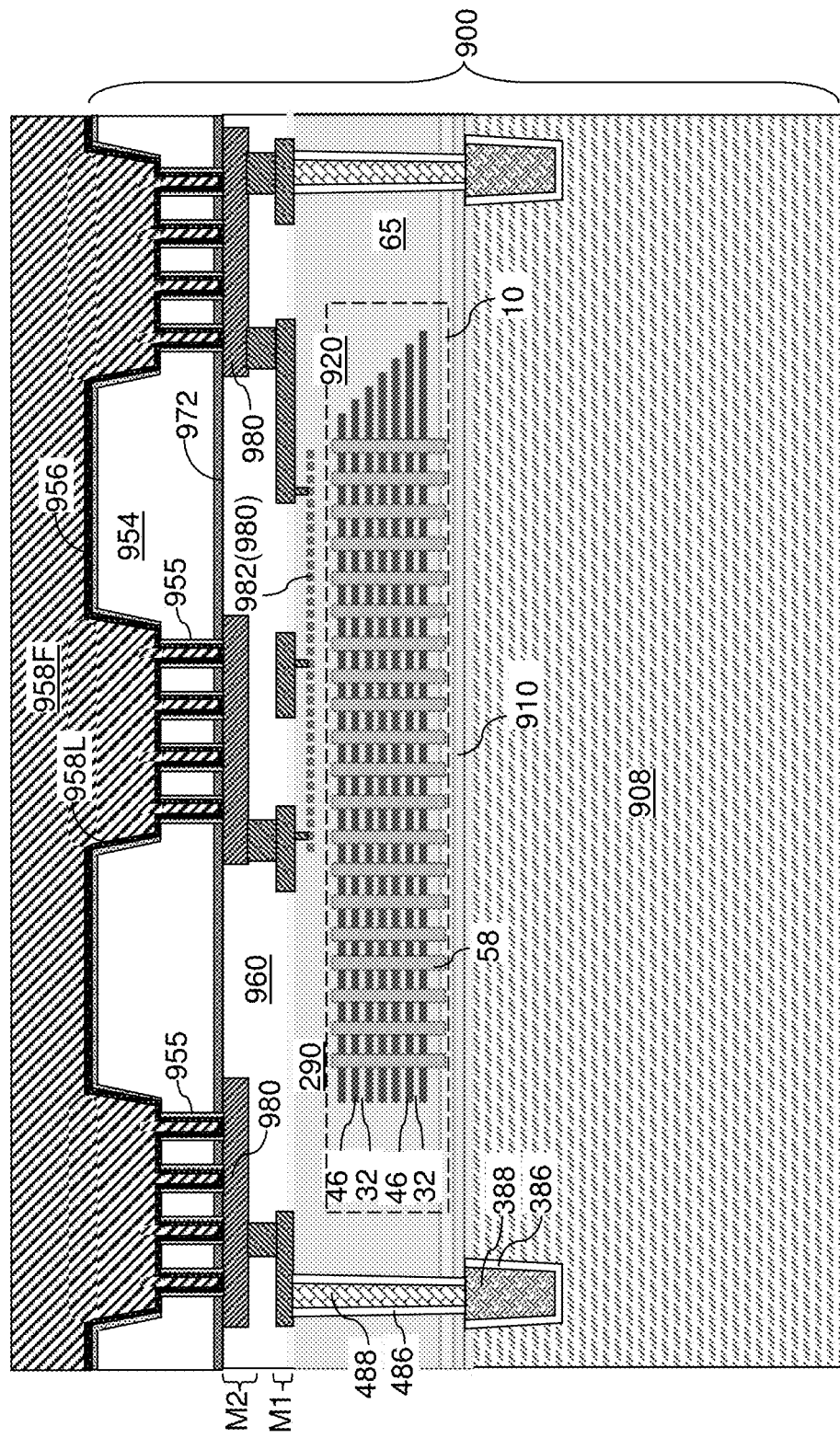
FIG. 26 is a schematic vertical cross-sectional view of a region of the second configuration of the first semiconductor die after deposition of a first metallic liner layer and a first metallic pad fill material layer according to the second embodiment of the present disclosure.

Referring to FIG. 26, a first bonding pad liner layer 958L and a first metallic pad fill material layer 958F can be sequentially deposited in the first integrated line and via cavities 959. The first bonding pad liner layer 958L includes a metallic nitride material such as TiN, TaN, and/or WN. The conductive metallic barrier material can block diffusion copper. The first bonding pad liner layer 958L is formed on top surfaces of a subset of first metal interconnect structures 980 located at a topmost level of the first distal interconnect-level dielectric material layers 960, on inner sidewalls of the tubular dielectric diffusion barrier liners 955, on physically exposed surfaces of the first distal dielectric diffusion barrier layer 956, and on physically exposed horizontal surfaces of the first pad-and-via-level dielectric material layer 954 located between the topmost surface of the first pad-and-via-level dielectric material layer 954 and the bottom surface of the first pad-and-via-level dielectric material layer 954. The thickness of the first bonding pad liner layer 958L may be in a range from 4 nm to 80 nm, such as from 8 nm to 40 nm, although lesser and greater thicknesses can also be used. The first metallic pad fill material layer 958F can include copper, which may be deposited by a combination of a copper seed layer deposition process employing physical vapor deposition and a copper electroplating process that fills remaining volumes of the first integrated line and via cavities 959.

Figure 27A:
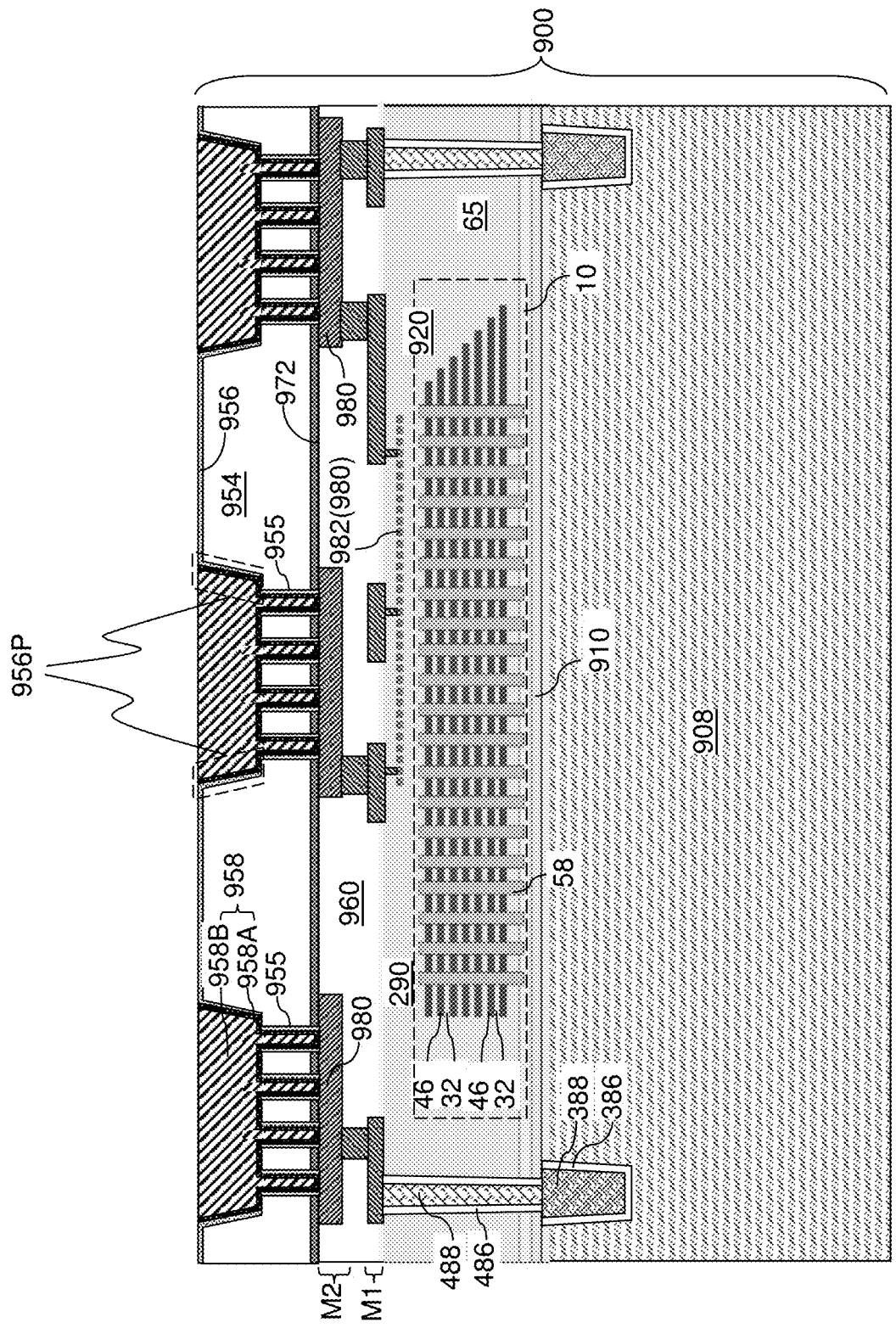
FIG. 27A is a schematic vertical cross-sectional view of a region of the second configuration of the first semiconductor die after formation of first integrated pad and via structures according to the second embodiment of the present disclosure.

Referring to FIGS. 27A and 27B, excess portions of the first metallic pad fill material layer 958F and the first bonding pad liner layer 958L overlying the horizontal plane including the top surface of the first distal dielectric diffusion barrier layer 956 can be removed by a planarization process such as chemical mechanical planarization. Remaining portions of the first metallic pad fill material layer 958F and the first bonding pad liner layer 958L that fill the first integrated line and via cavities 959 constitute first integrated pad and via structures 958 (e.g., dual damascene first bonding pads). Each first integrated pad and via structure 958 can include a first bonding pad liner 958A and a first metallic pad fill material portion 958B. The first bonding pad liner 958A is a patterned remaining portion of the first bonding pad liner layer 958L, and the first metallic pad fill material portion 958B is a patterned remaining portion of the first metallic pad fill material layer 958F. Top surfaces of the first integrated pad and via structures 958 can be within a same horizontal plane as the top surface of the first distal dielectric diffusion barrier layer 956.

Generally, the first integrated pad and via structures 958 are formed in remaining volumes of the first integrated line and via cavities 959. Each of the first integrated pad and via structures 958 comprises, and/or consists of, a first bonding pad liner 988A comprising a metallic nitride material, and a first metallic pad fill material portion 988B embedded in the bonding pad liner 988A.

In one embodiment, the first dielectric diffusion barrier portions 956P are interconnected with each other through a first horizontally extending diffusion barrier portion that overlie the first pad-and-via-level dielectric material layer 954. The top surfaces of the first integrated pad and via structures 958 can be located within the horizontal plane including a top surface of the first horizontally extending diffusion barrier portion of the first distal dielectric diffusion barrier layer 956. Each of the first integrated pad and via structures 958 can directly contact at least one sidewall of the first proximal dielectric diffusion barrier layer 972. Generally, the first pad-and-via-level dielectric material layer 954 includes first integrated line and via cavities that are filled with a respective combination of a first integrated pad and via structure 958 and a respective first dielectric diffusion barrier portion 956P.

A first subset of the first integrated pad and via structures 958 can be located within the areas of the at least one edge seal structure (688, 984, 986), and can be electrically connected to a respective node of the first semiconductor devices 920. A second subset of the first integrated pad and via structures 958 can be located on, and can be electrically connected to, a respective one of the at least one edge seal structure (688, 984, 986).

In one embodiment, the first bonding pad liner 958A within each of the first integrated pad and via structures 958 continuously extends from a top surface of a respective one of the first metal interconnect structures 980 to a horizontal plane including topmost surfaces of the first dielectric diffusion barrier portions 956P, and directly contacts a horizontal surface of the first pad-and-via-level dielectric material layer 954 located within an area of an opening through a respective one of the first dielectric diffusion barrier portions 956P.

Each first integrated pad and via structure 958 has at least one bottom surface that contacts a first metal interconnect structure 980. In one embodiment, the via portions of the first integrated pad and via structures 958 contact horizontal surfaces of a of the first metal interconnect structures 980 located at the topmost level of the first distal interconnect-level dielectric material layers 960. The first dielectric diffusion barrier portions 956P are embedded in the first pad-and-via-level dielectric material layer 954. Each of the first dielectric diffusion barrier portions 956P contacts, and laterally surrounds, a pad portion of a respective one of the first integrated pad and via structures 958. Each tubular dielectric diffusion barrier liner 955 laterally surrounds a via portion of a respective one of the first integrated pad and via structures 958.

Figure 28:
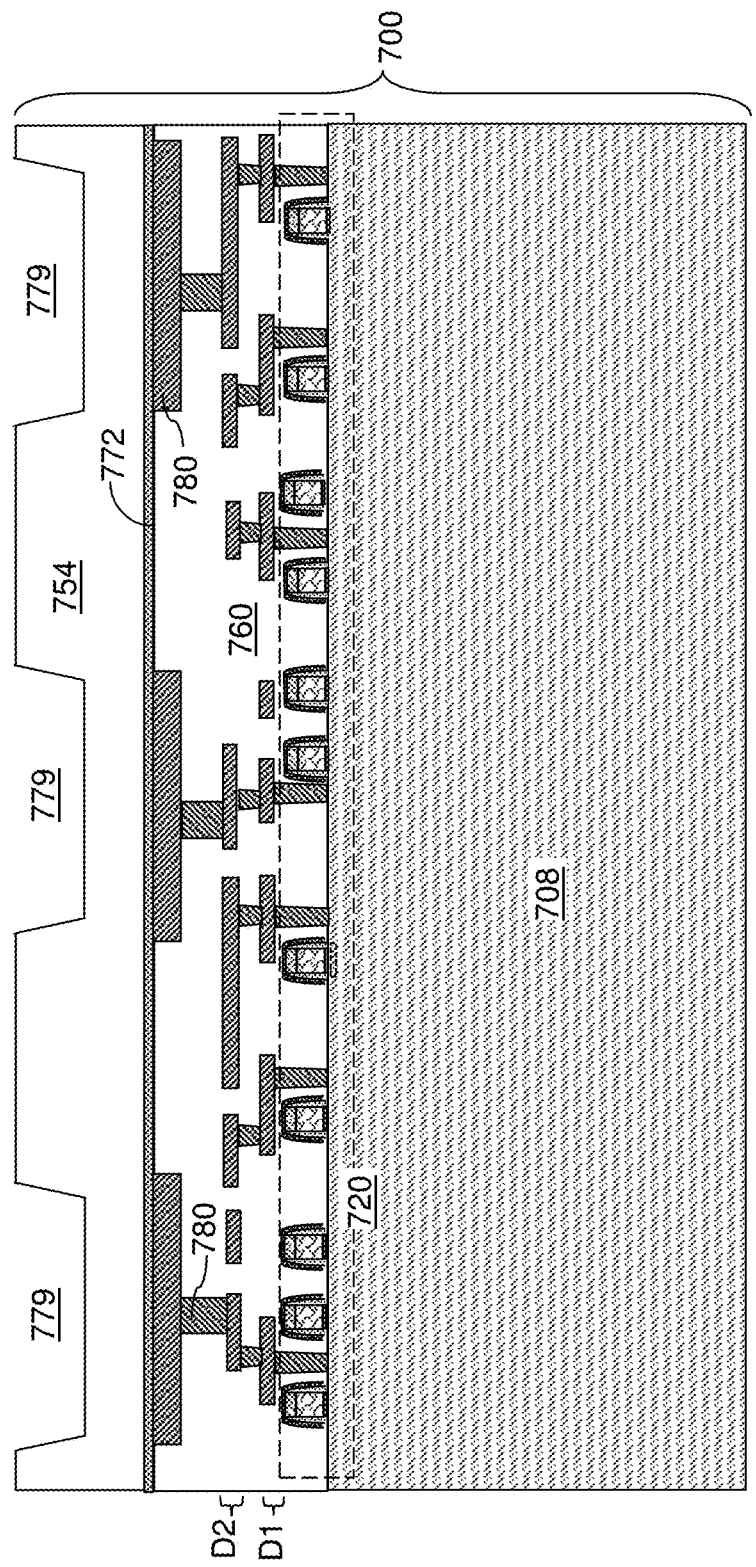
FIG. 28 is a schematic vertical cross-sectional view of a region of a second configuration of a second semiconductor die after formation of a second proximal dielectric diffusion barrier layer, a second pad-and-via-level dielectric material layer, and second pad cavities according to the second embodiment of the present disclosure.

Referring to FIG. 28, a region of a second semiconductor die 700 in a second configuration is illustrated. The second configuration of the second semiconductor die 700 can be derived from the first configuration of the second semiconductor die 700 illustrated in FIG. 9 by sequentially depositing a layer stack including a second proximal dielectric diffusion barrier layer 772 and a second pad-and-via-level dielectric material layer 754 directly on the topmost surface of the second interconnect-level dielectric material layers 760. In other words, a second interconnect-capping dielectric diffusion barrier layer 762 and a second pad-connection-via-level dielectric material layer 764 illustrated in FIG. 9 are not formed, and the second proximal dielectric diffusion barrier layer 772 can be formed directly on the top surface of the second interconnect-level dielectric material layers 760.

The second proximal dielectric diffusion barrier layer 772 contacts top surfaces of a subset of the second metal interconnect structures 780 and a topmost surface of the second dielectric material layers 760. The second proximal dielectric diffusion barrier layer 772 can include a dielectric material that blocks diffusion of moisture. The second proximal dielectric diffusion barrier layer 772 comprises, and/or consists essentially of, a dielectric material such as silicon nitride, silicon oxynitride, or a stack thereof. In one embodiment, the second proximal dielectric diffusion barrier layer 772 can include a dielectric material having a dielectric constant greater than 5 (such as silicon nitride having a dielectric constant of 7.9 or silicon oxide nitride having a dielectric constant in a range from 5 to 7.9). The thickness of the second proximal dielectric diffusion barrier layer 772 can be in a range from 5 nm to 100 nm, although lesser and greater thicknesses can also be used.

The second pad-and-via-level dielectric material layer 754 can be formed over the second proximal dielectric diffusion barrier layer 772. The second pad-and-via-level dielectric material layer 754 may include, and/or consist essentially of, undoped silicate glass, a doped silicate glass, or organosilicate glass. The thickness of the second pad-and-via-level dielectric material layer 754 may be in a range from 600 nm to 6,000 nm, although lesser and greater thicknesses may also be used. The second pad-and-via-level dielectric material layer 754 may have a planar top surface.

A photoresist layer (not shown) can be applied over the second pad-and-via-level dielectric material layer 754, and can be lithographically patterned to form discrete openings in areas that overlie a second metal interconnect structure 780 embedded within a topmost layer of the second interconnect-level dielectric material layers 760. Each discrete opening in the photoresist layer has a shape of a bonding pad to be subsequently formed. For example, each discrete opening in the photoresist layer can have a rectangular shape or a rounded rectangular shape. The dimension of each opening along a direction of sides of the openings in the photoresist layer can be in a range from 2 microns to 60 microns.

An anisotropic etch process can be performed to transfer the pattern of the openings in the photoresist layer through an upper portion of the second pad-and-via-level dielectric material layer 754. Second pad cavities 779 are formed partially through the second pad-and-via-level dielectric material layer 754. The depth of the second pad cavities 779 may be in a range from 20% to 80%, such as from 40% to 60%, of the thickness of the second pad-and-via-level dielectric material layer 754. Each second pad cavity 779 can have a horizontal cross-sectional shape of a rectangle or a rounded rectangle such that the lateral dimension of each second pad cavity 779 along a direction of each side of the rectangular or rounded rectangular shape is in a range from 2 microns to 60 microns. In one embodiment, each second pad cavity 779 can have a horizontal cross-sectional shape of a square or a rounded square. Sidewalls of the second pad cavities 779 may be vertical, or may have a taper angle greater than 0 degree and less than 30 degrees (such as a taper angle in a range from 3 degrees to 10 degrees) with respect to the vertical direction.

Figure 29A:
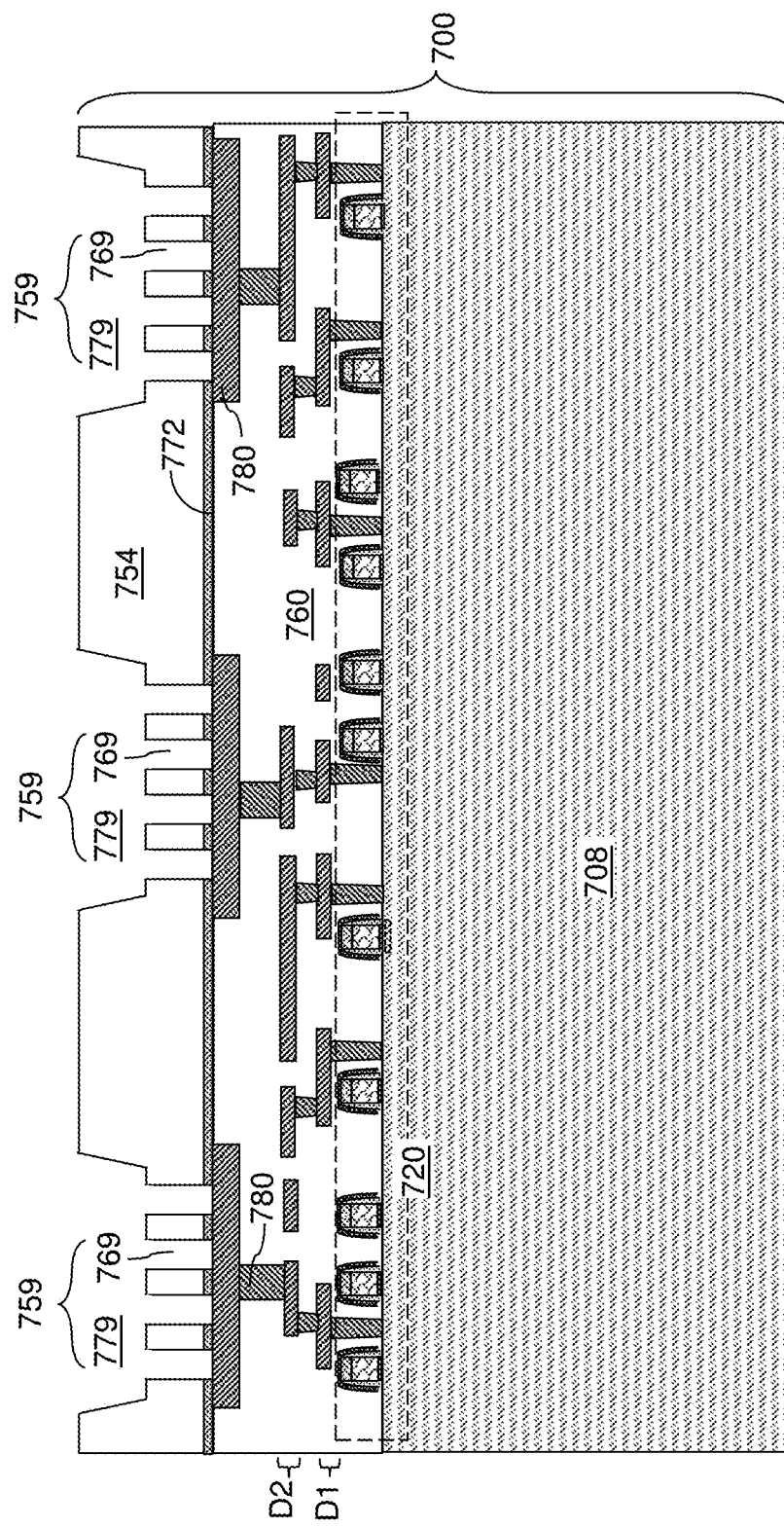
FIG. 29A is a schematic vertical cross-sectional view of a region of the second configuration of the second semiconductor die after formation of second integrated pad and via cavities according to the second embodiment of the present disclosure.
Figure 29B:
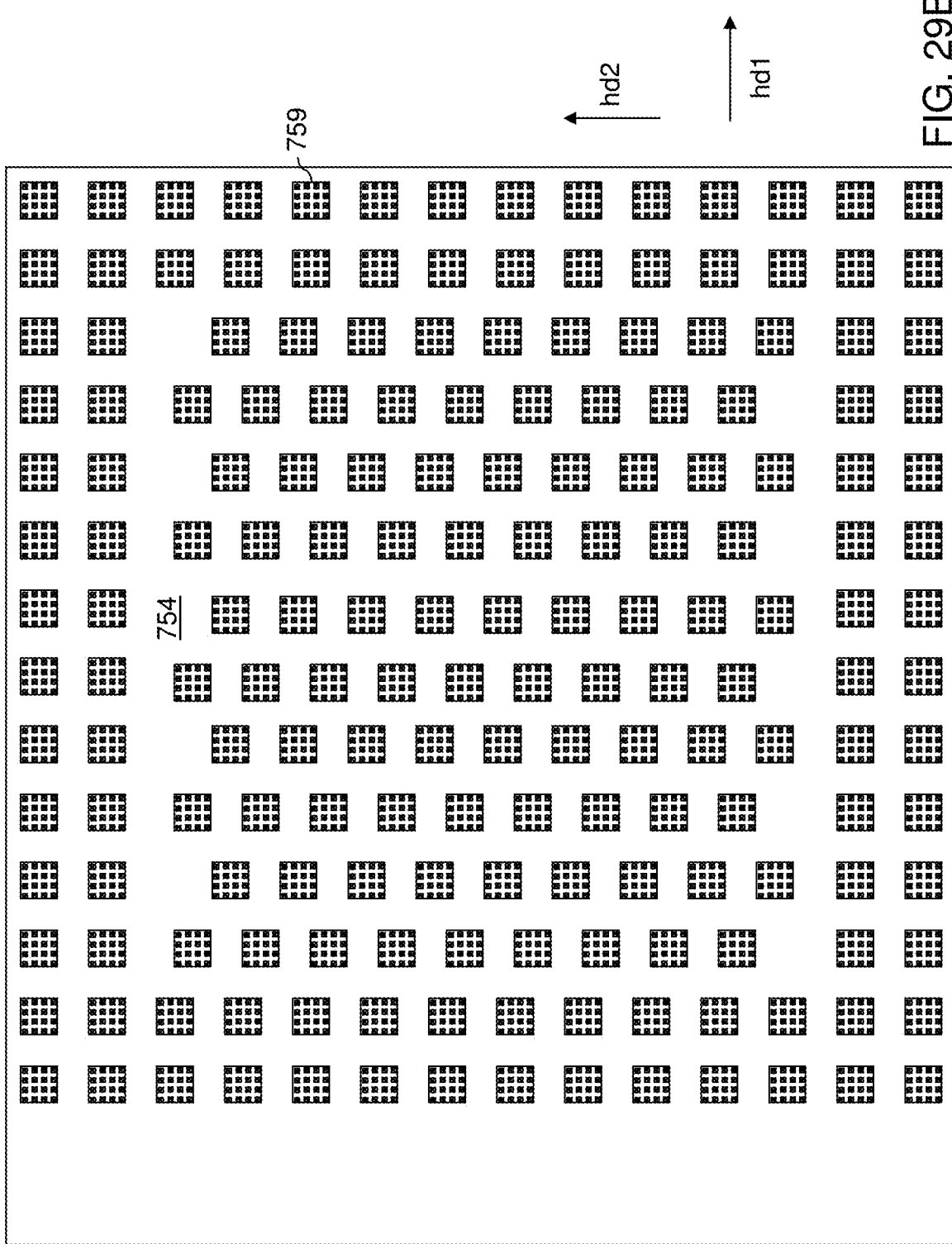
FIG. 29B is a schematic top-down view of the second semiconductor die of FIG. 29A.

Referring to FIGS. 29A and 29B, a photoresist layer (not shown) can be applied over the second pad-and-via-level dielectric material layer 754, and can be lithographically patterned to form discrete openings within the areas of the second pad cavities 779. Specifically, at least one opening in the photoresist layer can be formed within each area of the second pad cavities 779. In one embodiment, a cluster of openings such as an array of openings in the photoresist layer can be formed within each pad cavity area. In another embodiment, one opening in the photoresist layer can be formed within each pad cavity area. An anisotropic etch process can be performed to transfer the pattern of the openings in the photoresist layer through the lower portion of the second pad-and-via-level dielectric material layer 754. Second pad-connection via cavities 769 are formed through the lower portion of the second pad-and-via-level dielectric material layer 754. A top surface of a topmost metal interconnect structure 780 can be physically exposed at the bottom of each second pad-connection via cavity 769. The photoresist layer can be subsequently removed, for example, by ashing.

Second integrated line and via cavities 759 are formed through the second pad-and-via-level dielectric material layer 754. Each second integrated line and via cavity 759 includes a respective one of the second pad cavities 779 and at least one second pad-connection via cavity 769. In one embodiment, a second integrated line and via cavity 759 can include a second pad cavity 779 and a plurality of second pad-connection via cavities 769 (such as a cluster of pad-connection via cavities). Top surfaces of a subset of the second metal interconnect structures 780 are physically exposed to the second pad and via cavities 759 upon formation of the second pad and via cavities 759.

In one embodiment, the second pad-connection via cavities 769 can be arranged as clusters of second pad-connection via cavities. Each cluster of second pad-connection via cavities 769 can be located within the area of a respective one of the second pad cavities 779. For example, each second pad cavity 779 can have a rectangular shape or a rounded rectangular shape having sides that are parallel to a second horizontal direction hd1 and a second horizontal direction hd2. The dimension of each second pad cavity 779 along the second horizontal direction hd1 and the dimension of each second pad cavity 779 along the second horizontal direction hd2 are in a range from 2 microns to 60 microns. In this case, each cluster of second pad-connection via cavities 769 can be arranged as a rectangular array. Each cluster of second pad-connection via cavities 769 can be formed as an M×N rectangular array in which M and N are independent integers. Alternatively, a single second pad-connection via cavity 769 may be formed per each area of a bonding pad to be subsequently formed.

Each second pad-connection via cavity 769 is formed within the area of a respective one of the topmost metal interconnect structures 780. Clusters of second pad-connection via cavities 769 can be formed along each edge seal structure (not illustrated) in the second semiconductor die 700. Clusters of second pad-connection via cavities 769 and gap regions can alternate over the entire area of each edge seal structure along the periphery of the second semiconductor die 700. In case multiple nested edge seal structures are present in the second semiconductor die 700, multiple laterally alternating sequences of clusters of second pad-connection via cavities 769 and gap regions are provided along the periphery of the second semiconductor die 700.

Figure 30:
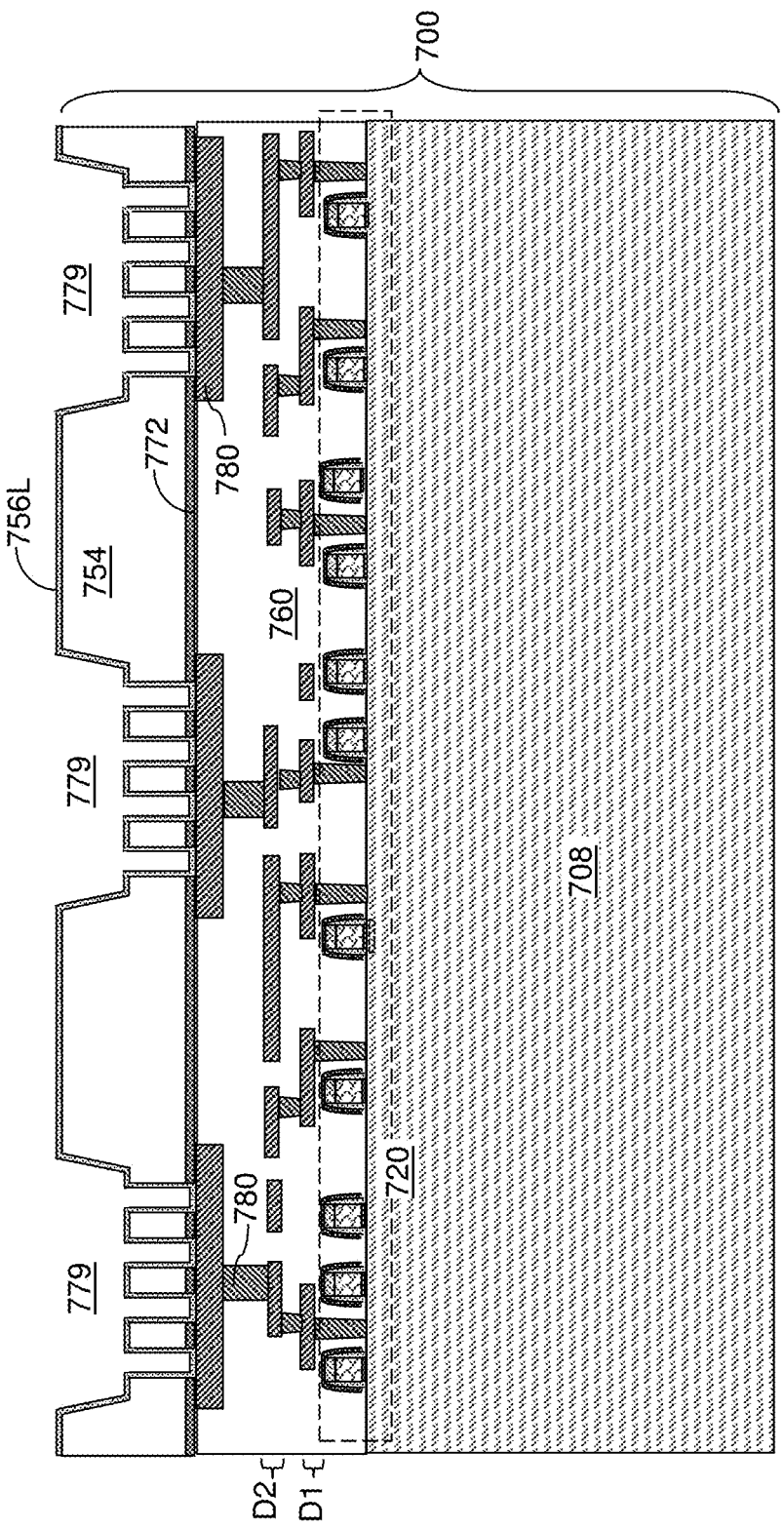
FIG. 30 is a schematic vertical cross-sectional view of a region of the second configuration of the second semiconductor die after formation of a second distal dielectric diffusion barrier layer according to the second embodiment of the present disclosure.

Referring to FIG. 30, a second distal dielectric diffusion barrier layer 756L can be deposited in the second integrated line and via cavities 759 and over the second pad-and-via-level dielectric material layer 754. The second distal dielectric diffusion barrier layer 756L is deposited on the top surfaces of underlying second metal interconnect structures 780 and on the physically exposed surfaces of the second pad-and-via-level dielectric material layer 754. The second distal dielectric diffusion barrier layer 756L comprises, and/or consists essentially of, a diffusion blocking dielectric material such as silicon nitride, silicon oxynitride, or a stack thereof. In one embodiment, the second distal dielectric diffusion barrier layer 756L includes a moisture-blocking dielectric material having a dielectric constant greater than 5 (such as silicon nitride having a dielectric constant of 7.9 or silicon oxynitride having a dielectric constant in a range from 5 to 7.9). The second distal dielectric diffusion barrier layer 756L can be deposited by a conformal deposition process such as a chemical vapor deposition process. The thickness of the second distal dielectric diffusion barrier layer 756L can be in a range from 5 nm to 50 nm, such as from 10 nm to 25 nm, although lesser and greater thicknesses can also be used.

Figure 31:
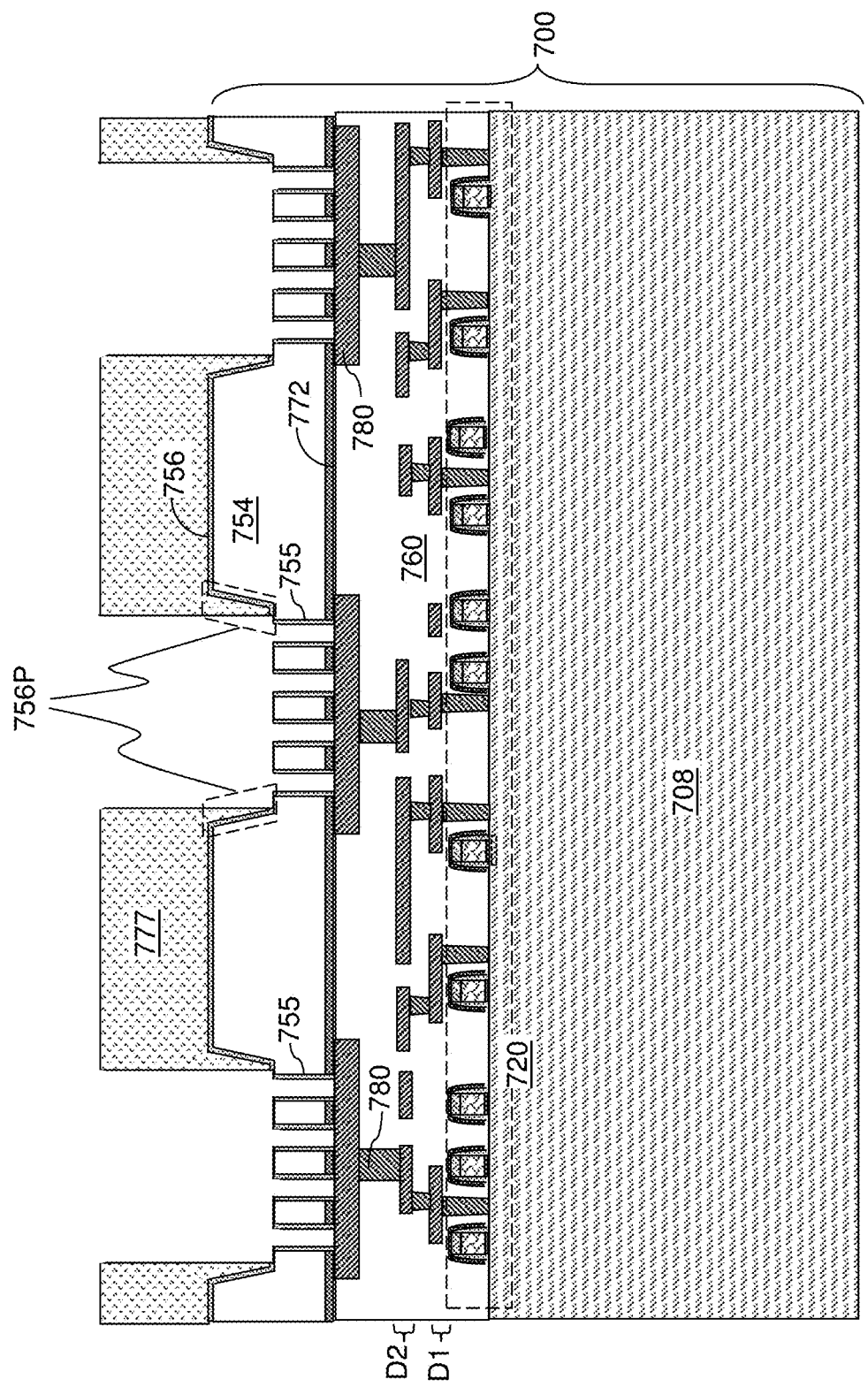
FIG. 31 is a schematic vertical cross-sectional view of a region of the second configuration of the second semiconductor die after patterning the second distal dielectric diffusion barrier layer according to the second embodiment of the present disclosure.

Referring to FIG. 31, a photoresist layer 777 can be applied over the second distal dielectric diffusion barrier layer 756L, and can be lithographically patterned to form discrete openings therethrough. Openings are formed through the photoresist layer 777 within areas of bottom surfaces of the second integrated pad and via cavities 759 by lithographically patterning the photoresist layer 777. Each area of the discrete openings in the photoresist layer 777 can be located inside a bottom periphery of a pad cavity portion of a respective second integrated line and via cavity 759, i.e., inside a closed bottom edge of a set of sidewalls of the pad cavity portion of the respective second integrated line and via cavity 759. Each opening through the photoresist layer 777 can include the entire area of a set of at least one second pad-connection via cavity that underlies the pad cavity portion of a respective second integrated line and via cavity 759.

Unmasked portions of the second distal dielectric diffusion barrier layer 756L are anisotropically etched by performing an anisotropic etch process that employs the patterned photoresist layer 777 as an etch mask. Unmasked horizontal portions of the second distal dielectric diffusion barrier layer 756L can be anisotropically etched by the anisotropic etch process. The horizontal portions of the second distal dielectric diffusion barrier layer 756L within areas of the second integrated pad and via cavities 759 can be removed by the anisotropic etch process, and top surfaces of a subset of the second metal interconnect structures 780 that directly underlie the second proximal dielectric diffusion barrier layer 772 are physically exposed.

Openings are formed through the second distal dielectric diffusion barrier layer 756L along each periphery of the openings through the patterned photoresist layer 777. Horizontally extending portions of the second distal dielectric diffusion barrier layer 756L located at bottom regions of the pad cavity portions 779 of the second integrated line and via cavities 759 and above the second pad-connection via cavities 769 are removed. Horizontal portions of the second distal dielectric diffusion barrier layer 756L located at bottom portions of the second pad-connection via cavities 769 are also removed. Remaining portions of the patterned second distal dielectric diffusion barrier layer 756L comprise second dielectric diffusion barrier portions 756P that laterally surround a respective pad cavity portion of the second integrated line and via cavities 759. Portions of a top surface of a respective second metal interconnect structures 780 are physically exposed underneath each second integrated line and via cavity 759.

Remaining portions of the second distal dielectric diffusion barrier layer 756L after the anisotropic etch process comprise second dielectric diffusion barrier portions 756P formed on sidewalls of pad cavity portions of the second integrated pad and via cavities 759, and second tubular dielectric diffusion barrier liners 755 formed on sidewalls of the second via cavity portions 769 of the second integrated pad and via cavities 759 that underlie the pad cavity portions 779. The continuous remaining portion of the second distal dielectric diffusion barrier layer 756L that includes the second dielectric diffusion barrier portions 756P after the anisotropic etch process is herein referred to as a second distal dielectric diffusion barrier layer 756. The second distal dielectric diffusion barrier layer 756 includes a second horizontally extending diffusion barrier portion that overlies the second pad-and-via-level dielectric material layer 754. The second dielectric diffusion barrier portions 756P are interconnected with each other through the second horizontally extending diffusion barrier portion of the second distal dielectric diffusion barrier layer 756.

Each of the second dielectric diffusion barrier portions 756P is vertically spaced from the second proximal dielectric diffusion barrier layer 772. Each of the tubular dielectric diffusion barrier liners 755 laterally surrounds a second via cavity portion 769 of a respective one of the second integrated pad and via cavities 759. The tubular dielectric diffusion barrier liners 755 do not contact, and are laterally spaced from, the second dielectric diffusion barrier portions 756P. Each tubular dielectric diffusion barrier liner 755 can contact a cylindrical sidewall of a respective opening in the second proximal dielectric diffusion barrier layer 772.

Each of the second dielectric diffusion barrier portions 756P of the second distal dielectric diffusion barrier layer 756 laterally surrounds the pad cavity portion of a respective second integrated line and via cavity 759, and is vertically spaced from the second proximal dielectric diffusion barrier layer 772 by a lower portion of the second pad-and-via-level dielectric material layer 754. In one embodiment, the periphery of each opening through second distal dielectric diffusion barrier layer 756 can be laterally offset outward from a respective set of at least one tubular dielectric diffusion barrier liner 755. In this case, each of the second dielectric diffusion barrier portions 756P comprises a horizontal segment having a bottom surface that contacts a horizontal surface of the second pad-and-via-level dielectric material layer 754. The patterned photoresist layer 777 can be subsequently removed, for example, by ashing.

Figure 32:
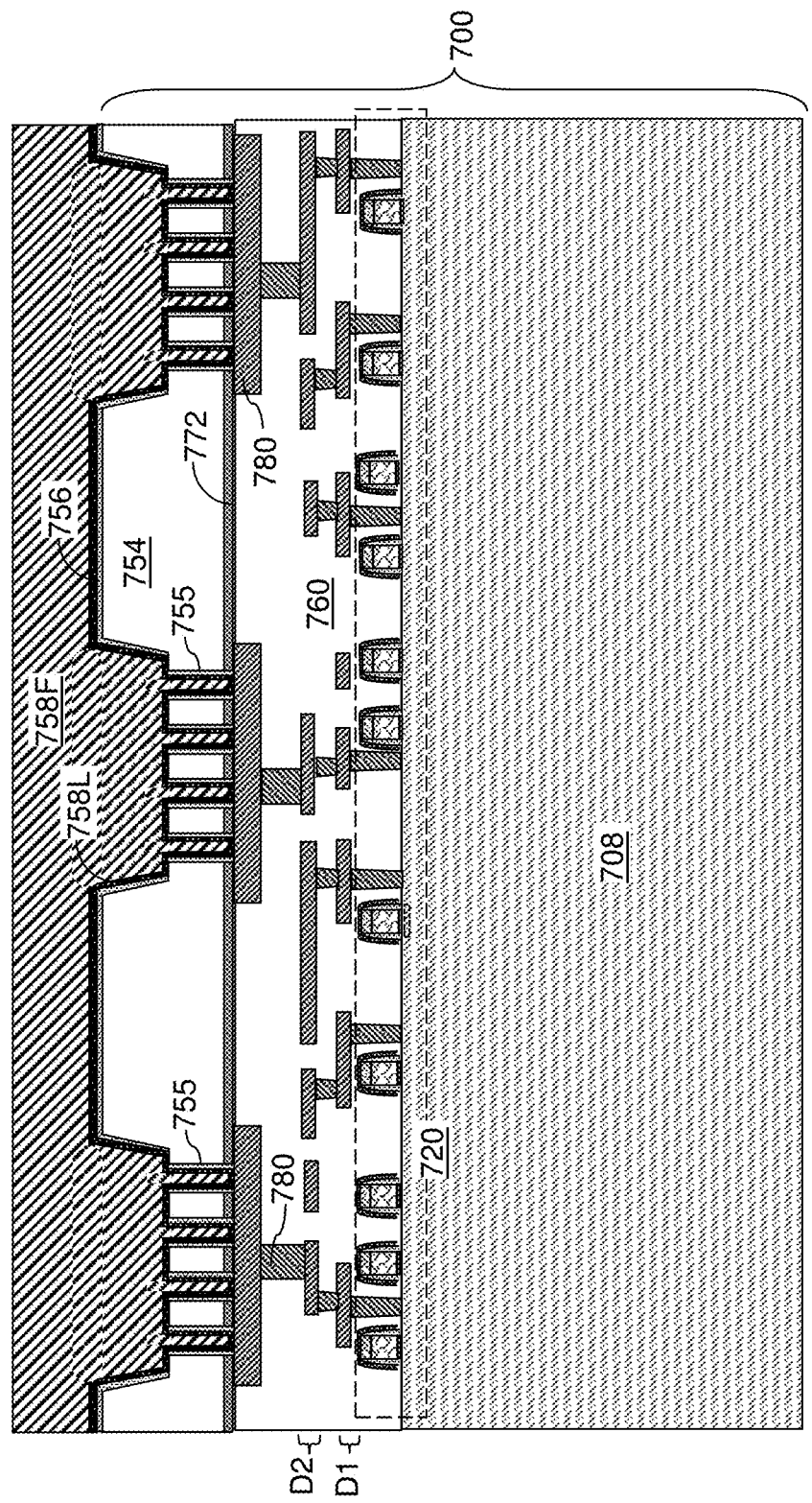
FIG. 32 is a schematic vertical cross-sectional view of a region of the second configuration of the second semiconductor die after deposition of a second metallic liner layer and a second metallic pad fill material layer according to the second embodiment of the present disclosure.

Referring to FIG. 32, a second bonding pad liner layer 758L and a second metallic pad fill material layer 758F can be sequentially deposited in the second integrated line and via cavities 759. The second bonding pad liner layer 758L includes a metallic nitride material such as TiN, TaN, and/or WN. The conductive metallic barrier material can block diffusion of moisture and copper. The second bonding pad liner layer 758L is formed on top surfaces of a subset of second metal interconnect structures 780 located at a topmost level of the second interconnect-level dielectric material layers 760, on inner sidewalls of the tubular dielectric diffusion barrier liners 755, on physically exposed surfaces of the second distal dielectric diffusion barrier layer 756, and on physically exposed horizontal surfaces of the second pad-and-via-level dielectric material layer 754 located between the topmost surface of the second pad-and-via-level dielectric material layer 754 and the bottom surface of the second pad-and-via-level dielectric material layer 754. The thickness of the second bonding pad liner layer 758L layer may be in a range from 4 nm to 80 nm, such as from 8 nm to 40 nm, although lesser and greater thicknesses can also be used. The second metallic pad fill material layer 758F can include copper, which may be deposited by a combination of a copper seed layer deposition process employing physical vapor deposition and a copper electroplating process that fills remaining volumes of the second integrated line and via cavities 759.

Figure 33B:
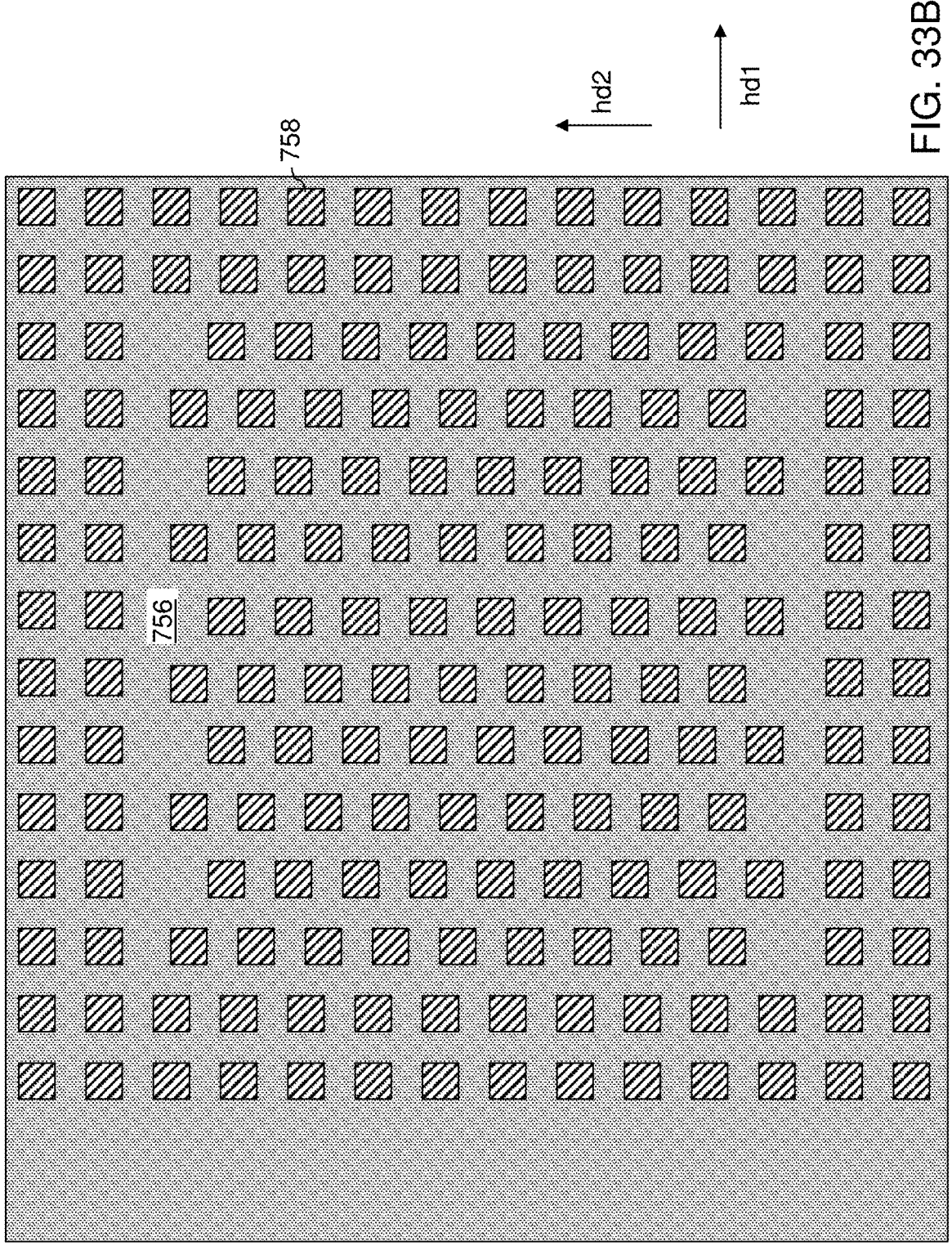
FIG. 33B is a schematic top-down view of the second semiconductor die of FIG. 33A.

Referring to FIGS. 33A and 33B, excess portions of the second metallic pad fill material layer 758F and the second bonding pad liner layer 758L overlying the horizontal plane including the top surface of the second distal dielectric diffusion barrier layer 756 can be removed by a planarization process such as chemical mechanical planarization. Remaining portions of the second metallic pad fill material layer 758F and the second bonding pad liner layer 758L that fill the second integrated line and via cavities 759 constitute second integrated pad and via structures 758 (e.g., dual damascene bonding pads). Each second integrated pad and via structure 758 can include a second bonding pad liner 758A and a second metallic pad fill material portion 758B. The second bonding pad liner 758A is a patterned remaining portion of the second bonding pad liner layer 758L, and the second metallic pad fill material portion 758B is a patterned remaining portion of the second metallic pad fill material layer 758F. Top surfaces of the second integrated pad and via structures 758 can be within a same horizontal plane as the top surface of the second distal dielectric diffusion barrier layer 756.

Generally, the second integrated pad and via structures 758 are formed in remaining volumes of the second integrated line and via cavities 759. Each of the second integrated pad and via structures 758 comprises, and/or consists of, a second bonding pad liner 788A comprising a metallic nitride material, and a second metallic pad fill material portion 788B embedded in the second bonding pad liner 788A.

In one embodiment, the second dielectric diffusion barrier portions 756P are interconnected with each other through a second horizontally extending diffusion barrier portion that overlies the second pad-and-via-level dielectric material layer 754. The top surfaces of the second integrated pad and via structures 758 can be located within the horizontal plane including a top surface of the second horizontally extending diffusion barrier portion of the second distal dielectric diffusion barrier layer 756. Each of the second integrated pad and via structures 758 can directly contact at least one sidewall of the second proximal dielectric diffusion barrier layer 772. Generally, the second pad-and-via-level dielectric material layer 754 includes second integrated line and via cavities that are filled with a respective combination of a second integrated pad and via structure 788 and a respective second dielectric diffusion barrier portion 756P.

A first subset of the second integrated pad and via structures 758 can be located within the areas of the at least one edge seal structure (not illustrated) in the second semiconductor die 700, and can be electrically connected to a respective node of the second semiconductor devices 720. A second subset of the second integrated pad and via structures 758 can be located on, and can be electrically connected to, a respective one of the at least one edge seal structure. The pattern of the second dual damascene bonding pads 758 can be arranged in a mirror image pattern of the pattern of the first dual damascene bonding pads 958.

In one embodiment, the second bonding pad liner 758A within each of the second integrated pad and via structures 758 continuously extends from a top surface of a respective one of the second metal interconnect structures 780 to a horizontal plane including topmost surfaces of the second dielectric diffusion barrier portions 756P, and directly contacts a horizontal surface of the second pad-and-via-level dielectric material layer 754 located within an area of an opening through a respective one of the second dielectric diffusion barrier portions 756P.

Each second integrated pad and via structure 758 has at least one bottom surface that contacts a second metal interconnect structure 780. In one embodiment, the via portions of the second integrated pad and via structures 758 contact horizontal surfaces of a of the second metal interconnect structures 780 located at the topmost level of the second interconnect-level dielectric material layers 760. The second dielectric diffusion barrier portions 756P are embedded in the second pad-and-via-level dielectric material layer 754. Each of the second dielectric diffusion barrier portions 756P contacts, and laterally surrounds, a pad portion of a respective one of the second integrated pad and via structures 758. Each tubular dielectric diffusion barrier liner 755 laterally surrounds a via portion of a respective one of the second integrated pad and via structures 758.

Figure 34:
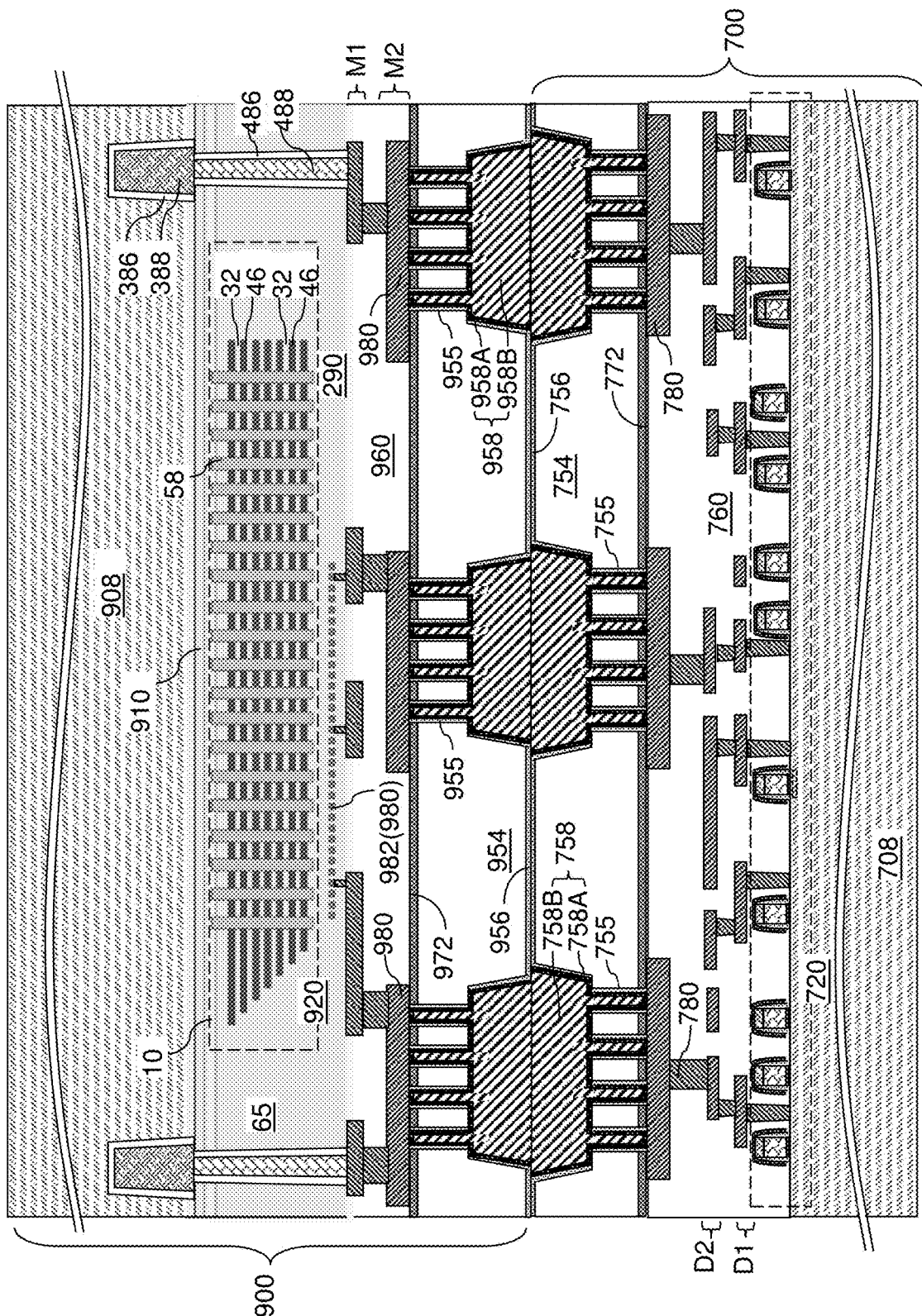
FIG. 34 is a schematic vertical cross-sectional view of a second exemplary bonded structure after bonding the second configuration of the first semiconductor die to the second configuration of the second semiconductor die according to the second embodiment of the present disclosure.

Referring to FIG. 34, the second semiconductor die 700 and the first semiconductor die 700 can be aligned such that each second integrated pad and via structure 758 faces a respective one of the first integrated pad and via structures 958. Each facing pair of a first integrated pad and via structure 958 and a second integrated pad and via structure 758 can be aligned to maximize the areal overlap between the first integrated pad and via structures 958 and the second integrated pad and via structures 758. If the first integrated pad and via structures 958 and the second integrated pad and via structures 758 have different areas, each overlap area between a facing pair of a first integrated pad and via structure 958 and a second integrated pad and via structure 758 can be the same as the area of the smaller integrated pad and via structure between the facing pair of the first integrated pad and via structure 958 and the second integrated pad and via structure 758. If the first integrated pad and via structures 958 and the second integrated pad and via structures 758 have the same area, the overlap area between a facing pair of a first integrated pad and via structure 958 and a second integrated pad and via structure 758 can be in a range from 90% to 100%, such as from 95% to 100%, of the area of the first integrated pad and via structure 958 (which is the same as the area of the second integrated pad and via structure 758).

The first semiconductor die 900 and the second semiconductor die 700 can be brought into contact each other so that each first integrated pad and via structure 958 contacts a respective one of the second integrated pad and via structures 758 with a respective areal overlap therebetween. The assembly of the first semiconductor die 900 and the second semiconductor die 700 are annealed at an elevated temperature in a range from 250 degrees Celsius to 400 degrees Celsius to induce copper diffusion across each interface between facing pairs of a respective first integrated pad and via structure 958 and a respective second integrated pad and via structure 758. The duration of the anneal process at the elevated temperature can be in a range from 5 minutes to 2 hours, although shorter or longer anneal duration may also be used. Each facing pair of a first integrated pad and via structure 958 and a second integrated pad and via structure 758 is bonded to each other during the anneal process at the elevated temperature. A first exemplary bonded structure including the first semiconductor die 900 and the second semiconductor die 700 can be formed.

A layer stack including a horizontally extending portion of the first distal dielectric diffusion barrier layer 956 and a horizontally extending portion of the second distal dielectric diffusion barrier layer 756 can be located between the first pad-and-via-level dielectric material layer 954 and the second pad-and-via-level dielectric material layer 754. The vertical separation distance between the first pad-and-via-level dielectric material layer 954 and the second pad-and-via-level dielectric material layer 754 can be the sum of the thickness of the first distal dielectric diffusion barrier layer 956 and the thickness of the second distal dielectric diffusion barrier layer 756.

Figure 35:
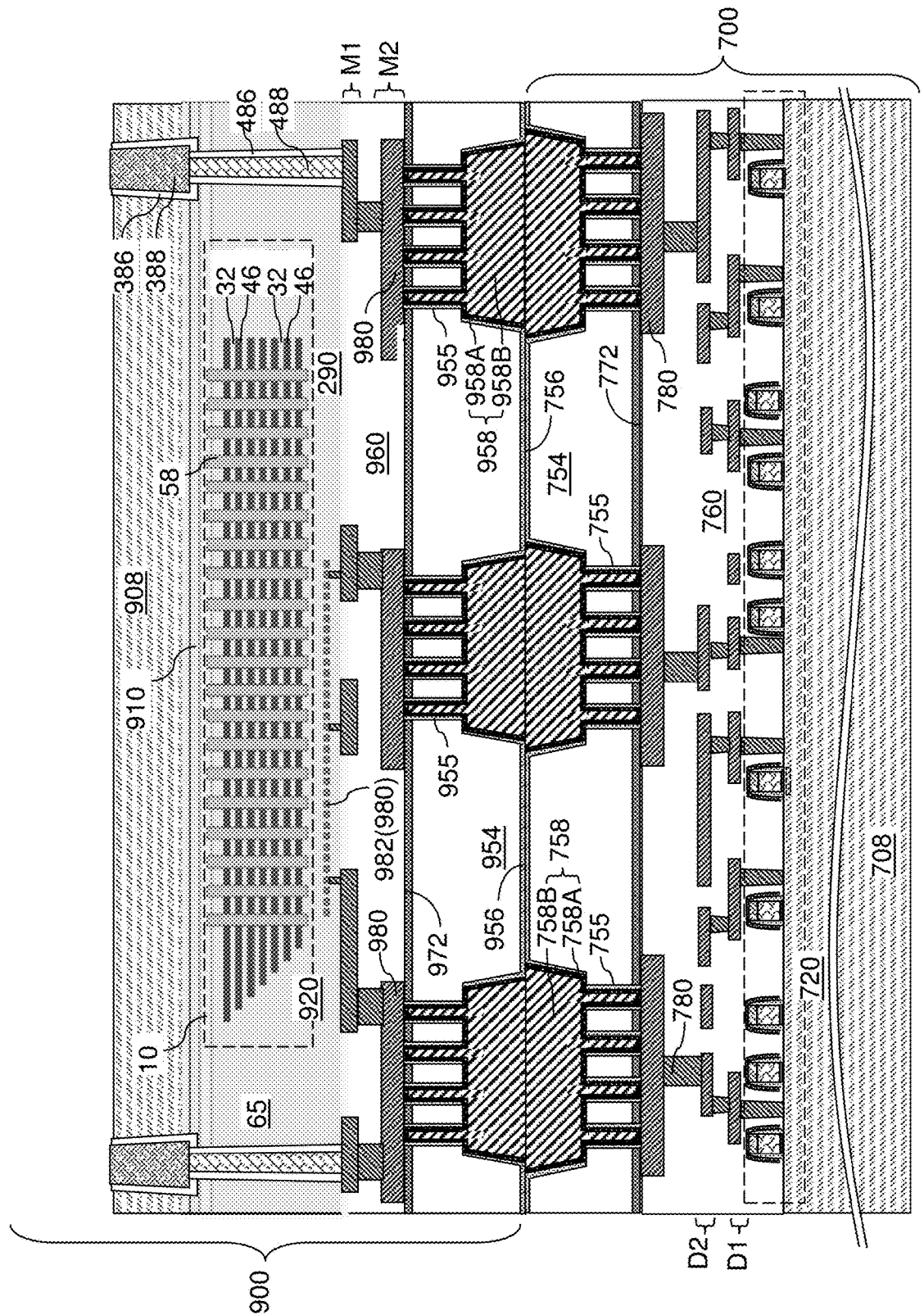
FIG. 35 is a schematic vertical cross-sectional view of the second exemplary bonded structure after thinning the first semiconductor die from the backside according to the second embodiment of the present disclosure.

Referring to FIG. 35, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically exposed. Generally, end surfaces of the through-substrate via structures 388 can be physically exposed by thinning the backside of the first substrate 908, which may be the substrate of a memory die. The thickness of the first substrate 908 after thinning may be in a range from 1 micron to 30 microns, such as from 2 microns to 15 microns, although lesser and greater thicknesses can also be used.

Figure 36:
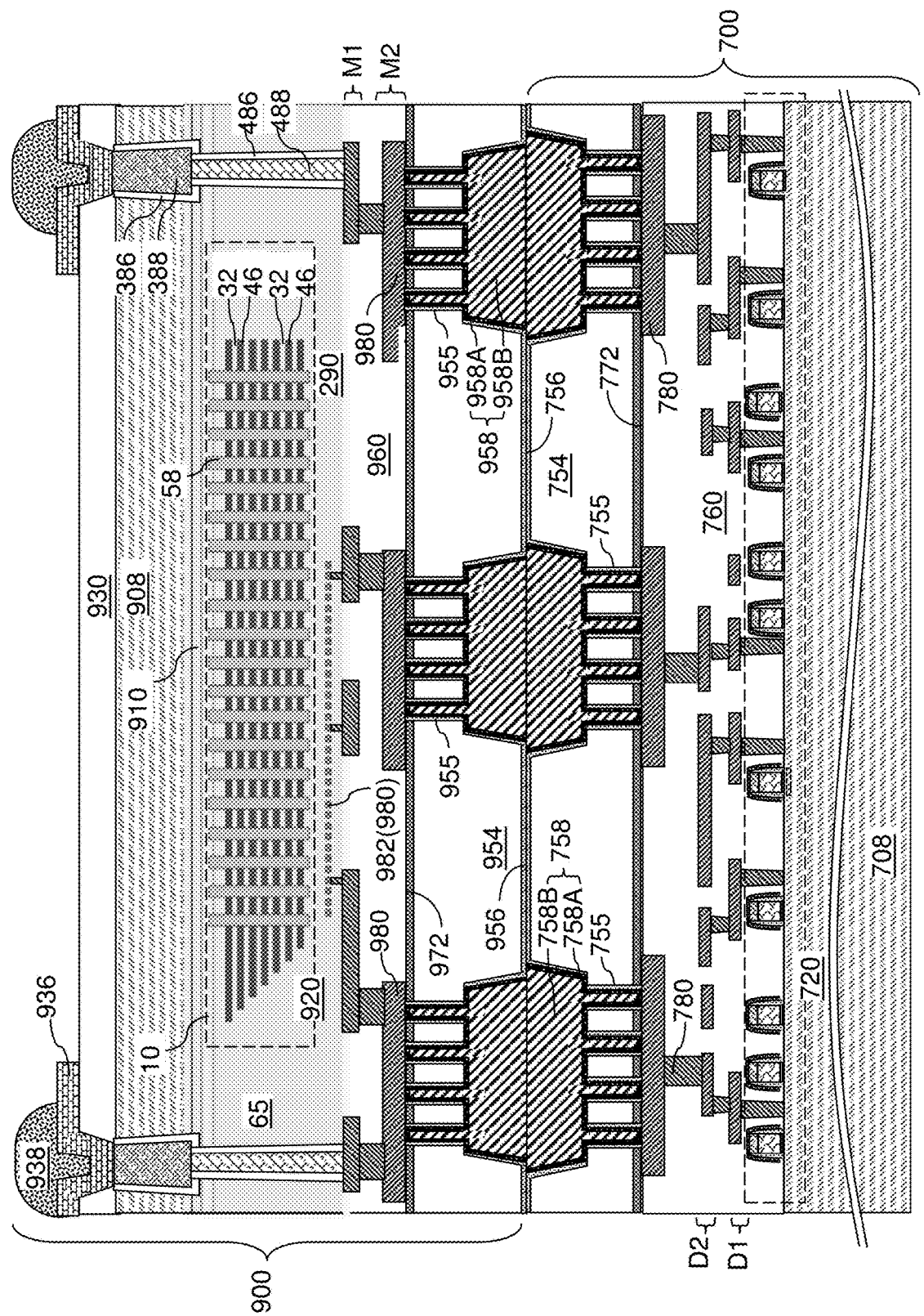
FIG. 36 is a schematic vertical cross-sectional view of the second exemplary bonded structure after formation of a backside insulating layer, external bonding pads, and solder material portions according to the second embodiment of the present disclosure.

Referring to FIG. 36, a backside insulating layer 930 may be formed on the backside of the first substrate 908. The backside insulating layer 930 includes an insulating material such as silicon oxide. The thickness of the backside insulating layer 930 can be in a range from 50 nm to 500 nm, although lesser and greater thicknesses can also be used. A photoresist layer (not shown) may be applied over the backside insulating layer 930, and may be lithographically patterned to form opening over areas of the through-substrate via structures 388. An etch process can be performed to form via cavities through the backside insulating layer 930 underneath each opening in the photoresist layer. A top surface of a through-substrate via structure 388 can be physically exposed at the bottom of each via cavity through the backside insulating layer 930.

At least one metallic material can be deposited into the openings through the backside insulating layer 930 and over the planar surface of the backside insulating layer 930 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 930, and over the physically exposed planar surface of the backside insulating layer 930. The thickness of the metallic nitride liner material can be in a range from 10 nm to 100 nm, although lesser and greater thicknesses can also be used. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 930 can be in a range from 0.5 microns to 10 microns, such as from 1 micron to 5 microns, although lesser and greater thicknesses can also be used.

The at least one metallic fill material and the metallic material layer can be subsequently patterned to form discrete backside bonding pads 936 contacting a respective one of the through-substrate via structures 388. The backside bonding pads 936 can function as external integrated pad and via structures that can be used to electrically connect various nodes of within the first semiconductor die 900 and the second semiconductor die 700 to external nodes, such as integrated pad and via structures on a packaging substrate or C4 integrated pad and via structures of another semiconductor die. For example, solder material portions 938 can be formed on the backside bonding pads 936, and a C4 bonding process or a wire bonding process can be performed to electrically connect the backside bonding pads 936 to external electrically active nodes.

Generally, backside bonding pads 936 can be formed on a backside surface of the first semiconductor die 900 (which may be a memory die) that is located on an opposite side of the bonding interface between the first semiconductor die 900 and the second semiconductor die 700. Through-substrate via structures 388 can vertically extend through the first semiconductor die 900, and can provide electrical connection between the backside bonding pads 936 and a subset of the integrated pad and via structures (958, 758).

Figure 37:
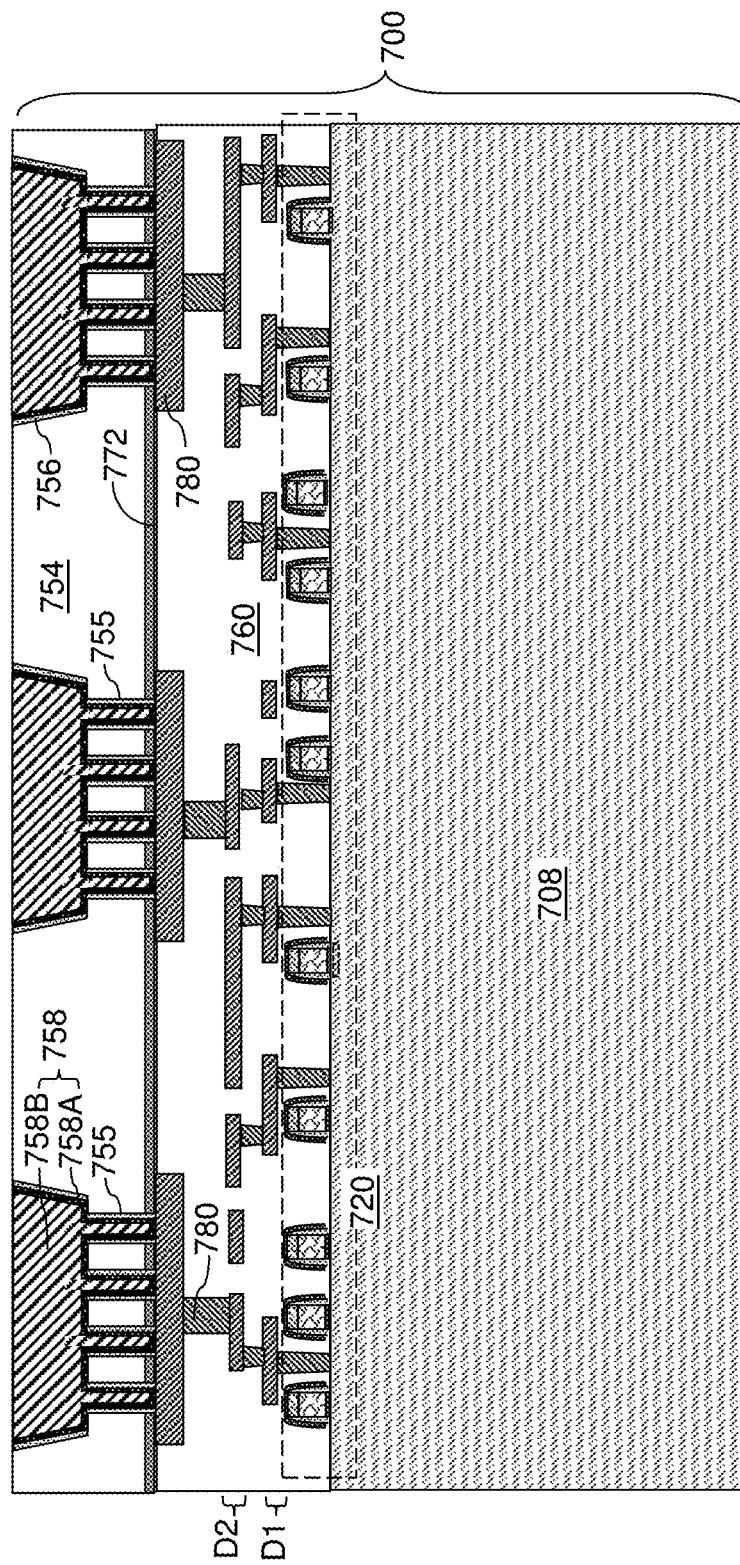
FIG. 37 is a schematic vertical cross-sectional view of an alternative embodiment of the first semiconductor die according to the second embodiment of the present disclosure.

Referring to FIG. 37, an alternative embodiment of the first semiconductor die 900 according to the second embodiment of the present disclosure is illustrated. The alternative embodiment of the first semiconductor die 900 can be derived from the first semiconductor die 900 of FIGS. 27A and 27B by removing the horizontally extending portion of the first distal dielectric diffusion barrier layer 956 that overlies the first pad-and-via-level dielectric material layer 954. For example, the horizontally extending portion of the first distal dielectric diffusion barrier layer 956 overlying the first pad-and-via-level dielectric material layer 954 can be removed by an additional polishing step of the chemical mechanical planarization process after removal of the portions of the metallic materials from above the top surface of the first distal dielectric diffusion barrier layer 956. In this case, the top surface of the first pad-and-via-level dielectric material layer 954 can be physically exposed after the planarization process, and the top surfaces of the first integrated pad and via structures 958 can be formed within the same horizontal plane as the top surface of the first pad-and-via-level dielectric material layer 954. Upon removal of the horizontal extending portion of the first distal dielectric diffusion barrier layer 956, the remaining portions of the first distal dielectric diffusion barrier layer 956 include first dielectric diffusion barrier portions 956'. The first dielectric diffusion barrier portions 956' are not interconnected with each other, and are formed as discrete structures laterally surrounding a respective first integrated pad and via structure 958.

Figure 38:
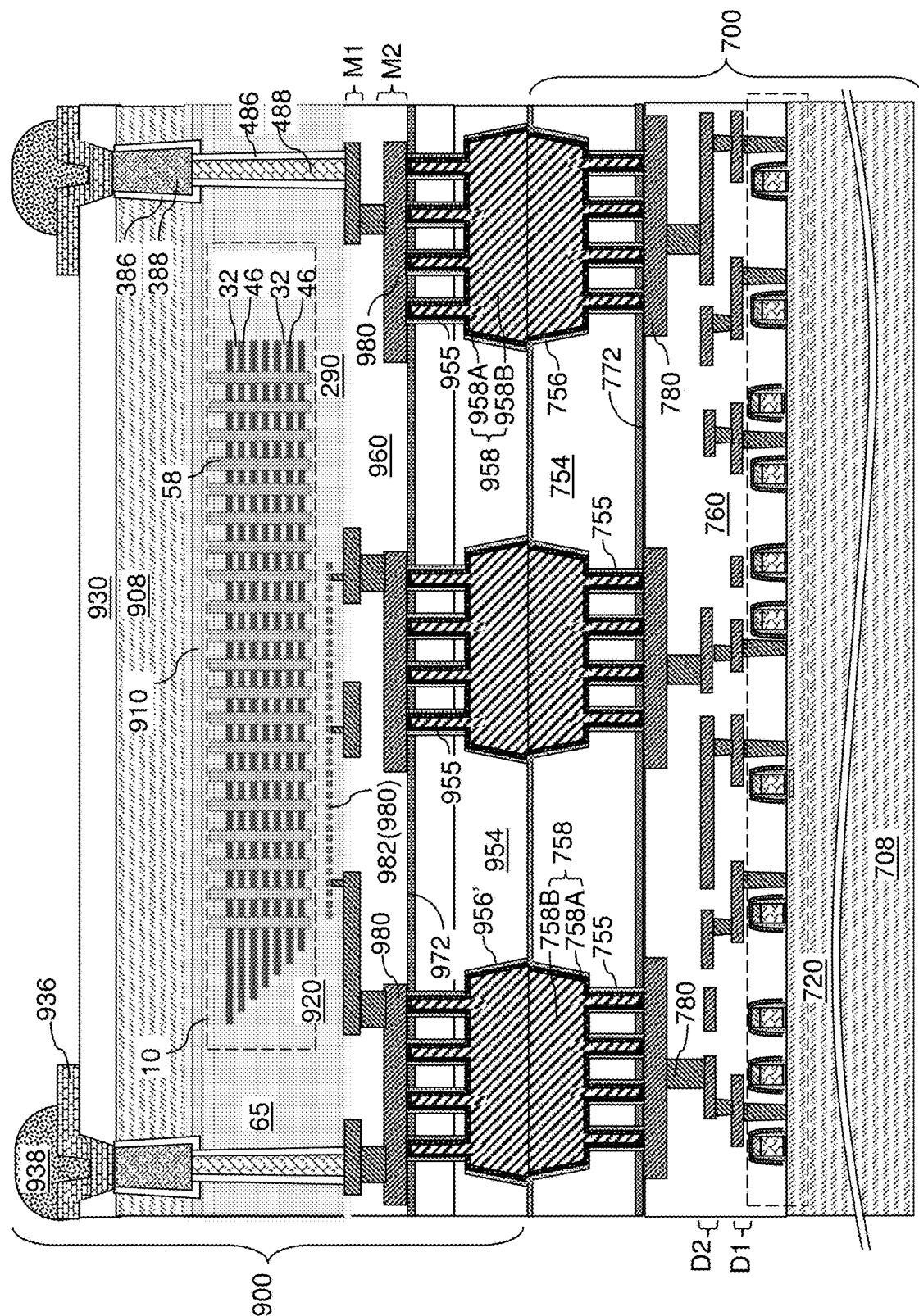
FIG. 38 is a schematic vertical cross-sectional view of an alternative embodiment of the second exemplary bonded structure according to the second embodiment of the present disclosure.

Referring to FIG. 38, a second semiconductor die 700 can be provided in the same manner as described above, and can be bonded with the alternative configuration of the first semiconductor die illustrated in FIG. 37 to provide an alternative embodiment of the second bonded assembly. The processing steps of FIGS. 35 and 36 can be performed the structure illustrated in FIG. 38. In this case, a horizontally extending portion of the second distal dielectric diffusion barrier layer 756 can be located between the first pad-and-via-level dielectric material layer 954 and the second pad-and-via-level dielectric material layer 754. The vertical separation distance between the first pad-and-via-level dielectric material layer 954 and the second pad-and-via-level dielectric material layer 754 can be the same as the thickness of the second distal dielectric diffusion barrier layer 756. The first dielectric diffusion barrier portions 956' are discrete material portions that are laterally spaced among one another by the first pad-and-via-level dielectric material layer 954. Top surfaces of the first integrated pad and via structures 958 can be located within the horizontal plane including the top surface of the first pad-and-via-level dielectric material layer 954.

In another alterative embodiment of the first semiconductor die 900 according to the first embodiment of the present disclosure, the horizontally extending portion of the second distal dielectric diffusion barrier layer 756 that overlies the layer 754 may be removed. In this alternative embodiment, the vertical separation distance between the first pad-and-via-level dielectric material layer 954 and the second pad-and-via-level dielectric material layer 754 can be the same as the thickness of the first distal dielectric diffusion barrier layer 956 which is provided between the layer 754 and layer 954.

In one embodiment, the combination of the first proximal dielectric diffusion barrier layer 972, the first distal dielectric diffusion barrier layer 956, tubular dielectric diffusion barrier liners 955, the first bonding pad liners 958A, the second proximal dielectric diffusion barrier layer 772, the second distal dielectric diffusion barrier layer 756, tubular dielectric diffusion barrier liners 755, and the second bonding pad liners 758A forms a continuous diffusion barrier structure that protects the first metal interconnect structures 980 embedded in the first distal interconnect-level dielectric material layers 960 and protects the second metal interconnect structures 780 embedded in the second interconnect-level dielectric material layers 760 from diffusion of moisture and/or contaminants through the first pad-and-via-level dielectric material layer 954 or the second pad-and-via-level dielectric material layer 754.

While the present disclosure is described employing embodiments in which a first semiconductor die 900 in a first configuration is bonded to a second semiconductor die 700 in a first configuration (as illustrated in FIGS. 1A-21B), and a first semiconductor die 900 in a second configuration is bonded to a second semiconductor die 700 in a second configuration (as illustrated in FIGS. 22-38), embodiments are expressly contemplated herein in which a first semiconductor die 900 in the first configuration is bonded to a second semiconductor die 700 in the second configuration and/or a first semiconductor die 900 in the second configuration is bonded to a second semiconductor die 700 in the first configuration. Accordingly, claims of the instant application are to be construed to encompass all possibilities in which the first semiconductor die 900 and the second semiconductor die 700 have any of the above described configurations.

Referring to FIGS. 22-38 and related drawings and according to various embodiments of the present disclosure, a structure comprising a first semiconductor die 900 is provided. The first semiconductor die 900 comprises: first semiconductor devices 920 located over a first substrate 908; first interconnect-level dielectric material layers (290, 960) embedding first metal interconnect structures 980 that are electrically connected to the first semiconductor devices 920 and overlie the first semiconductor devices 920; a layer stack of a first proximal dielectric diffusion barrier layer 972 and a first pad-and-via-level dielectric material layer 954 overlying the first interconnect-level dielectric material layers (290, 960) and embedding first integrated pad and via structures 958; and first dielectric diffusion barrier portions (956P, 956') embedded in the first pad-and-via-level dielectric material layer 954, wherein each of the first dielectric diffusion barrier portions (956P, 956') contacts, and laterally surrounds, a pad portion of a respective one of the first integrated pad and via structures 958.

In one embodiment, each of the first dielectric diffusion barrier portions (956P, 956') is vertically spaced from the first proximal dielectric diffusion barrier layer 972. In one embodiment, tubular dielectric diffusion barrier liners 955 can laterally surround a via portion of a respective one of the first integrated pad and via structures 958. In one embodiment, the tubular dielectric diffusion barrier liners 955 do not contact, and are laterally spaced from, the first dielectric diffusion barrier portions (956P, 956'). In one embodiment, the tubular dielectric diffusion barrier liners 955 contact a sidewall of a respective opening in the first proximal dielectric diffusion barrier layer 972.

In one embodiment, the first proximal dielectric diffusion barrier layer 972 contacts top surfaces of a subset of the first metal interconnect structures 980 and a topmost surface of the first interconnect-level dielectric material layers (290, 960); and the via portions of the first integrated pad and via structures 958 contact horizontal surfaces of the subset of the first metal interconnect structures 980.

In one embodiment, each of the first integrated pad and via structures 958 comprises: a first bonding pad liner 958A comprising a metallic nitride material; and a copper containing first metallic pad fill material portion 958B embedded portion in the first bonding pad liner 958A. In one embodiment, the first dielectric diffusion barrier portions 956P are interconnected with each other through a first horizontally extending diffusion barrier portion that overlies the first pad-and-via-level dielectric material layer 954; and top surfaces of the first integrated pad and via structures 958 are located within a horizontal plane including a top surface of the first horizontally extending diffusion barrier portion. Alternatively, the first dielectric diffusion barrier portions 956' are discrete material portions that are laterally spaced from each other by the first pad-and-via-level dielectric material layer 954; and top surfaces of the first integrated pad and via structures 958 are located within a horizontal plane including a top surface of the first pad-and-via-level dielectric material layer 954.

In one embodiment, the first bonding pad liner 958A within each of the first integrated pad and via structures 958 continuously extends from a top surface of a respective one of the first metal interconnect structures 980 to a horizontal plane including topmost surfaces of the first dielectric diffusion barrier portions (956P, 956') without any opening therein, and directly contacts a horizontal surface of the first pad-and-via-level dielectric material layer 954 located within an area of an opening through a respective one of the first dielectric diffusion barrier portions (956P, 956').

In one embodiment, the first dielectric diffusion barrier portions (956P, 956') comprise a dielectric material selected from silicon nitride, silicon oxynitride, or a stack thereof; and the first proximal dielectric diffusion barrier layer 972 comprises a dielectric material selected from silicon nitride, silicon oxynitride, and/or silicon carbon nitride.

In one embodiment, the structure comprises a second semiconductor die 700 that comprises: second semiconductor devices 720 located over a second substrate 708; second interconnect-level dielectric material layers 760 embedding second metal interconnect structures 780 that are electrically connected to the second semiconductor devices 720 and underlying the second semiconductor devices 720 (in a bonded state); and second bonding pads (which may be provided as the second bonding pads 788 in the first configuration of the second semiconductor die 700 or as pad portions of second integrated pad and via structures 758 in the second configuration of the second semiconductor die 700) that are electrically connected to the second metal interconnect structures 780 and bonded to a respective one of the first integrated pad and via structures 958.

In one embodiment, each of the second bonding pads contacts, and is laterally surrounded by, a respective second dielectric diffusion barrier portion (776P, 756P, 756'); the second dielectric diffusion barrier portions (776P, 756P, 756') and the second bonding pads (788, 758) are embedded in a pad-level dielectric material layer (which may be a second pad-level dielectric material layer 774 or an upper portion of the second pad-and-via-level dielectric material layer 754); and the first pad-and-via-level dielectric material layer 954 and the pad-level dielectric material layer (774, 754) do not contact each other and are vertically spaced from each other by at least one horizontally extending diffusion barrier portion that laterally connects the first dielectric diffusion barrier portions 956P or laterally connects the second dielectric diffusion barrier portions 756P. The at least one horizontally extending diffusion barrier portion may include a horizontally extending portion of the first distal dielectric diffusion barrier layer 956 and/or a horizontally extending portion of the second distal dielectric diffusion barrier layer 756. In one embodiment, the first semiconductor devices 920 may comprise three-dimensional memory devices and the second semiconductor devices 720 may comprise driver circuit devices (e.g., CMOS devices) for the three-dimensional memory devices 920.

In one embodiment, the first semiconductor die 900 comprises at least one edge seal structure (688, 984, 986) comprising a respective subset of the first metal interconnect structures 980 that provides a respective continuous barrier laterally surrounding the first semiconductor devices 920 without any lateral opening and vertically extends from the first substrate 908 to the first proximal dielectric diffusion barrier layer 972.

Generally, the various embodiments of the present disclosure provide a moisture diffusion barrier structure at the levels of bonding pads. Formation of a continuous metal structure at a metal-to-metal bonding interface is disadvantageous for forming a high quality bonding surface because the continuous metal structure causes local changes in the metal-to-dielectric area ratio, changes the microscopic recess depth of the metal relative to a dielectric surface, and degrades the bonding strength due to the local variations in the recess depth of the metal structures. The methods and structures of the embodiments of the present disclosure provide continuous diffusion barrier structures that can block diffusion of moisture and impurities into interconnect-level dielectric material layers (290, 960, 760) even if moisture and/or impurities ingress through openings at the levels of the metal pads and the connection via structures, and thus, increase the reliability of individual semiconductor dies (900, 700) and/or the bonded assembly of multiple semiconductor dies (900, 700).

Furthermore, the embodiments of the present disclosure provide compatibility of wafer-to-wafer bonding pad structure and blocking moisture penetrated from outside of the bonded dies. The uppermost bonding pad of semiconductor die (900, 700) preferably have a square horizontal shape to provide high bonding strength. The square shape of the bonding pads may allow moisture to penetrate through the space between the bonding pads. However, the dielectric diffusion barrier layer(s) block moisture from penetrating into the memory and CMOS devices. Thus, the embodiments provide a combination of high bonding strength and moisture blocking.

Moisture is blocked by the seal-ring conductive layers surrounding the semiconductor dies (900, 700), below the bonding pad level and moisture is blocked by the dielectric diffusion barrier layer in the bonding pad level. Furthermore, in some embodiments, the dielectric diffusion barrier layer(s) can prevent or reduce copper out-diffusion from the bonding pads into the silicon oxide dielectric layers when the bonding pads are partially misaligned.

In some embodiments, the bottom and sides of the bonding pads (e.g., copper bonding pads) are surrounded by a diffusion barrier metal or metal nitride and by the dielectric diffusion barrier layer(s) to reduce or prevent moisture from diffusing into the bonding pads, which can cause copper ionization and out-diffusion. Furthermore, delamination of the bonded semiconductor dies may be avoided or reduced due avoidance or reduction copper out-diffusion from the bonding pads. Still further, since the dielectric diffusion barrier is located outside the barrier metal in the bonding pad level, the dielectric diffusion barrier blocks moisture diffusion into the copper bonding pads. In some embodiments, malfunction in circuit operation caused by high frequency noise may also be reduced or avoided.

In some embodiments, the capacitance between the neighboring metal or metal alloy layers in the interconnect layers is reduced by using the low dielectric constant dielectric layers, such as SiCN or other dielectric materials described above.

The device of the first embodiment illustrated in FIGS. 1A to 21B avoids or reduces degradation of circuit operating speed, because the wiring capacitance is not increased by placing a dielectric layer with a high dielectric constant of at least 5 at the bottom of bonding pad level, without necessarily placing this layer over the top layer of the underlying circuit. The device of the second embodiment illustrated in FIGS. 22 to 38 is formed by a dual damascene process, which provides a reduced process cost. In the second embodiment, the dielectric layer with a high dielectric constant may be placed over the top layer of the underlying circuit.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A structure comprising a first semiconductor die, wherein the first semiconductor die comprises:
    first semiconductor devices located over a first substrate;
    first interconnect-level dielectric material layers embedding first metal interconnect structures that are electrically connected to the first semiconductor devices and overlie the first semiconductor devices;
    a layer stack of a first pad-connection-via-level dielectric material layer and a first proximal dielectric diffusion barrier layer overlying the first interconnect-level dielectric material layers and embedding first pad-connection via structures; and
    a first pad-level dielectric material layer including first pad cavities that are filled with a respective combination of a first bonding pad and a respective first dielectric diffusion barrier portion, wherein each of the first bonding pads contacts a respective subset of the first pad-connection via structures;
    wherein each of the first dielectric diffusion barrier portions comprises sidewall segments in contact with the first pad-level dielectric material layer and extending from a bottom surface of the first pad-level dielectric material layer to a top surface of the first pad-level dielectric material layer; and
    wherein each of the first dielectric diffusion barrier portions further comprises a horizontal segment having a bottom surface that contacts the first proximal dielectric diffusion barrier layer, wherein the bottom surface comprises an outer periphery that is adjoined to bottom edges of the sidewall segments and an inner periphery that is laterally offset inward from the outer periphery by an offset distance that is greater than a thickness of the sidewall segments of the first dielectric diffusion barrier portions.

2. The structure of claim 1, further comprising a second semiconductor die comprising:
    second semiconductor devices located over a second substrate;
    second interconnect-level dielectric material layers embedding second metal interconnect structures that are electrically connected to the second semiconductor devices; and
    second bonding pads that are electrically connected to the second metal interconnect structures and bonded to a respective one of the first bonding pads.

3. The structure of claim 2, wherein:
    the first semiconductor devices comprise either three-dimensional memory devices or driver circuit devices for the three-dimensional memory devices;
    the second semiconductor devices comprise another one of the three-dimensional memory devices or the driver circuit devices for the three-dimensional memory devices;
    each of the second bonding pads contacts, and is laterally surrounded by, a respective second dielectric diffusion barrier portion;
    the second bonding pads and the second dielectric diffusion barrier portions are embedded in a second pad-level dielectric material layer;
    the second semiconductor die comprises a layer stack of a second pad-connection-via-level dielectric material layer and a second proximal dielectric diffusion barrier layer located between the second interconnect-level dielectric material layers and the second pad-level dielectric material layer and embedding second pad-connection via structures, and
    each of the second bonding pads contacts a respective subset of the second pad-connection via structures.

4. A structure comprising a first semiconductor die, wherein the first semiconductor die comprises:
    first semiconductor devices located over a first substrate;
    first interconnect-level dielectric material layers embedding first metal interconnect structures that are electrically connected to the first semiconductor devices and overlie the first semiconductor devices;
    a layer stack of a first pad-connection-via-level dielectric material layer and a first proximal dielectric diffusion barrier layer overlying the first interconnect-level dielectric material layers and embedding first pad-connection via structures; and
    a first pad-level dielectric material layer including first pad cavities that are filled with a respective combination of a first bonding pad and a respective first dielectric diffusion barrier portion, wherein each of the first bonding pads contacts a respective subset of the first pad-connection via structures;
    wherein the first semiconductor die comprises:
    an additional planar diffusion barrier layer located between the first interconnect-level dielectric material layers and the first pad-connection-via-level dielectric material layer; and
    at least one edge seal structure comprising a respective subset of the first metal interconnect structures that provides a respective continuous barrier laterally surrounding the first semiconductor devices without any lateral opening and vertically extends from the first substrate to the additional planar diffusion barrier layer.

5. The structure of claim 4, wherein the at least one edge seal structure is electrically grounded.

6. The structure of claim 4, further comprising a second semiconductor die comprising:
    second semiconductor devices located over a second substrate;
    second interconnect-level dielectric material layers embedding second metal interconnect structures that are electrically connected to the second semiconductor devices; and
    second bonding pads that are electrically connected to the second metal interconnect structures and bonded to a respective one of the first bonding pads.

7. The structure of claim 6, wherein:
    the first semiconductor devices comprise either three-dimensional memory devices or driver circuit devices for the three-dimensional memory devices;

the second semiconductor devices comprise another one of the three-dimensional memory devices or the driver circuit devices for the three-dimensional memory devices;

each of the second bonding pads contacts, and is laterally surrounded by, a respective second dielectric diffusion barrier portion;

the second bonding pads and the second dielectric diffusion barrier portions are embedded in a second pad-level dielectric material layer;

the second semiconductor die comprises a layer stack of a second pad-connection-via-level dielectric material layer and a second proximal dielectric diffusion barrier layer located between the second interconnect-level dielectric material layers and the second pad-level dielectric material layer and embedding second pad-connection via structures, and each of the second bonding pads contacts a respective subset of the second pad-connection via structures.

* * * * *